(12) United States Patent
Mizutani et al.

(10) Patent No.: US 8,084,187 B2
(45) Date of Patent: Dec. 27, 2011

(54) RESIST COMPOSITION AND PATTERN FORMING METHOD USING THE SAME

(75) Inventors: Kazuyoshi Mizutani, Haibara-gun (JP); Toru Tsuchihashi, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 283 days.

(21) Appl. No.: 12/410,829

(22) Filed: Mar. 25, 2009

(65) Prior Publication Data

US 2009/0253070 A1    Oct. 8, 2009

(30) Foreign Application Priority Data

Mar. 26, 2008  (JP) ................. 2008-082228

(51) Int. Cl.
*G03F 7/00* (2006.01)
*G03F 7/004* (2006.01)
*G03F 7/028* (2006.01)

(52) U.S. Cl. ............. 430/270.1; 430/912; 430/913

(58) Field of Classification Search ....... 430/270.1, 430/913, 912
See application file for complete search history.

(56) References Cited

U.S. PATENT DOCUMENTS

| | | | | |
|---|---|---|---|---|
| 3,617,190 A * | 11/1971 | Tesoro | .......... | 8/115.6 |
| 4,017,512 A * | 4/1977 | Isowa et al. | .......... | 548/477 |
| 4,123,411 A * | 10/1978 | Coran | .......... | 524/169 |
| 4,399,246 A * | 8/1983 | Hyde | .......... | 524/169 |
| 4,533,713 A * | 8/1985 | Howells | .......... | 528/26 |
| 5,216,085 A * | 6/1993 | Guenthner et al. | .......... | 525/351 |
| 6,586,152 B1 * | 7/2003 | Urano et al. | .......... | 430/170 |
| 7,592,118 B2 * | 9/2009 | Mizutani et al. | .......... | 430/170 |
| 2005/0064327 A1 * | 3/2005 | Yasunami et al. | .......... | 430/270.1 |
| 2005/0186504 A1 * | 8/2005 | Matsumoto | .......... | 430/270.1 |
| 2005/0277060 A1 * | 12/2005 | Shirakawa et al. | .......... | 430/270.1 |
| 2008/0071113 A1 * | 3/2008 | Matsunaga et al. | .......... | 564/96 |
| 2011/0014570 A1 * | 1/2011 | Mizutani et al. | .......... | 430/270.1 |

FOREIGN PATENT DOCUMENTS

| | | | |
|---|---|---|---|
| EP | 154460 A2 * | 9/1985 | |
| JP | 11-044950 A | 2/1999 | |
| JP | 11044950 A * | 2/1999 | |
| JP | 2000-066382 A | 3/2000 | |
| JP | 2001-174982 A | 6/2001 | |
| JP | 2002-296784 A | 10/2002 | |

OTHER PUBLICATIONS

Machine translation of JP 11-44590 (no date).*

* cited by examiner

*Primary Examiner* — Amanda C. Walke

(74) *Attorney, Agent, or Firm* — Sughrue Mion, PLLC

(57) ABSTRACT

Provided is a resist composition including a compound having a molecular weight of 1,000 or less and containing at least one sulfonamide group ($-SO_2NH-$).

12 Claims, No Drawings

RESIST COMPOSITION AND PATTERN FORMING METHOD USING THE SAME

BACKGROUND OF THE INVENTION

1. Field of the Invention

The present invention relates to a resist composition suitable for use in the ultramicrolithography process such as production of VLSI or a high-capacity microchip or in other photofabrication processes, and a pattern forming method using the composition. More specifically, the present invention relates to a resist composition capable of forming a high-resolution pattern by using an electron beam, an X-ray, an excimer laser or the like, and a pattern forming method using the composition.

2. Description of the Related Art

In a positive resist, the protective group in a polymer binder is deprotected by an acid generated in the exposed area to produce an alkali-soluble group and the exposed area is thereby dissolved in an alkali developer and removed, as a result, an image is formed.

As for the substrate on which the resist is coated, various substrates such as $SiO_2$, SiON, SiN and organic BARC (bottom anti-reflective coating) are used, but these have a problem in terms of substrate surface characteristics, for example, the pattern profile deteriorates due to acidity or basicity of the substrate surface. Also, micropatterning of a resist makes it highly important to reduce the line width roughness (LWR).

To solve these problems, as described, for example, in JP-A-11-44950 (the term "JP-A" as used herein means an "unexamined published Japanese patent application"), JP-A-2001-174982, JP-A-2000-66382 and JP-A-2002-296784 studies are being made on introduction of a sulfonamide compound, a carboxylic acid compound, a hydroxyl group-containing basic compound, a diazomethane compound or the like, but with recent progress in the micropatterning of a resist, the performance level is not satisfied any more.

SUMMARY OF THE INVENTION

An object of the present invention is to solve the technical problem of enhancing performance when microprocessing a semiconductor device by using an actinic ray or radiation, particularly, an electron beam, an X-ray, KrF excimer laser light or ArF excimer laser light, and provide a resist composition ensuring that deterioration of the pattern profile due to characteristics of the substrate surface is suppressed and the performance in terms of line edge roughness is excellent, and a pattern forming method using the composition.

The present invention is achieved by the following constructions.

(1) A resist composition comprising:
a compound having a molecular weight of 1,000 or less and containing at least one sulfonamide group ($-SO_2NH-$).

(2) The resist composition as described in (1), wherein the compound contains a dissociative group with a pKa of 4 to 11 in addition to the N-sulfonamide group.

(3) The resist composition as described in (1) or (2), wherein the compound contains an alkyl, aryl or aralkyl group substituted by at least one fluorine atom.

(4) A positive resist composition comprising:
(S) a compound described in any one of (1) to (3) having a molecular weight of 1,000 or less and containing at least one sulfonamide group ($-SO_2NH-$);
(B) a compound capable of increasing the solubility in an alkali developer by the action of an acid; and
(A) a compound capable of generating an acid upon irradiation with an actinic ray or radiation.

(5) The positive resist composition as described in (4), wherein
the compound (B) is a resin having a repeating unit represented by the following formula (A1):

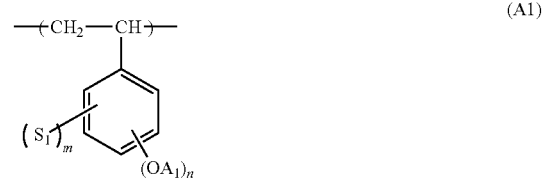

wherein
$A_1$ represents a group capable of leaving by the action of an acid, represented by $-C(R^{01})(R^{02})(R^{03})$ or $-C(R^{04})(R^{05})-O-R^{06}$, wherein each of $R^{01}$ to $R^{03}$ independently represents an alkyl group, a cycloalkyl group or an aryl group and these groups may combine together to form a ring or a crosslinked ring, each of $R^{04}$ and $R^{05}$ independently represents a hydrogen atom, an alkyl group, a cycloalkyl group or an aryl group, and $R^{06}$ represents an alkyl group, a cycloalkyl group or an aryl group;
each of $S_1$('s) independently represents a substituent; and
n represents an integer of 1 to 3 and m represents an integer of 0 to 3, provided that m+n≦5.

(6) The positive resist composition as described in (4), wherein
the compound (B) is a resin having a repeating unit represented by the following formula (A2):

wherein
$A_2$ represents a group capable of leaving by the action of an acid, represented by $-C(R^{01})(R^{02})(R^{03})$ or $-CH(Rn)(AR)$, wherein each of $R^{01}$ to $R^{03}$ independently represents an alkyl group, a cycloalkyl group or an aryl group and these groups may combine together to form a ring or a crosslinked ring; Rn represents an alkyl group, a cycloalkyl group or an aryl group; AR represents an aryl group; and Rn and AR may combine together to form a ring; and
X represents a hydrogen atom, an alkyl group, a halogen atom, a cyano group or an alkyloxycarbonyl group.

(7) The positive resist composition as described in any one of (4) to (6), wherein
at least one compound selected from the group consisting of triarylsulfonium salts of organic sulfonic acids, diazodisulfone derivatives and oxime esters of organic sulfonic acids is contained as the compound (A).

(8) The positive resist composition as described in (7), wherein
at least one compound selected from triarylsulfonium salts of organic sulfonic acids and at least one compound selected from the group consisting of diazodisulfone derivatives and oxime esters of organic sulfonic acids are contained as the compound (A).

(9) A pattern forming method comprising:
forming a resist film from the resist composition described in any one of (1) to (8); and
exposing and developing the resist film.

DETAILED DESCRIPTION OF THE INVENTION

The best mode for carrying out the present invention is described below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(S) Compound Having a Molecular Weight of 1,000 or Less and Containing at Least One Sulfonamide Group (—SO$_2$NH—)

The resist composition of the present invention comprises a compound having a molecular weight of 1,000 or less and containing at least one sulfonamide group (—SO$_2$NH—) (hereinafter sometimes referred to as a "sulfonamide compound").

The sulfonamide compound preferably has a molecular weight of 173 to 1,000.

When added to a chemical amplification resist composition containing (B) a compound capable of increasing the solubility in an alkali developer by the action of an acid and (A) a compound capable of generating an acid upon irradiation with an actinic ray or radiation, the sulfonamide compound can prevent the pattern profile from deterioration due to characteristics of the substrate surface. The sulfonamide compound also exhibits excellent properties in terms of LWR.

It is presumed that the sulfonamide compound interacts with the substrate and this allows the sulfonamide compound to be unevenly distributed to the surface and at the same time, prevents the (B) compound capable of increasing the solubility in an alkali developer by the action of an acid and the (A) compound capable of generating an acid upon irradiation with an actinic ray or radiation from interacting with the basic site on the substrate surface, as a result, deterioration of the pattern profile due to characteristics of the substrate surface is suppressed.

The sulfonamide compound preferably has a structure of the following formula:

R$_1$-L$_1$-SO$_2$NH-L$_2$-R$_2$  (1)

In formula (1), each of L$_1$ and L$_2$ independently represents a single bond, a carbonyl group, a carbonyloxy group, a sulfonyl group or a sulfonyloxy group.

Each of R$_1$ and R$_2$ independently represents an organic group.

The organic group of R$_1$ and R$_2$ includes an alkyl group, a cycloalkyl group, an aryl group, an aralkyl group and a heterocyclic group.

The alkyl group is preferably a linear or branched alkyl group having a carbon number of 1 to 15, and examples thereof include a methyl group, an ethyl group, an n-propyl group, an isopropyl group, an n-butyl group, an isobutyl group, a sec-butyl group, a tert-butyl group, a pentyl group, an isopentyl group, a neopentyl group, a tert-pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group.

The cycloalkyl group may be either monocyclic or polycyclic. The monocyclic cycloalkyl group is preferably a cycloalkyl group having a carbon number of 3 to 15, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl group, a norbornyl group, an isoboronyl group, a camphornyl group, a dicyclopentyl group, an α-pinel group, a tricyclodecanyl group, a tetracyclododecyl group and an androstanyl group. A part of the carbon atom in the cycloalkyl groups may be substituted by a heteroatom such as oxygen atom.

The aryl group is preferably an aryl group having a carbon number of 6 to 18, and examples thereof include a phenyl group, a naphthyl group and an anthryl group. The aryl group is more preferably a phenyl group.

The aralkyl group is preferably an aralkyl group having a carbon number of 7 to 12, and examples thereof include a benzyl group, a phenethyl group and a naphthylmethyl group.

The heterocyclic group is preferably a 5- to 7-membered, saturated or unsaturated, aromatic or non-aromatic, monocyclic or condensed-ring heterocyclic group having a carbon number of 3 to 30, and examples thereof include a 2-furyl group, a 2-thienyl group, a 2-pyridyl group, a 4-pyridyl group, a 2-pyrimidinyl group, a 2-benzothiazolyl group, a pyrrol-1-yl group, an imidazol-1-yl group, a pyrazol-1-yl group, a 1,2,3-triazol-1-yl group, a 1,2,4-triazol-1-yl group, a 1,2,4-triazol-4-yl group and an indol-1-yl group.

The organic group of R$_1$ and R$_2$ may have a substituent, and examples of the substituent which the organic group of R$_1$ and R$_2$ may have include an alkyl group (preferably having a carbon number of 1 to 15), a cycloalkyl group (preferably having a carbon number of 3 to 20), an aryl group (preferably having a carbon number of 6 to 18), an amino group, an amido group, a ureido group, a urethane group, a hydroxyl group, a carboxyl group, a halogen atom, an alkoxy group, a thioether group, an acyl group (preferably having a carbon number of 2 to 15), an acyloxy group (preferably having a carbon number of 2 to 15), an alkoxycarbonyl group (preferably having a carbon number of 2 to 15), a cyano group and a nitro group. Here, the alkyl group, cycloalkyl group and aryl group each may be further substituted by a halogen atom (preferably a fluorine atom) or the like.

L$_2$ is preferably a carbonyl group or a carbonyloxy group. In the case where L$_2$ is a single bond, R$_2$ is preferably an aryl group. In this case, the pKa of the sulfonamide group as well as hydrophilicity of the compound can be appropriately reduced and the interaction with the basic site of an SiON or SiN substrate can be strengthened, whereby a particularly high effect can be obtained.

The molecular weight of the sulfonamide compound is from 173 to 1,000, but from the standpoint of preventing sublimation from the film during heating at the coating (soft bake) or during heating after exposure (post exposure bake), the molecular weight is preferably from 200 to 1,000.

The sulfonamide compound preferably contains a dissociative group with a pKa of 4 to 11 in addition to the N-sulfonamide group. The dissociative group with a pKa of 4 to 11 includes a phenolic hydroxyl group, a carboxyl group and a fluorinated alkyl group-substituted alcohol group. This dissociative group is preferably substituted to R$_2$ of formula (1). By virtue of such a group being present, the substrate dependency tends to be more reduced. This is considered to occur because the interaction with the substrate is more effectively brought out.

The sulfonamide compound preferably contains an alkyl (preferably a perfluoroalkyl group having a carbon number of 1 to 5), aryl (preferably a perfluorophenyl group) or aralkyl group substituted by at least one fluorine atom.

The alkyl, aryl or aralkyl group substituted by at least one fluorine atom may be the organic group itself of $R_1$ or $R_2$ or may be a substituent substituted to the organic group of $R_1$ or $R_2$.

Specific examples of the sulfonamide compound are set forth below, but the present invention is not limited thereto.

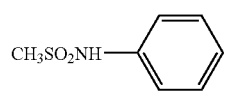
(S-1)

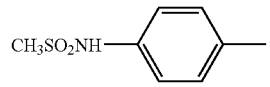
(S-2)

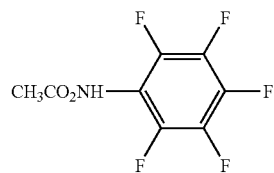
(S-3)

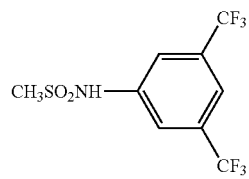
(S-4)

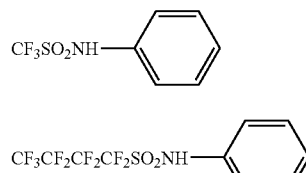
(S-5)

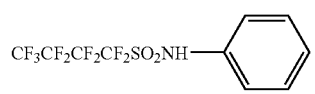
(S-6)

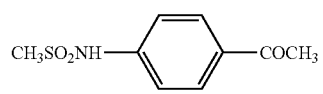
(S-7)

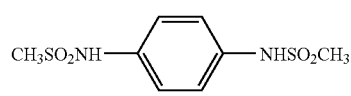
(S-8)

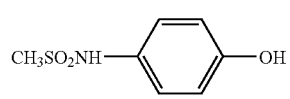
(S-9)

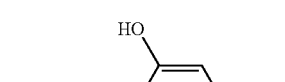
(S-10)

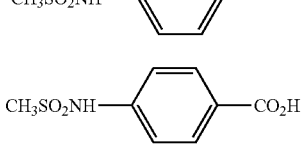
(S-11)

-continued

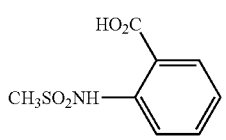
(S-12)

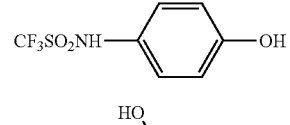
(S-13)

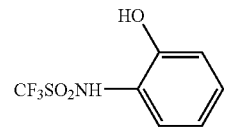
(S-14)

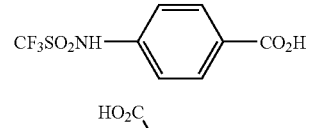
(S-15)

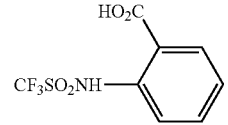
(S-16)

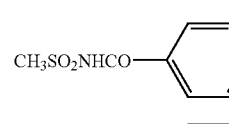
(S-17)

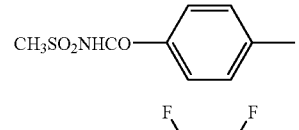
(S-18)

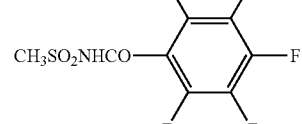
(S-19)

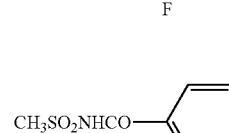
(S-20)

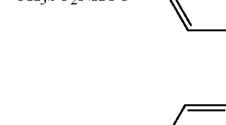
(S-21)

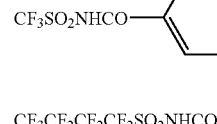
(S-22)

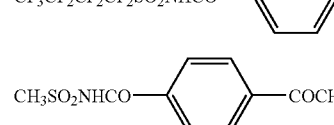
(S-23)

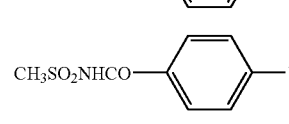
(S-24)

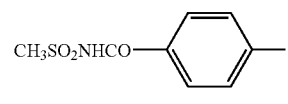
(S-25)

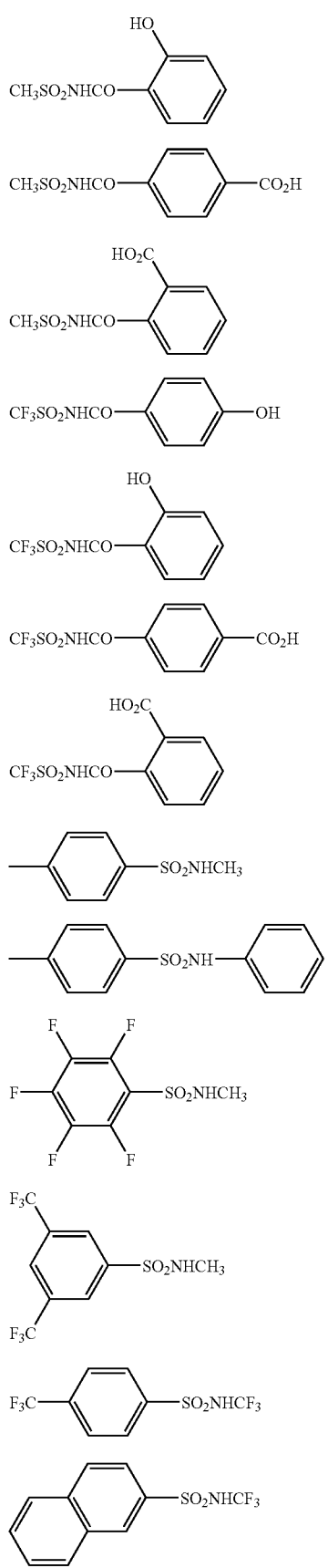
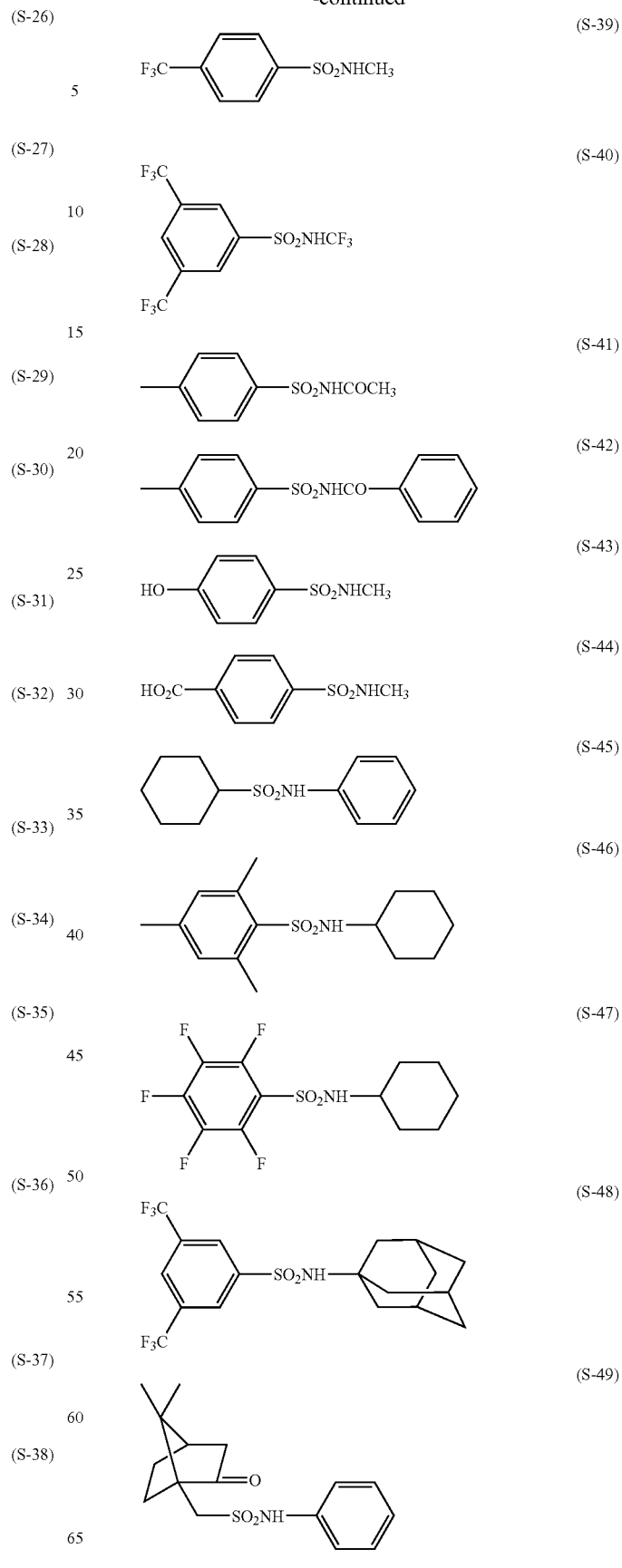

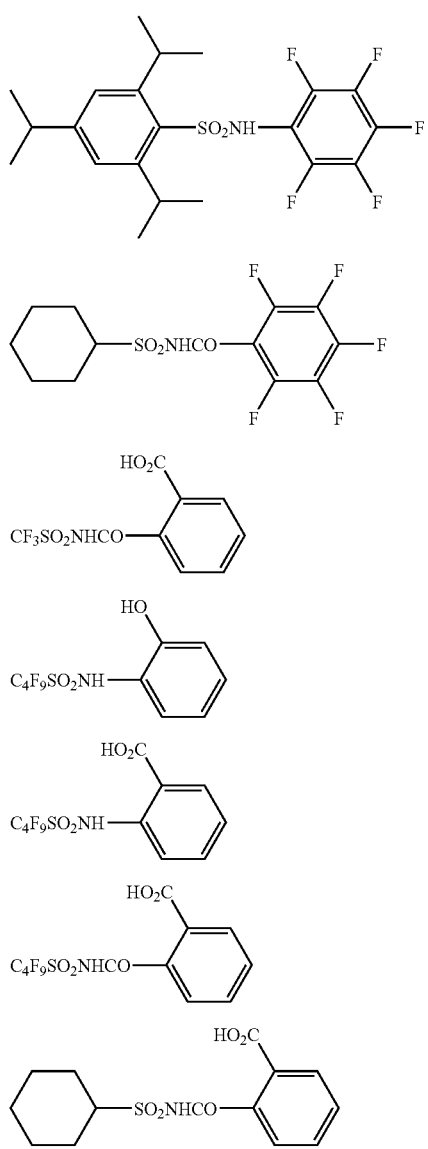

The sulfonamide compound can be obtained by reacting a sulfonyl halide compound with a primary or secondary amino group-containing compound in the presence of a base catalyst. Also, an N-sulfonylamide compound where a carbonyl group is linked vicinally to a sulfonamide compound can be obtained by reacting a carboxylic acid halide compound with a sulfonamide compound in the presence of a base catalyst or by reacting a sulfonyl isocyanate compound with a carboxy group-containing compound in the presence of a base catalyst.

The amount of the sulfonamide compound used is usually from 0.1 to 10 mass %, preferably from 0.5 to 5 mass %, based on the solid content of the resist composition.

(A) Compound Capable of Generating an Acid Upon Irradiation with an Actinic Ray or Radiation The positive resist composition of the present invention contains a compound capable of generating an acid upon irradiation with an actinic ray or radiation (hereinafter sometimes referred to as an "acid generator").

Such an acid generator may be appropriately selected from a photo-initiator for cationic photopolymerization, a photo-initiator for radical photopolymerization, a photodecoloring agent for dyes, a photodiscoloring agent, a known compound used for microresist or the like and capable of generating an acid upon irradiation with an actinic ray or radiation, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with an actinic ray or radiation is introduced into the main or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with an actinic ray or radiation, the compounds represented by the following formulae (ZI), (ZII) and (ZIII) are preferred.

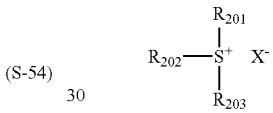

(ZI)

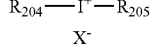

(ZII)

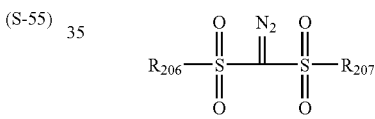

(ZIII)

In formula (ZI), each of $R_{201}$, $R_{202}$ and $R_{203}$ independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

Preferred organic anions include organic anions represented by the following formulae (AN1) to (AN4):

AN1

AN2

AN3

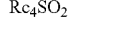
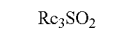
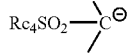

AN4

In formulae (AN1) and (AN2), $Rc_1$ represents an organic group.

The organic group of $Rc_1$ in formula (AN1) includes an organic group having a carbon number of 1 to 30 and is preferably an alkyl or aryl group which may be substituted, or a group where a plurality of such groups are connected through a linking group such as single bond, —O—, —CO$_2$—, —S—, —SO$_3$— or —SO$_2$N(Rd$_1$)—.

Rd$_1$ represents a hydrogen atom or an alkyl group and may form a ring structure together with the alkyl or aryl group to which Rd$_1$ is bonded.

The organic group of $Rc_1$ is more preferably an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom is preferably in a form where a hydrogen atom remains instead of replacing all hydrogen atoms by a fluorine atom, and it is more preferred that the number of hydrogen atoms is larger than the number of fluorine atoms. The absence of a perfluoroalkyl group having a carbon number of 5 or more enables reduction in the toxicity to ecology.

A still more preferred embodiment of $Rc_1$ is a group represented by the following formula.

$Rc_7$-Ax-$Rc_6$-

In the formula, $Rc_6$ represents a perfluoroalkylene group having a carbon number of 4 or less, preferably from 2 to 4, more preferably 2 or 3, or a phenylene group substituted by from 1 to 4 fluorine atoms and/or from 1 to 3 fluoroalkyl groups.

Ax represents a single bond or a divalent linking group (preferably —O—, —CO$_2$—, —S—, —SO$_3$— or —SO$_2$N(Rd$_1$)—). Rd$_1$ represents a hydrogen atom or an alkyl group and may combine with $Rc_7$ to form a ring structure.

$Rc_7$ represents a hydrogen atom, a fluorine atom, a linear or branched alkyl group which may be substituted, a monocyclic or polycyclic cycloalkyl group which may be substituted, or an aryl group which may be substituted. The alkyl group, cycloalkyl group and aryl group which may be substituted each preferably contains no fluorine atom as the substituent.

In formulae (AN3) and (AN4), each of $Rc_3$, $Rc_4$ and $Rc_5$ independently represents an organic group.

Preferred organic groups for $Rc_3$, $Rc_4$ and $Rc_5$ in formulae (AN3) and (AN4) are the same as preferred organic groups in $Rc_1$.

$Rc_3$ and $Rc_4$ may combine to form a ring.

The group formed by combining $Rc_3$ and $Rc_4$ includes an alkylene group and an arylene group and is preferably a perfluoroalkylene group having a carbon number of 2 to 4. When $Rc_3$ and $Rc_4$ combine to form a ring, this is preferred because the acidity of the acid generated upon irradiation with light increases and the sensitivity is enhanced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl or cycloalkyl group which is present, if desired, in the arylsulfonium compound is preferably an alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably an alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

Each of $R_{201}$ to $R_{203}$ is preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be either linear or branched and includes a linear or branched alkyl group preferably having a carbon number of 1 to 10 (e.g., methyl, ethyl, propyl, butyl, pentyl). The alkyl group as $R_{201}$ to $R_{203}$ is preferably a linear or branched 2-oxoalkyl group or an alkoxycarbonylmethyl group.

The cycloalkyl group as $R_{201}$ to $R_{203}$ includes a cycloalkyl group preferably having a carbon number of 3 to 10 (e.g., cyclopentyl, cyclohexyl, norbornyl). The cycloalkyl group as $R_{201}$ to $R_{203}$ is preferably a cyclic 2-oxoalkyl group.

The linear, branched or cyclic 2-oxoalkyl group as $R_{201}$ to $R_{203}$ includes a group having >C=O at the 2-position of the above-described alkyl or cycloalkyl group.

The alkoxy group in the alkoxycarbonylmethyl group as $R_{201}$ to $R_{203}$ includes an alkoxy group preferably having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

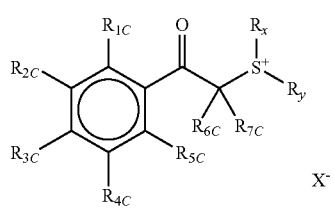

(ZI-3)

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$ or a pair of $R_x$ and $R_y$ may combine together to form a ring structure, and the ring structure may contain an oxygen atom, a sulfur atom, an ester bond or an amide bond. Examples of the group formed by combining any two or more members out of $R_{1c}$ to $R_{5c}$ or a pair of $R_x$ and $R_y$ include a butylene group and a pentylene group.

Specific preferred examples of the compound (ZI-3) include compounds set forth as formulae (I-1) to (I-70) in US2003/0224288A1, and compounds set forth as formulae (IA-1) to (IA-54) and formulae (IB-1) to (IB-24) in US2003/0077540A1.

In formulae (ZII) and (ZIII), each of $R_{204}$ to $R_{207}$ independently represents an aryl group which may have a substituent, an alkyl group which may have a substituent, or a cycloalkyl group which may have a substituent.

The aryl group of $R_{204}$ to $R_{207}$ in formulae (ZII) and (ZIII) is preferably a phenyl group or a naphthyl group, more preferably a phenyl group.

The alkyl group of $R_{204}$ to $R_{207}$ is preferably a linear or branched alkyl group having a carbon number of 1 to 10 (e.g., methyl, ethyl, propyl, butyl, pentyl).

The cycloalkyl group of $R_{204}$ to $R_{207}$ is preferably a cycloalkyl group having a carbon number of 3 to 10 (e.g., cyclopentyl, cyclohexyl, norbornyl).

Examples of the substituent which each of $R_{204}$ to $R_{207}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion and includes the same as those of the non-nucleophilic anion of $X^-$ in formula (ZI).

Out of the compounds capable of generating an acid upon irradiation with an actinic ray or radiation, the compounds represented by the following formulae (ZIV), (ZV) and (ZVI) are also preferred

(ZIV)

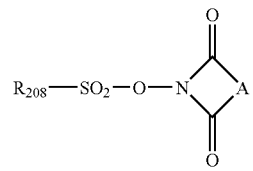

(ZV)

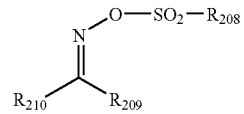

(ZVI)

In formulae (ZIV) to (ZVI), each of $Ar_3$ and $Ar_4$ independently represents an aryl group.

$R_{208}$ represents an alkyl group, a cycloalkyl group or an aryl group.

Each of $R_{209}$ and $R_{210}$ independently represents an alkyl group, a cycloalkyl group, an aryl group or an electron-withdrawing group. $R_{209}$ is preferably an aryl group, and $R_{210}$ is preferably an electron-withdrawing group, more preferably a cyano group or a fluoroalkyl group.

A represents an alkylene group, an alkenylene group or an arylene group.

Among the compounds capable of generating an acid upon irradiation with an actinic ray or radiation, the compounds represented by formulae (ZI) to (ZIII) are preferred, the compound represented by formulae (ZI) is more preferred, and the compounds represented by formulae (ZI-1) to (ZI-3) are still more preferred.

Furthermore, a compound capable of generating an acid represented by any one of the following formulae (AC1) to (AC3) upon irradiation with an actinic ray or radiation is preferred.

(AC1)

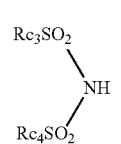

(AC2)

-continued (AC3)
$$Rc_3SO_2\phantom{xxx}$$
$$Rc_4SO_2-CH$$
$$Rc_5SO_2\phantom{xxx}$$

$Rc_1$ and $Rc_3$ to $Rc_5$ in formulae (AC1) to (AC3) have the same meanings as $Rc_1$ and $Rc_3$ to $Rc_5$ in formulae (AN1), (AN3) and (AN4).

That is, a preferred embodiment of the component (A) is a compound where in formula (ZI), X⁻ is an anion selected from formulae (AN1), (AN3) and (AN4).

At least one compound selected from triarylsulfonium salts of organic sulfonic acids (in formula (ZI), $R_{201}$ to $R_{203}$ are an aryl group and X⁻ is an organic sulfonate anion represented by formula (AN1)), diazodisulfone derivatives (formula (ZIII)) and oxime esters of organic sulfonic acids (formula (ZVI)) is preferably used as the acid generator.

More preferably, at least one compound selected from triarylsulfonium salts of organic sulfonic acids and at least one compound selected from diazodisulfone derivatives and oxime esters of organic sulfonic acids are used as the acid generator.

Out of the compounds capable of generating an acid upon irradiation with an actinic ray or radiation, particularly preferred examples are set forth below, but the present invention is not limited thereto.

(z1) $(\text{Ph})_3\text{S}^+$  $CF_3SO_3^-$ (z2) $(\text{Ph})_3\text{S}^+$  $C_4F_9SO_3^-$ (z3) $(\text{Ph})_3\text{S}^+$  $C_8F_{17}SO_3^-$ (z4) $(\text{Ph})_3\text{S}^+$  $C_2F_5SO_3^-$ (z5) $(\text{Ph})_3\text{S}^+$  $C_3F_7SO_3^-$ (z6) $(\text{Ph})_3\text{S}^+$  $C_6F_{13}SO_3^-$ (z7) $(\text{Ph})_3\text{S}^+$  ⁻O₃S—(2,4,6-triisopropylphenyl)

(z8) $(\text{Ph})_3\text{S}^+$  ⁻O₃S—(3,5-bis(trifluoromethyl)phenyl)

(z9) (tolyl)(phenyl)₂S⁺  $C_8F_{17}SO_3^-$ (z10) $(\text{Ph})_3\text{S}^+$  $C_{11}F_{23}COO^-$ (z11) $(\text{Ph})_3\text{S}^+$  $C_2F_5-O-C_2F_4SO_3^-$ (z12) $(\text{Ph})_3\text{S}^+$  camphorsulfonate anion (z13) Bis(triphenylsulfonium) linked via phenyl-S-phenyl bridge, 2 ⁻O₃S—(pentafluorophenyl)

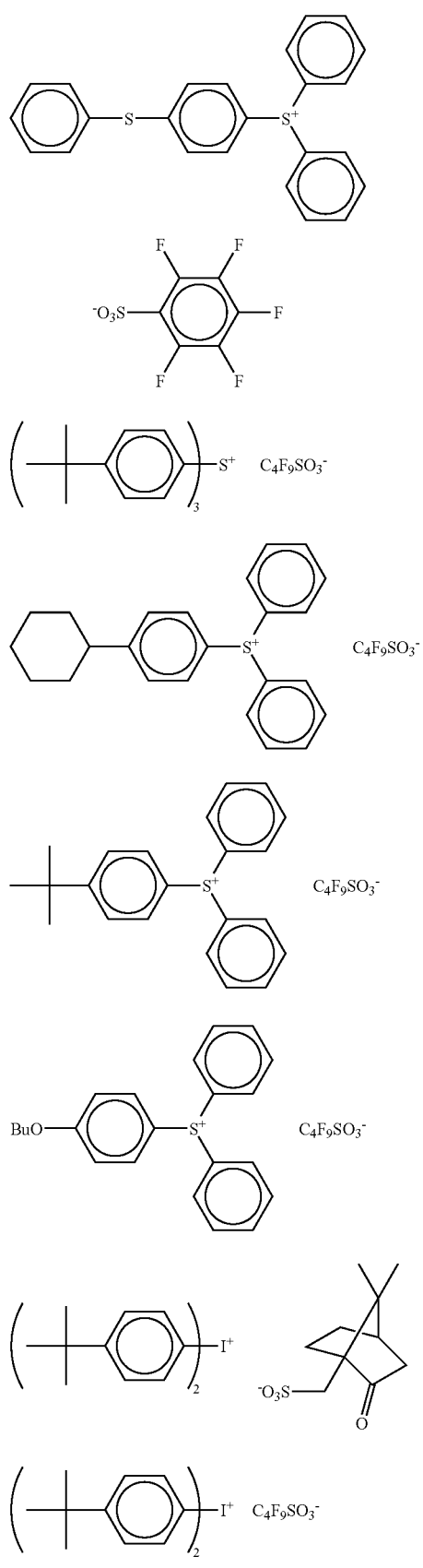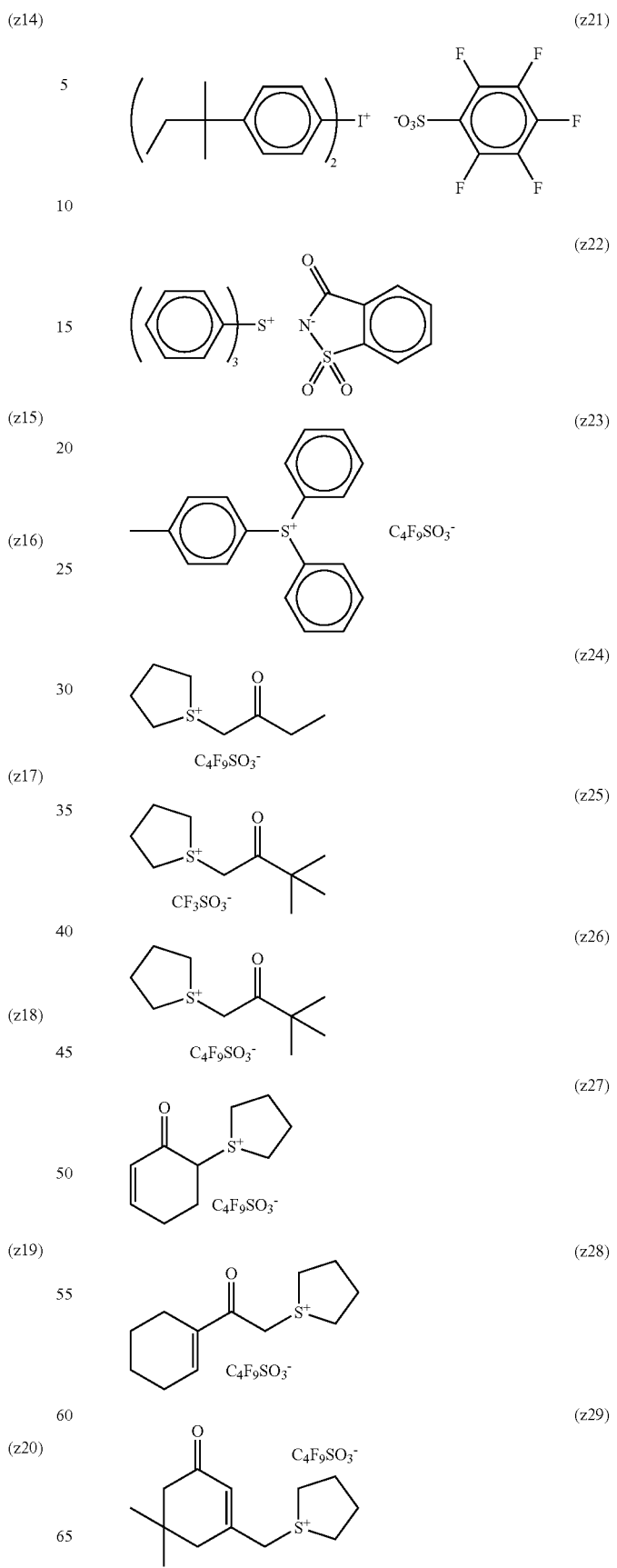

(z30) 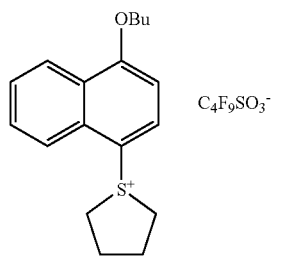
(z31) 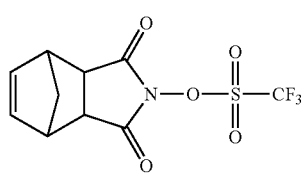
(z32) 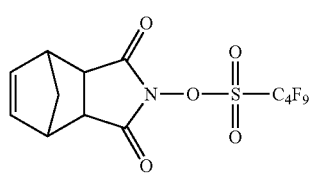
(z33) 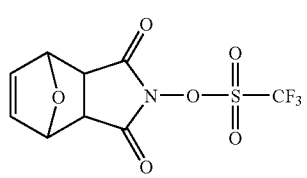
(z34) 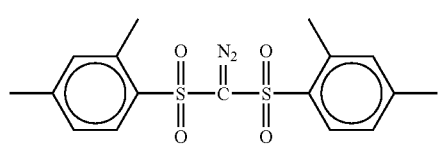
(z35) 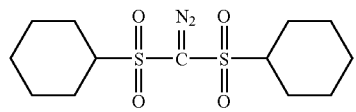
(z36) 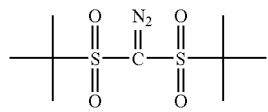
(z37) 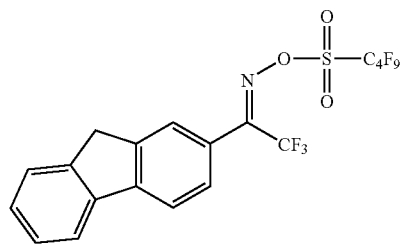
(z38) 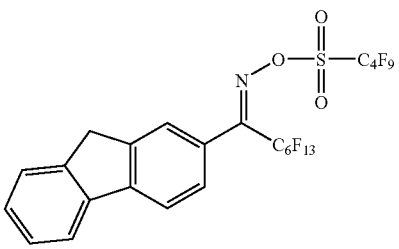
(z39) 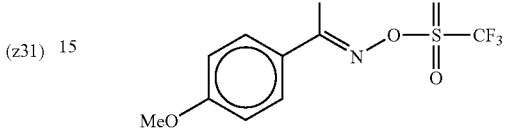
(z40) 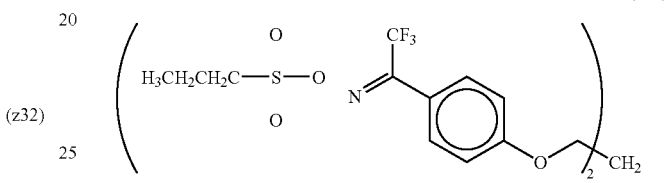
(z41) 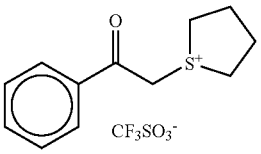
(z42) 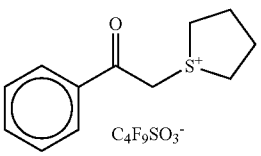
(z43) 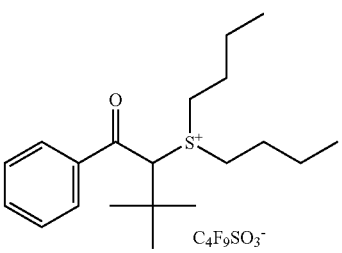
(z44) 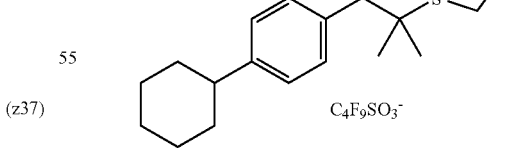
(z45) 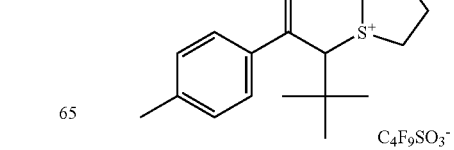

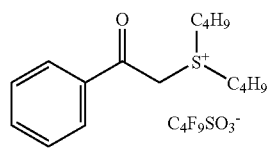 (z46)
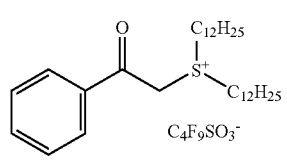 (z47)
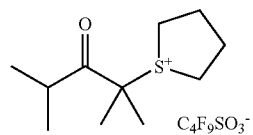 (z48)
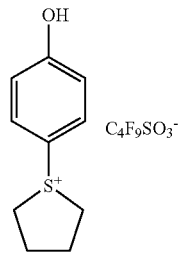 (z49)
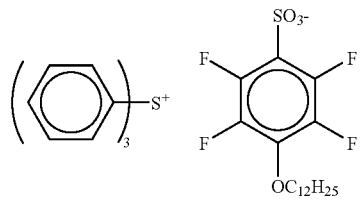 (z50)
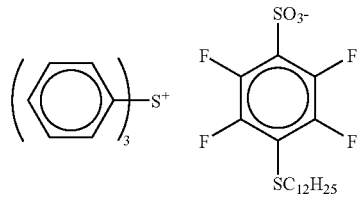 (z51)
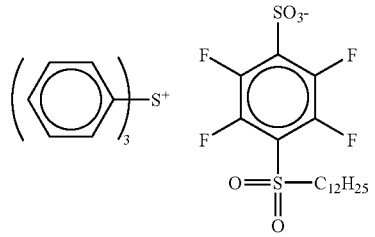 (z52)
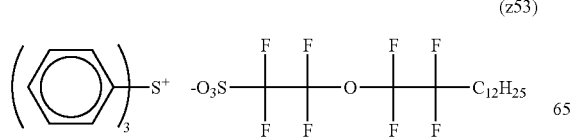 (z53)
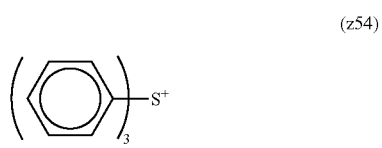 (z54)
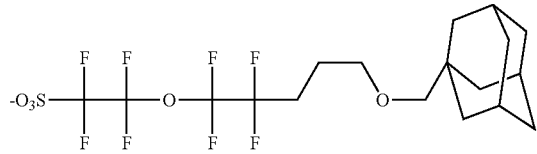 (z47)
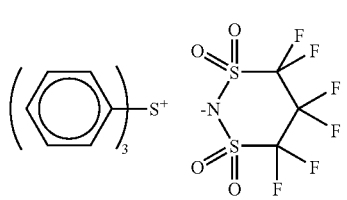 (z55)
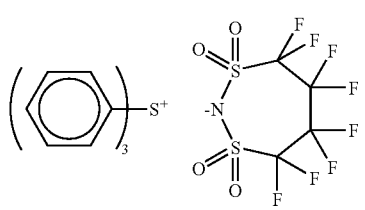 (z56)
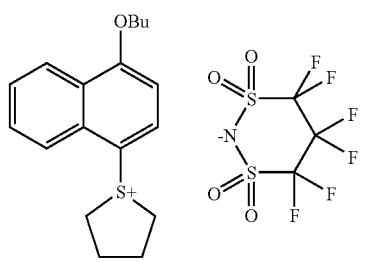 (z57)
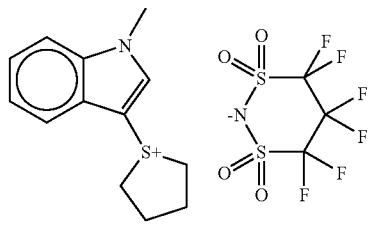 (z58)
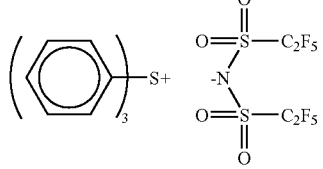 (z59)
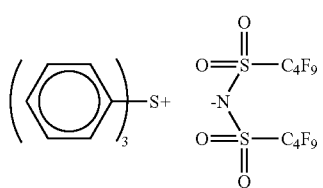 (z60)

(z61) 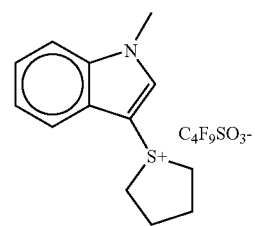
(z62) 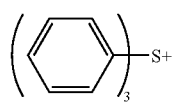
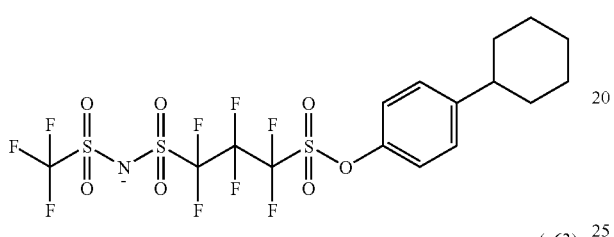
(z63) 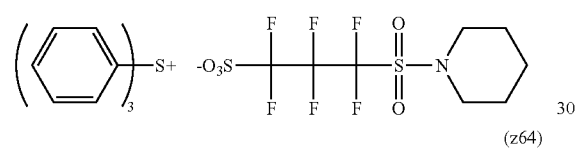
(z64) 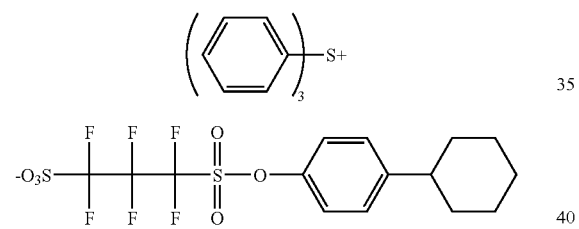
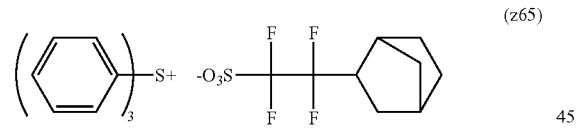
(z65) 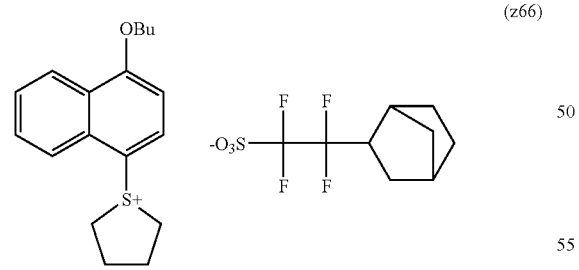
(z66) 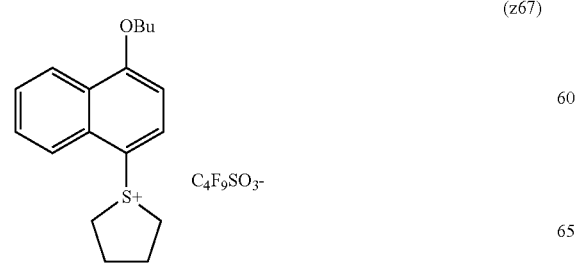
(z67)
(z68) 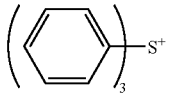
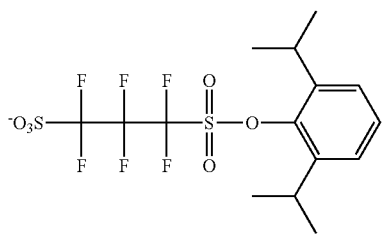
(z69) 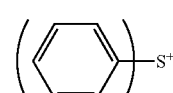
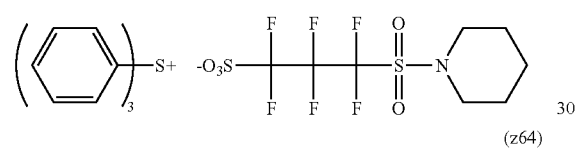
(z70) 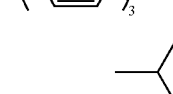
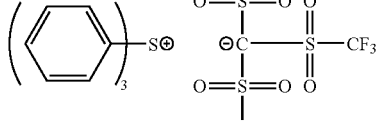
(z71) 
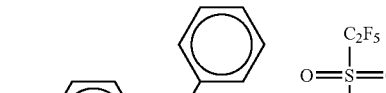
(z72) 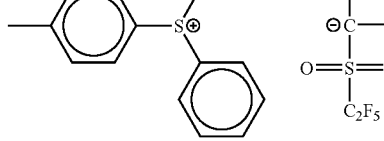
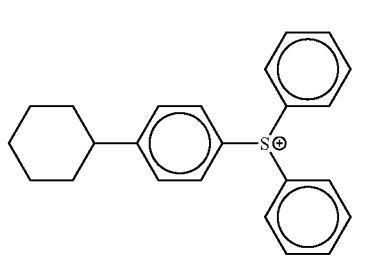
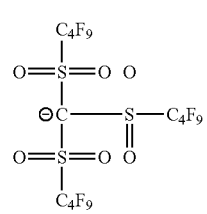

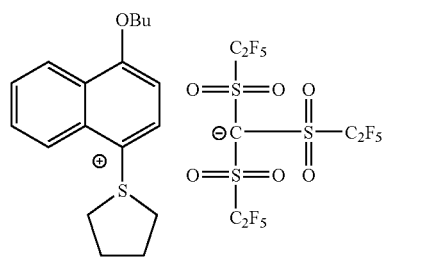
(z73)
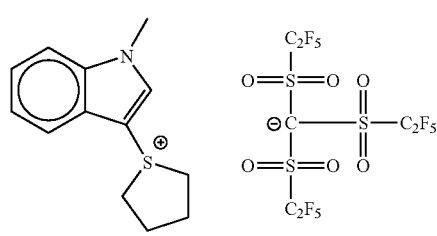
(z74)
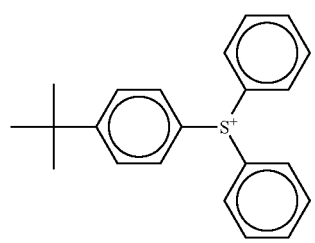
(z75)
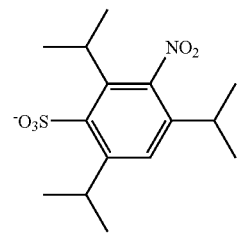
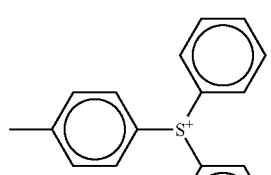
(z76)
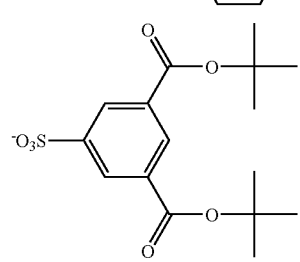
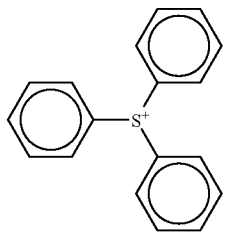
(z77)
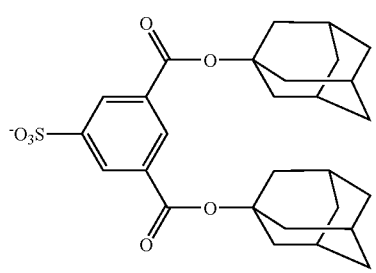
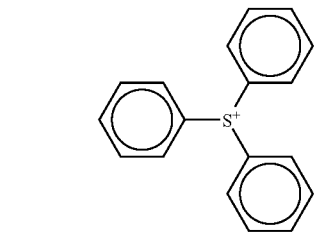
(z78)
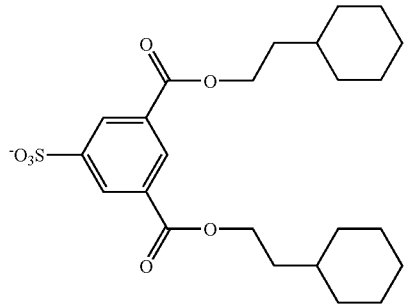
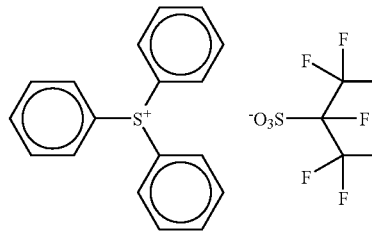
(z79)
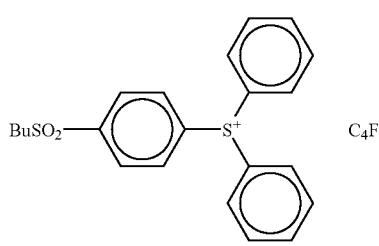
(z80)
One of these acid generators may be used alone, or two or more kinds thereof may be used in combination. In the case of using two or more kinds in combination, compounds capable of generating two or more kinds of organic acids differing in the total number of atoms except for hydrogen atom by 2 or more are preferably combined.

The content of the acid generator in the composition is, based on the entire solid content of the positive resist composition, preferably from 0.1 to 20 mass % and in the case of KrF exposure, preferably from 0.5 to 7 mass %, more preferably from 1 to 5 mass %. In the case of electron beam exposure, the acid generator content is preferably from 2 to 13 mass %, more preferably from 5 to 10 mass %.

In the positive resist composition of the present invention, a compound capable of generating a carboxylic or imide acid upon irradiation with an actinic ray or radiation (hereinafter sometimes referred to as a "component (A2)") may also be used as the acid generator.

The component (A2) is preferably a compound represented by the following formula (C):

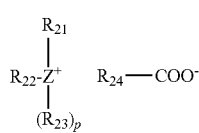
(C)

In formula (C), each of $R_{21}$ to $R_{23}$ independently represents an alkyl group, a cycloalkyl group, an alkenyl group or an aryl group.

$R_{24}$ represents a hydrogen atom, an alkyl group, a cycloalkyl group, an alkenyl group or an aryl group.

Z represents a sulfur atom or an iodine atom. When Z is a sulfur atom, p is 1, and when Z is an iodine atom, p is 0.

In formula (C), each of $R_{21}$ to $R_{23}$ independently represents an alkyl group, a cycloalkyl group, an alkenyl group or an aryl group, and these groups each may have a substituent.

Examples of the substituent which the alkyl group, cycloalkyl group and alkenyl group each may have include a halogen atom (e.g., chlorine, bromine, fluorine), an aryl group (e.g., phenyl, naphthyl), a hydroxy group and an alkoxy group (e.g., methoxy, ethoxy, butoxy).

Examples of the substituent which the aryl group may have include a halogen atom (e.g., chlorine, bromine, fluorine), a nitro group, a cyano group, an alkyl group (e.g., methyl, ethyl, tert-butyl, tert-amyl, octyl), a hydroxy group and an alkoxy group (e.g., methoxy, ethoxy, butoxy).

Each of $R_{21}$ to $R_{23}$ is independently, preferably an alkyl group having a carbon number of 1 to 12, a cycloalkyl group having a carbon number of 3 to 12, an alkenyl group having a carbon number of 2 to 12, or an aryl group having a carbon number of 6 to 24, more preferably an alkyl group having a carbon number of 1 to 6, a cycloalkyl group having a carbon number of 3 to 6, or an aryl group having a carbon number of 6 to 18, still more preferably an aryl group having a carbon number of 6 to 15, and these groups each may have a substituent.

$R_{24}$ represents a hydrogen atom, an alkyl group, a cycloalkyl group, an alkenyl group or an aryl group.

Examples of the substituent which the alkyl group, cycloalkyl group and alkenyl group each may have are the same as those of the substituent described above when $R_{21}$ is an alkyl group. Examples of the substituent of the aryl group are the same as those of the substituent described above when $R_{21}$ is an aryl group.

$R_{24}$ is preferably a hydrogen atom, an alkyl group having a carbon number of 1 to 30, a cycloalkyl group having a carbon number of 3 to 30, an alkenyl group having a carbon number of 2 to 30, or an aryl group having a carbon number of 6 to 24, more preferably an alkyl group having a carbon number of 1 to 18, a cycloalkyl group having a carbon number of 3 to 18, or an aryl group having a carbon number of 6 to 18, still more preferably an alkyl group having a carbon number of 1 to 12, a cycloalkyl group having a carbon number of 3 to 12, or an aryl group having a carbon number of 6 to 15. These groups each may have a substituent.

Z represents a sulfur atom or an iodine atom. p is 1 when Z is a sulfur atom, and 0 when Z is an iodine atom.

Incidentally, two or more cation moieties of formula (C) may combine through a single bond or a linking group (e.g., —S—, —O—) to form a cation structure having a plurality of cation moieties of formula (C).

Specific preferred examples of the component (A2) are set forth below, but the present invention is of course not limited thereto.

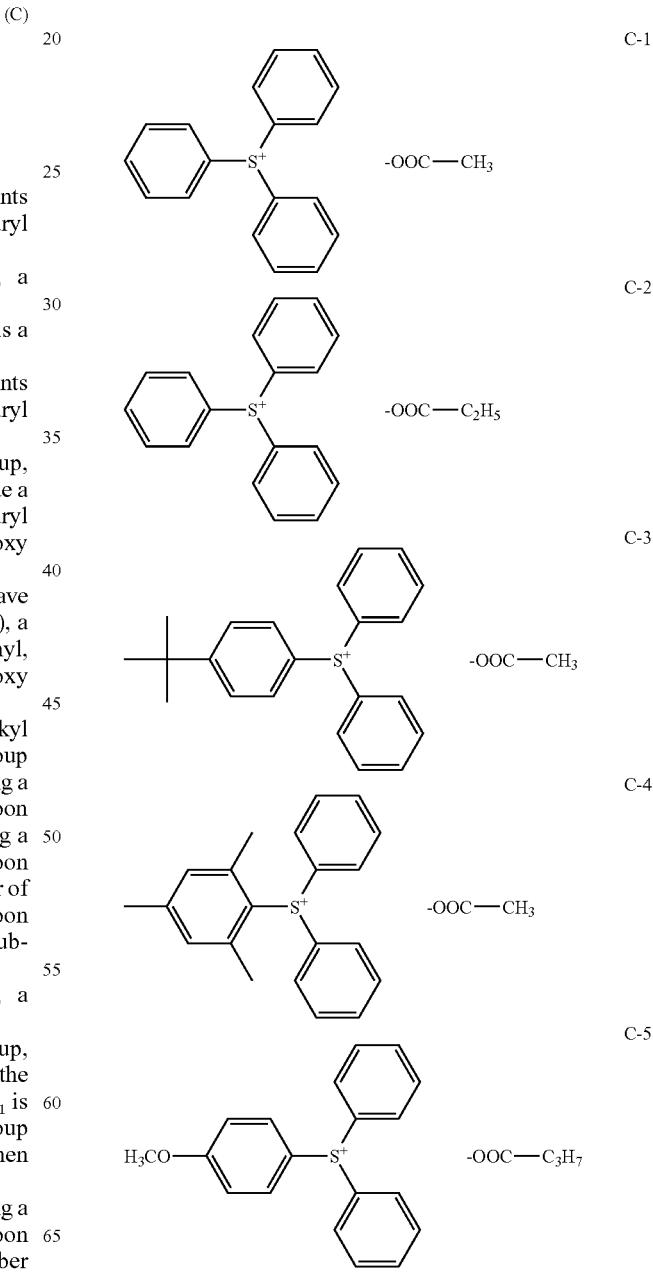

-continued

C-6
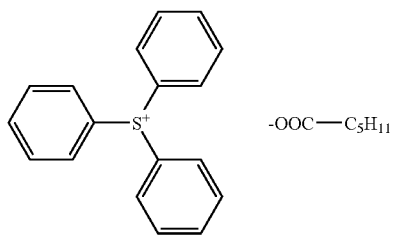

C-7
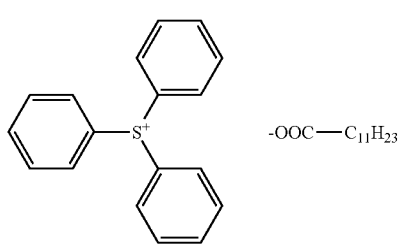

C-8
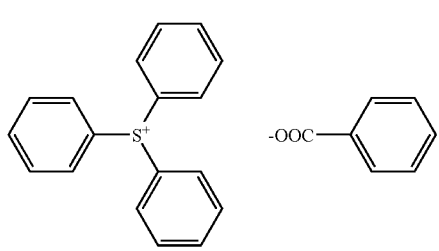

C-9
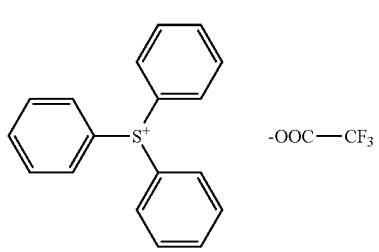

C-10
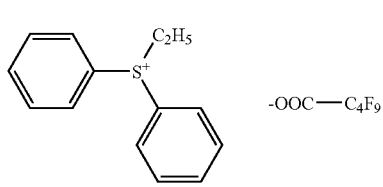

C-26
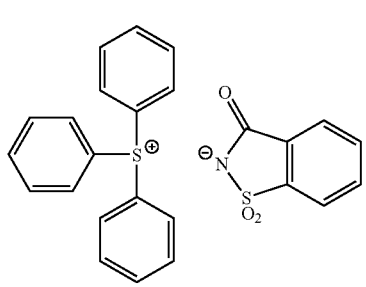

-continued

C-27
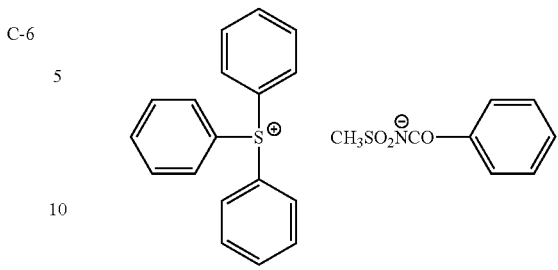

C-28
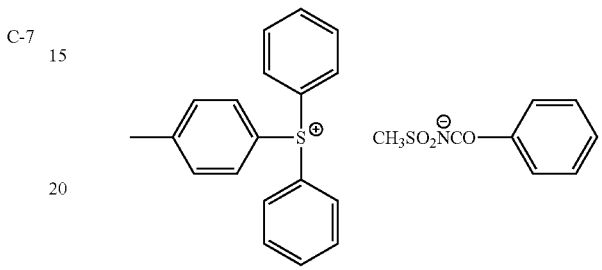

C-29
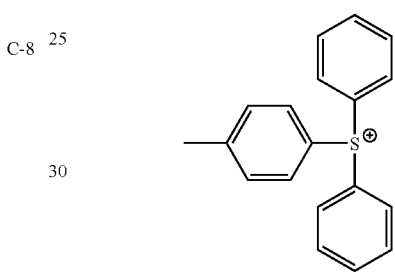

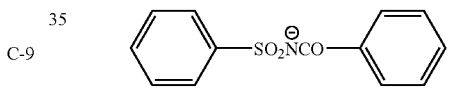

C-30
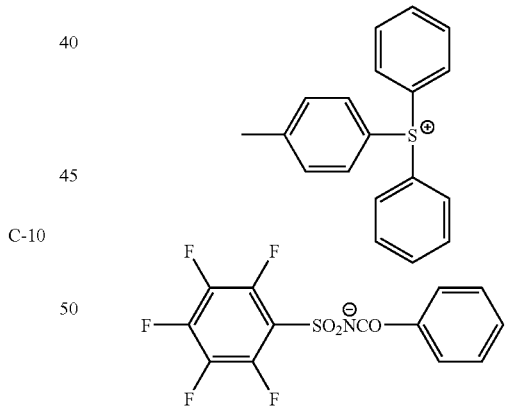

The content of the component (A2) in the positive resist composition of the present invention is preferably from 0.01 to 10 mass %, more preferably from 0.03 to 5 mass %, still more preferably from 0.05 to 3 mass %, based on the entire solid content of the composition. One kind of these components (A2) may be used, or two or more kinds thereof may be mixed and used.

In the case of mixing the component (A1) and the component (A2), the ratio of component (A2)/component (A1) (by mass) is usually from 99.9/0.1 to 50/50, preferably from 99/1 to 60/40, more preferably from 98/2 to 70/30.

The component (A2) can be synthesized by a known method such as the synthesis method described in JP-A-2002-27806.

(B) Compound Capable of Increasing Solubility in an Alkali Developer by the Action of an Acid The compound capable of increasing the solubility in an alkali developer by the action of an acid (hereinafter sometimes referred to as a "component (B)"), used in the positive resist composition of the present invention, is preferably a resin having a group capable of decomposing by the action of an acid in the main or side chain or both the main and side chains of the resin. Of these resins, a resin having in the side chain a group capable of decomposing by the action of an acid is more preferred.

The group capable of decomposing by the action of an acid is preferably a —COOA$^0$ group or a —O—B$^0$ group, and examples of the group containing such a group include those represented by —R$^0$—COOA$^0$ and —Ar—O—B$^0$.

In the formulae above, A$^0$ represents —C(R$^{01}$)(R$^{02}$)(R$^{03}$), —Si(R$^{01}$)(R$^{02}$)(R$^{03}$), —C(R$^{04}$)(R$^{05}$)—O—R$^{06}$ or —CH(Rn)(AR).

B$^0$ represents A$^0$ or a —CO—O-A$^0$ group.

Ar represents an arylene group (preferably having a carbon number of 6 to 12) and is preferably a phenylene group.

R$^0$ represents a single bond or an alkylene group (preferably having a carbon number of 1 to 6) and is preferably a single bond or an alkylene group having a carbon number of 1 to 4, more preferably a single bond or an alkylene group having a carbon number of 1 or 2.

Each of R$^{01}$ to R$^{03}$ independently represents an alkyl group (preferably having a carbon number of 1 to 8), a cycloalkyl group (preferably having a carbon number of 4 to 10), or an aryl group (preferably having a carbon number of 6 to 15), and these groups may form a ring or a crosslinked ring in cooperation with each other.

Each of R$^{01}$ to R$^{03}$ is independently, preferably an alkyl group having a carbon number of 1 to 6, a cycloalkyl group having a carbon number of 5 to 8, or an aryl group having a carbon number of 6 to 12, more preferably an alkyl group having a carbon number of 1 to 4, a cyclohexyl group or a phenyl group.

Each of R$^{04}$ and R$^{05}$ independently represents a hydrogen atom, an alkyl group (preferably having a carbon number of 1 to 8) and is preferably a hydrogen atom or an alkyl group having a carbon number of 1 to 6, more preferably a hydrogen atom or an alkyl group having a carbon number of 1 to 4.

R$^{06}$ represents an alkyl group (preferably having a carbon number of 1 to 15) which may contain an ether group or a thioether group, a cycloalkyl group (preferably having a carbon number of 4 to 10), an aryl group (preferably having a carbon number of 6 to 15), or a group comprising a mixture of these groups. R$^{06}$ is preferably an alkyl group having a carbon number of 1 to 12 which may contain an ether group or a thioether group, a cycloalkyl group having a carbon number of 5 to 8, an aryl group having a carbon number of 6 to 12, or a group comprising a mixture of these groups, more preferably an alkyl group having a carbon number of 1 to 8 which may contain an ether group or a thioether group, a cyclohexyl group, a phenyl group, a naphthyl group, or a group comprising a mixture of these groups.

It is also preferred that R$^{06}$ forms a ring in cooperation with R$^{04}$ or R$^{05}$.

Rn is an alkyl group (preferably having a carbon number of 1 to 8), a cycloalkyl group (preferably having a carbon number of 4 to 10), or an aryl group (preferably having a carbon number of 6 to 15).

AR is an aryl group and is preferably a phenyl group or a naphthyl group.

Preferred examples of the acid-decomposable group include a silyl ether group, a cumyl ester group, an acetal group, a tetrahydropyranyl ether group, an enol ether group, an enol ester group, a tertiary alkyl ether group, a tertiary alkyl ester group, a tertiary alkyl carbonate group and a secondary benzyl ester group. Among these, more preferred are a tertiary alkyl ester group, a tertiary alkyl carbonate group, a cumyl ester group, an acetal group, a tetrahydropyranyl ether group and a secondary benzyl ester group.

In the case where such a group capable of decomposing by the action of an acid is bonded as a side chain, the matrix resin is an alkali-soluble resin having an —OH or —COOH group, preferably a —R$^0$—COOH or —Ar—OH group, in the side chain. Examples thereof include the following alkali-soluble resins.

Preferred alkali-soluble resins are an o-, m- or p-poly(hydroxystyrene) or a copolymer thereof, a hydrogenated poly(hydroxystyrene), a halogen- or alkyl-substituted poly(hydroxystyrene), a partially O-alkylated or O-acylated poly(hydroxystyrene), a styrene-hydroxystyrene copolymer, an α-methylstyrene-hydroxystyrene copolymer, and a hydrogenated novolak resin.

The component (B) is preferably a resin having a repeating unit represented by the following formula (A1) or (A2):

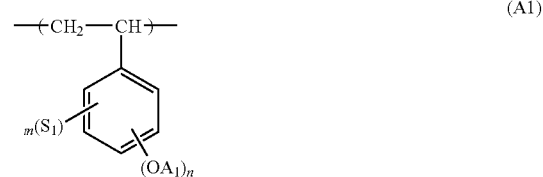

In formula (A1), A$_1$ represents a group capable of leaving by the action of an acid, represented by —C(R$^{01}$)(R$^{02}$)(R$^{03}$) or —C(R$^{04}$)(R$^{05}$)—O—R$^{06}$ (wherein each of R$^{01}$ to R$^{03}$ independently represents an alkyl group, a cycloalkyl group or an aryl group and these groups may combine together to form a ring or a crosslinked ring; each of R$^{04}$ and R$^{05}$ independently represents a hydrogen atom, an alkyl group, a cycloalkyl group or an aryl group; and R$^{06}$ represents an alkyl group, a cycloalkyl group or an aryl group).

S$_1$ represents, when a plurality of S$_1$'s are present, each independently represents, a substituent.

n represents an integer of 1 to 3, and m represents an integer of 0 to 3, provided that m+n≦5.

In formula (A2), A$_2$ represents a group capable of leaving by the action of an acid, represented by —C(R$^{01}$)(R$^{02}$)(R$^{03}$) or —CH(Rn)(AR) (wherein each of R$^{01}$ to R$^{03}$ independently represents an alkyl group, a cycloalkyl group or an aryl group and these groups may combine together to form a ring or a crosslinked ring; Rn represents an alkyl group, a cycloalkyl group or an aryl group; and AR represents an aryl group).

X represents a hydrogen atom, an alkyl group, a halogen atom, a cyano group or an alkyloxycarbonyl group.

The alkyl group of R$^{01}$ to R$^{06}$ in formulae (A1) and (A2) is preferably an alkyl group having a carbon number of 1 to 8.

The cycloalkyl group of $R^{01}$ to $R^{06}$ is preferably a cycloalkyl group having a carbon number of 4 to 10.

The aryl group of $R^{01}$ to $R^{06}$ is preferably an aryl group having a carbon number of 6 to 15.

The alkyl group of X may have a substituent. Examples of the alkyl group having a substituent include a $CF_3$ group, an alkyloxycarbonylmethyl group, an alkylcarbonyloxymethyl group, a hydroxymethyl group and an alkoxymethyl group.

Examples of the substituent $S_1$ include an alkyl group, an alkoxy group, a halogen atom, cyano, an acyl group, an acyloxy group, an aryl group, an aryloxy group and an aralkyl group.

The alkyl or cycloalkyl group of Rn is preferably an alkyl or cycloalkyl group having a carbon number of 20 to less, and examples thereof include a methyl group, an ethyl group, a propyl group, an isopropyl group, an n-butyl group, an isobutyl group, a tert-butyl group, a pentyl group, a cyclopentyl group, a hexyl group, a cyclohexyl group, an octyl group and a dodecyl group. These groups each may have a substituent, and preferred examples of the substituent which these groups each may have include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue, and the carbon number is preferably 8 or less. Among these, more preferred are an alkoxy group, a hydroxyl group, a halogen atom, a nitro group, an acyl group, an acyloxy group, an acylamino group and a sulfonylamino group.

The aryl group of Rn is preferably an aryl group having a carbon number of 6 to 14, and examples thereof include a phenyl group, a xylyl group, a toluoyl group, a cumenyl group, a naphthyl group and an anthracenyl group.

The aryl group AR is preferably a phenyl group or a naphthyl group.

Specific examples of the repeating unit represented by formula (A1) are set forth below, but the present invention is not limited thereto.

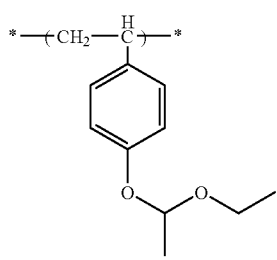
(H-1)

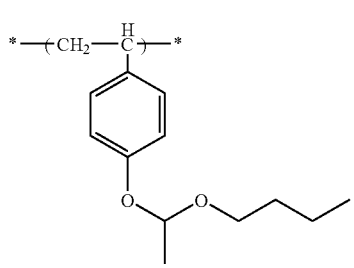
(H-2)

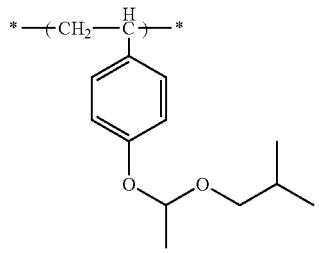
(H-3)

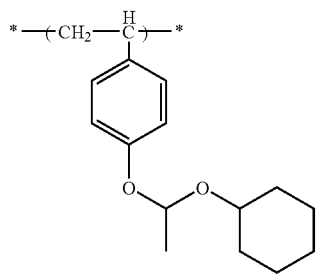
(H-4)

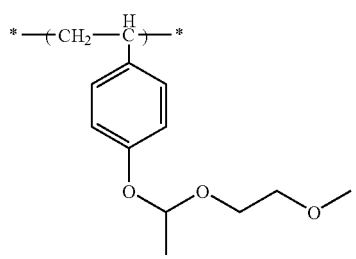
(H-5)

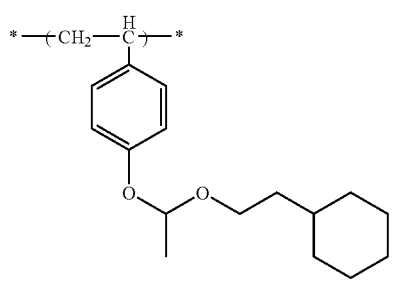
(H-6)

(H-7)

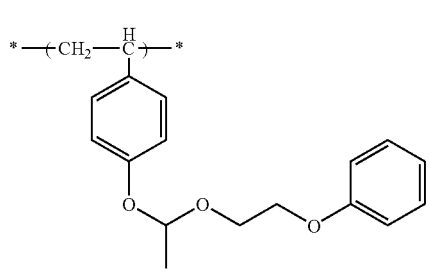
(H-8)

(H-9)
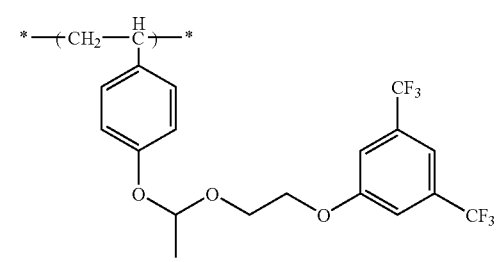
(H-10)
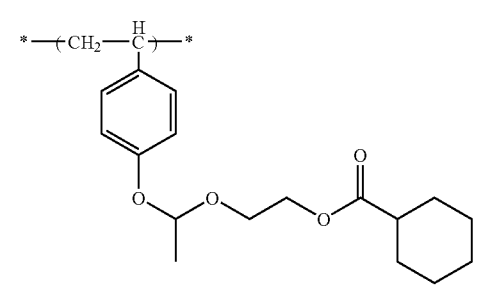
(H-11)
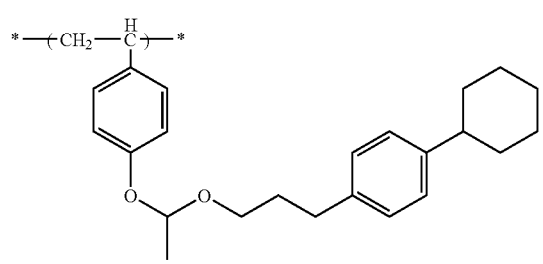
(H-12)
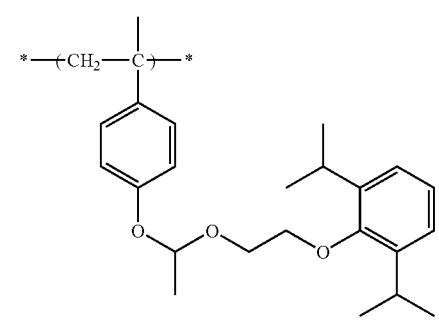
(H-13)
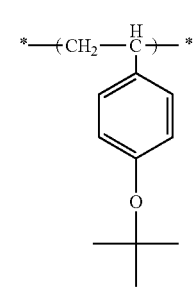
(H-16)
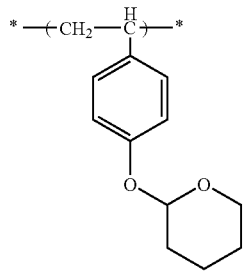
(H-17)
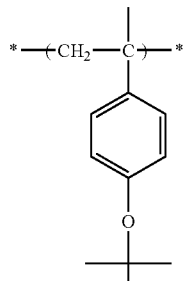
(H-18)
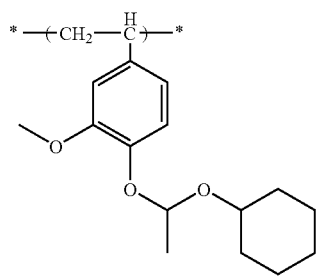
(H-19)
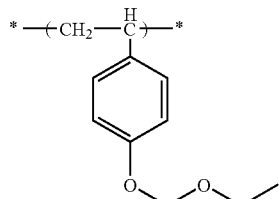
(H-20)
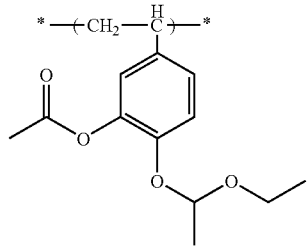
(H-21)
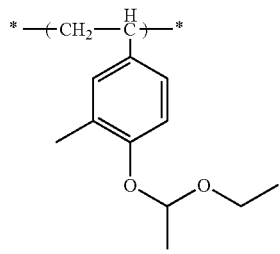

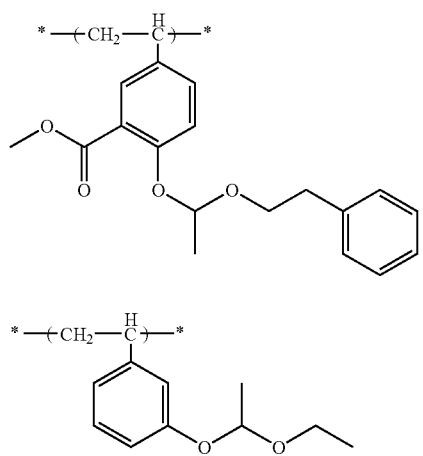
Specific examples of the repeating unit represented by formula (A2) are set forth below, but the present invention is not limited thereto.
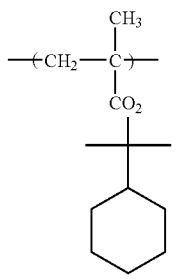
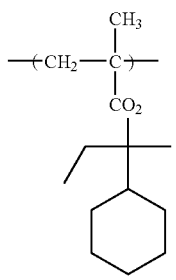
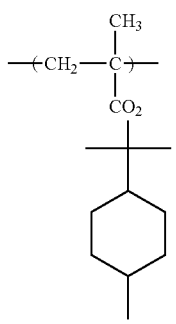
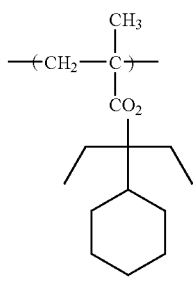
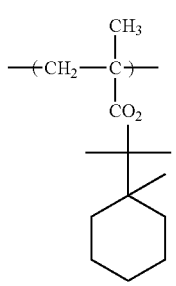

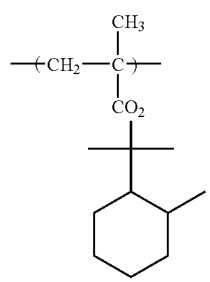
(I-11)
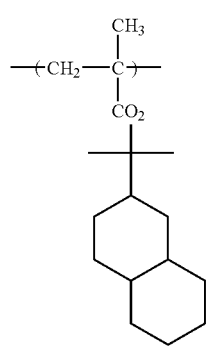
(I-12)
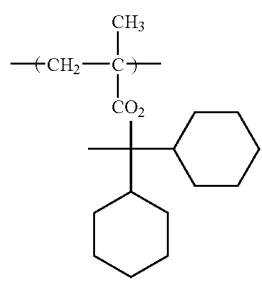
(I-13)
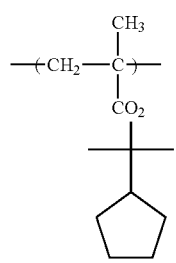
(I-14)
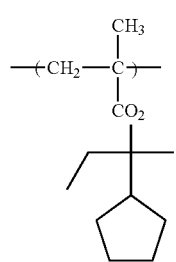
(I-15)
(I-16)
(I-17)
(I-18)
(I-19)
(I-20)

(I-21) 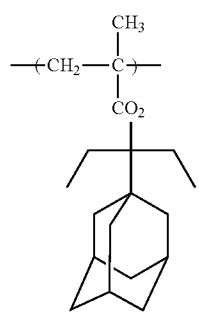
(I-22) 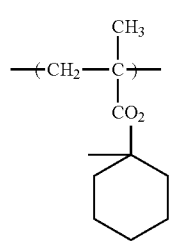
(I-23) 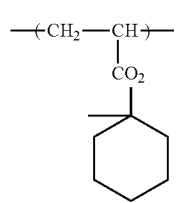
(I-24) 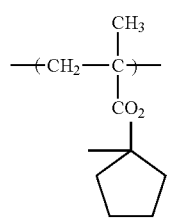
(I-25) 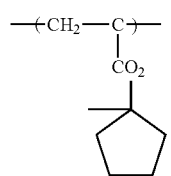
(I-26) 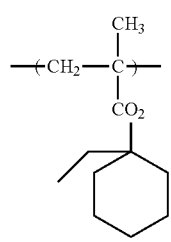
(I-27) 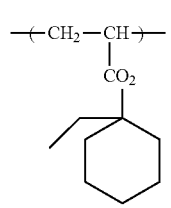
(I-28) 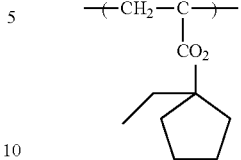
(I-29) 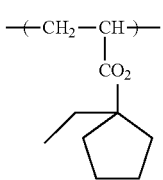
(I-30) 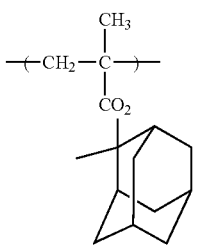
(I-31) 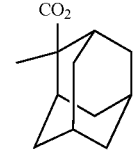
(I-32) 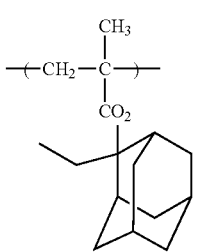
(I-33) 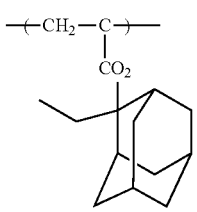
(I-34) 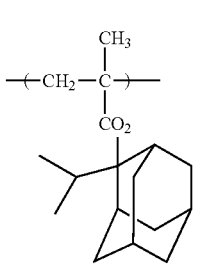

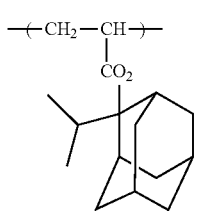
(I-35)

Formula (A2) may be a repeating unit represented by the following formula (A3):

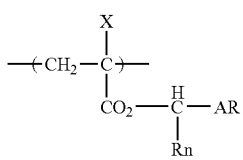
(A3)

In formula (A3), AR represents an aryl group and is preferably a phenyl group or a naphthyl group, more preferably benzene or p-methylbenzene.

Rn represents an alkyl group, a cycloalkyl group or an aryl group.

Rn and AR may combine together to form a ring.

X represents a hydrogen atom, an alkyl group, a cycloalkyl group, a halogen atom, a cyano group or an alkyloxycarbonyl group and is preferably a hydrogen atom or a methyl group.

The alkyl or cycloalkyl group of Rn is preferably an alkyl or cycloalkyl group having a carbon number of 20 to less, and examples thereof include a methyl group, an ethyl group, a propyl group, an isopropyl group, an n-butyl group, an isobutyl group, a tert-butyl group, a pentyl group, a cyclopentyl group, a hexyl group, a cyclohexyl group, an octyl group and a dodecyl group. These groups each may have a substituent, and preferred examples of the substituent which these groups each may have include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue, where the carbon number is preferably 8 or less. Among these, more preferred are an alkoxy group, a hydroxyl group, a halogen atom, a nitro group, an acyl group, an acyloxy group, an acylamino group and a sulfonylamino group.

The aryl group of Rn is preferably an aryl group having a carbon number of 6 to 14, and examples thereof include a phenyl group, a xylyl group, a toluoyl group, a cumenyl group, a naphthyl group and an anthracenyl group.

The alkyl or cycloalkyl group of X is preferably an alkyl or cycloalkyl group having a carbon number of 20 or less, and examples thereof include a methyl group, an ethyl group, a propyl group, an isopropyl group, an n-butyl group, an isobutyl group, a tert-butyl group, a pentyl group, a cyclopentyl group, a hexyl group, a cyclohexyl group, an octyl group and a dodecyl group. These groups each may have a substituent, and preferred examples of the substituent which these groups each may have include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as pyrrolidone residue, where the carbon number is preferably 8 or less. Among these, preferred are a $CF_3$ group, an alkyloxycarbonylmethyl group, an alkylcarbonyloxymethyl group, a hydroxymethyl group and an alkoxymethyl group.

The halogen atom in X includes a fluorine atom, a chlorine atom, a bromine atom and an iodine atom and is preferably a fluorine atom.

Examples of the alkyl contained in the alkyloxycarbonyl group of X are the same as those of the alkyl group of X above.

Specific examples of the repeating unit represented by formula (A3) are set forth below, but the present invention is not limited thereto.

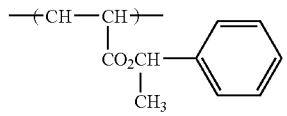

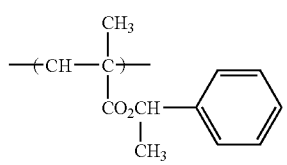

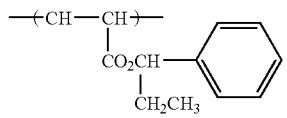

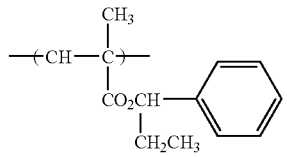

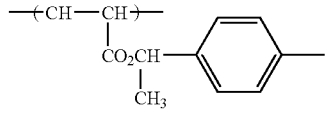

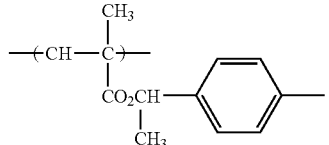

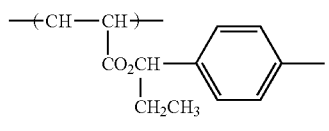

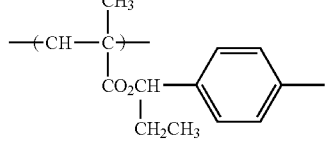

The component (B) may further contain a repeating unit represented by the following formula (A4):

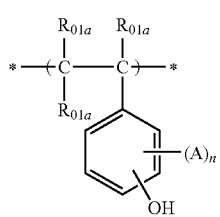

In formula (A4), each $R_{01a}$ independently represents a hydrogen atom, an alkyl group, a cycloalkyl group, a halogen atom, a cyano group or an alkoxycarbonyl group.

A represents a halogen atom, a cyano group, an acyl group, an alkyl group, an alkoxy group, an acyloxy group or an alkoxycarbonyl group.

n represents an integer of 0 to 4.

Each $R_{01a}$ in formula (A4) independently represents a hydrogen atom, an alkyl group, a cycloalkyl group, a halogen atom, a cyano group or an alkoxycarbonyl group and preferably has a carbon number of 20 or less.

The alkyl or cycloalkyl group in $R_{01a}$ is preferably an alkyl or cycloalkyl group having a carbon number of 20 or less, and examples thereof include a methyl group, an ethyl group, a propyl group, an isopropyl group, an n-butyl group, an isobutyl group, a tert-butyl group, a pentyl group, a cyclopentyl group, a hexyl group, a cyclohexyl group, an octyl group and a dodecyl group. These groups each may have a substituent, and examples of the substituent include an alkoxy group, an alkoxycarbonyl group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue, where the carbon number is preferably 8 or less. Among these, more preferred as the alkyl group in $R_{01a}$ are a methyl group, a $CF_3$ group, an alkoxycarbonylmethyl group, an alkylcarbonyloxymethyl group, a hydroxymethyl group and an alkoxymethyl group.

The halogen atom in $R_{01a}$ includes a fluorine atom, a chlorine atom, a bromine atom and an iodine atom and is preferably a fluorine atom.

As for the alkyl group contained in the alkoxycarbonyl group of $R_{01a}$, the same as those described above for the alkyl group of $R_{01a}$ are preferred.

The acyl group as A is preferably an acyl group having a carbon number of 2 to 8, and specific preferred examples thereof include a formyl group, an acetyl group, a propanoyl group, a butanoyl group, a pivaloyl group and a benzoyl group.

The alkyl group as A is preferably an alkyl group having a carbon number of 1 to 8, and specific preferred examples thereof include a methyl group, an ethyl group, a propyl group, an n-butyl group, a sec-butyl group, a hexyl group and an octyl group.

The alkoxy group as A is preferably the above-described alkoxy group having a carbon number of 1 to 8, and examples thereof include a methoxy group, an ethoxy group, a propoxy group, a butoxy group, a pentyloxy group, a hexyloxy group and a cyclohexyloxy group.

The acyl group in the acyloxy group of A includes groups corresponding to the above-described acyl group.

The alkoxy group in the alkoxycarbonyl group as A includes groups corresponding to the above-described alkoxy group.

These groups each may have a substituent, and preferred examples of the substituent include a hydroxyl group, a carboxyl group, a halogen atom (fluorine, chlorine, bromine, iodine) and an alkoxy group (e.g., methoxy, ethoxy, propoxy, butoxy). As for the cyclic structure, examples of the substituent further include an alkyl group (preferably having a carbon number of 1 to 8).

n is preferably an integer of 0 to 2, more preferably 0 or 1.

Specific examples of the repeating unit represented by formula (A4) are set forth below, but the present invention is not limited thereto.

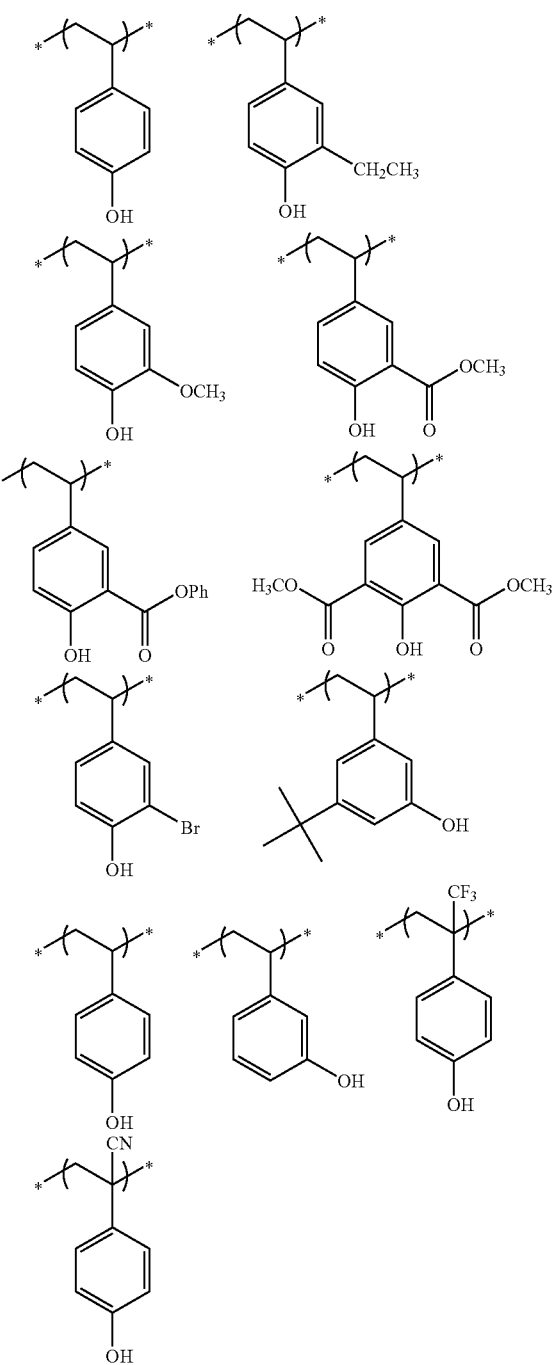

The component (B) preferably further contains a repeating unit incapable of decomposing by the action of an acid.

Examples of the (meth)acrylic acid-based repeating unit incapable of decomposing by the action of an acid are set forth below, but the present invention is not limited thereto.

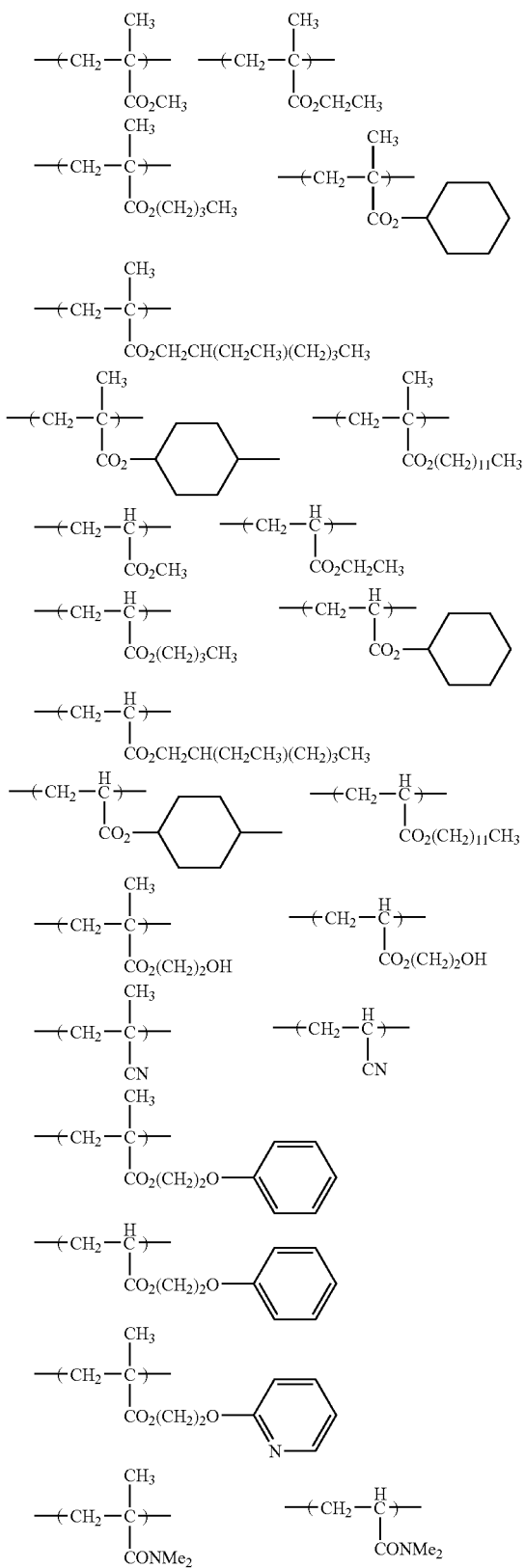

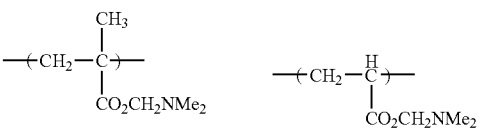

The styrene-based repeating unit incapable of decomposing by the action of an acid includes a repeating unit represented by the following formula (A5):

(A5)

In formula (A5), $R_2$ represents a hydrogen atom, a methyl group, a cyano group, a halogen atom or a perfluoro group (preferably having a carbon number of 1 to 4).

$R_3$ represents a hydrogen atom, an alkyl group, a cycloalkyl group, a halogen atom, an aryl group, an alkoxy group or an acyl group.

n represents an integer of 0 to 4.

W represents a group incapable of decomposing by the action of an acid.

W represents a group incapable of decomposing by the action of an acid (sometimes referred to as an "acid-stable group"), and specific examples thereof include a hydrogen atom, a halogen atom, an alkyl group, a cycloalkyl group, an alkenyl group, an aryl group, an acyl group, an alkylamide group, an arylamidomethyl group and an arylamide group. The acid-stable group is preferably an acyl group or an alkylamide group, more preferably an acyl group, an alkylcarbonyloxy group, an alkyloxy group, a cycloalkyloxy group or an aryloxy group.

In the acid-stable group W, the alkyl group is preferably an alkyl group having a carbon number of 1 to 4, such as methyl group, ethyl group, propyl group, n-butyl group, sec-butyl group or tert-butyl group; the cycloalkyl group is preferably a cycloalkyl group having a carbon number of 3 to 10, such as cyclopropyl group, cyclobutyl group, cyclohexyl group or adamantyl group; the alkenyl group is preferably an alkenyl group having a carbon number of 2 to 4, such as vinyl group, propenyl group, allyl group or butenyl group; the alkenyl group is preferably an alkenyl group having a carbon number of 2 to 4, such as vinyl group, propenyl group, allyl group or butenyl group; and the aryl group is preferably an aryl group having a carbon number of 6 to 14, such as phenyl group, xylyl group, toluoyl group, cumenyl group, naphthyl group or anthracenyl group. W may be present at any position on the benzene ring but is preferably present at the meta-position or para-position, more preferably at the para-position, of the styrene skeleton.

Specific examples of the repeating unit represented by formula (A5) are set forth below, but the present invention is not limited thereto.

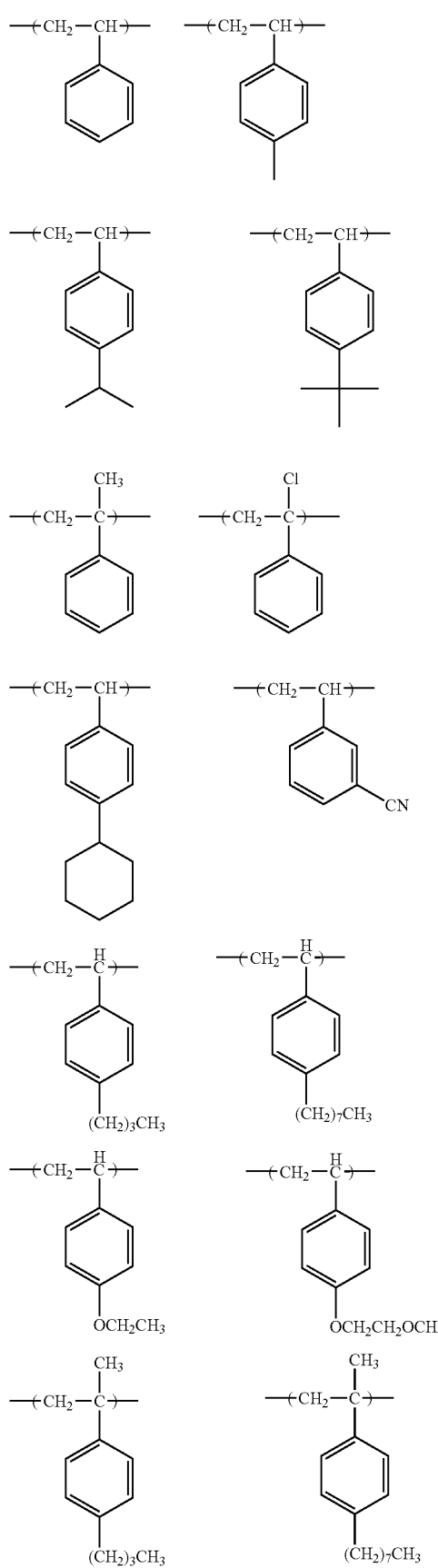
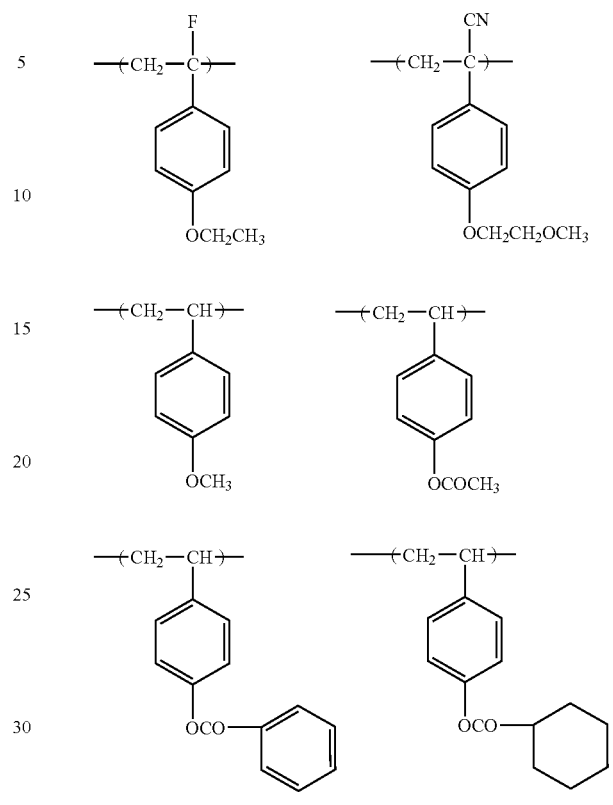
Specific examples of the component (B) for use in the present invention are set forth below, but the present invention is not limited thereto.
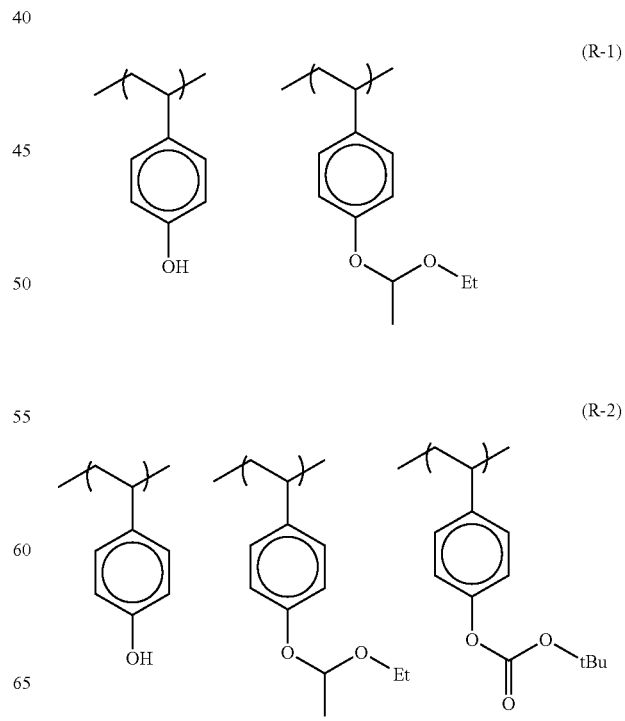

(R-3)
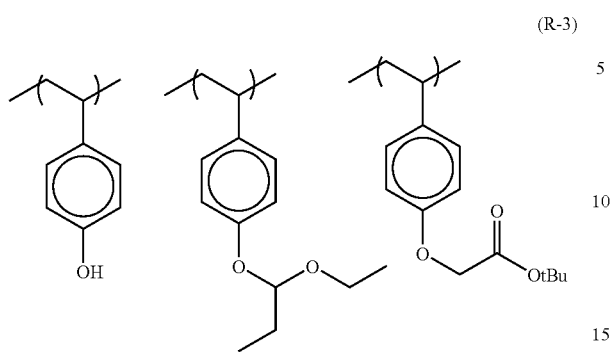
(R-4)
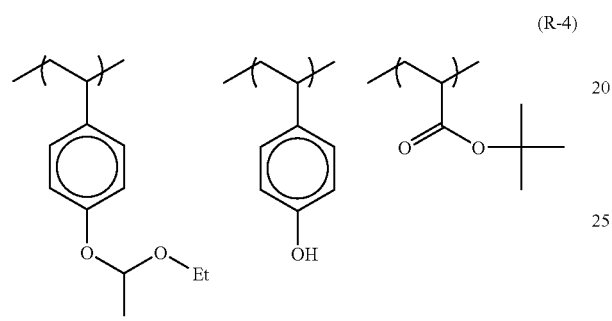
(R-5)
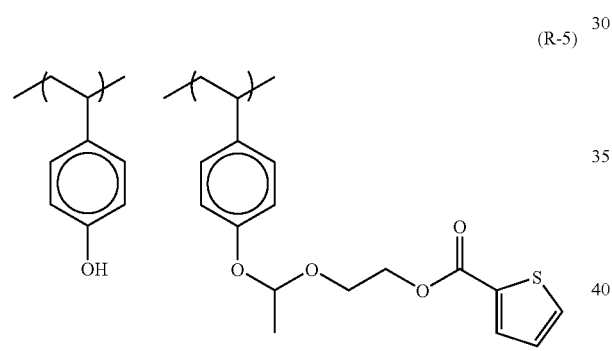
(R-6)
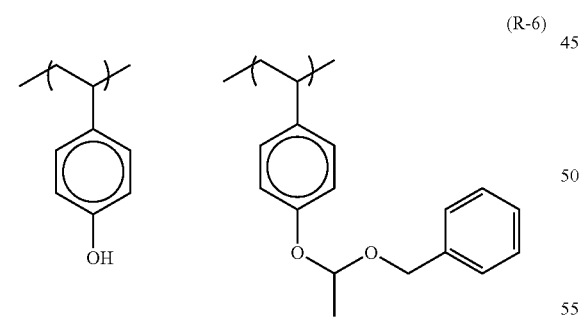
(R-7)
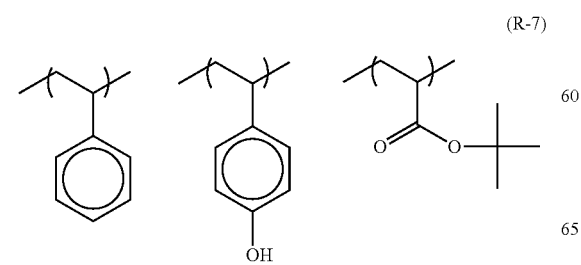
(R-8)
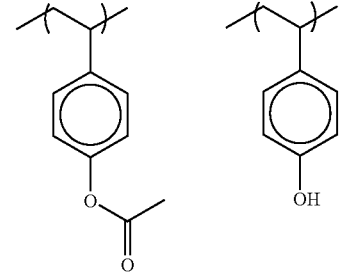
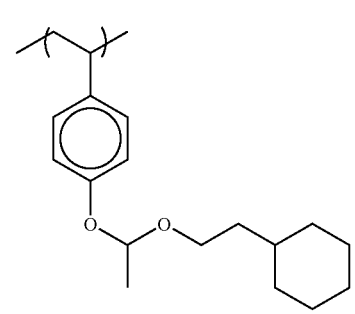
(R-9)
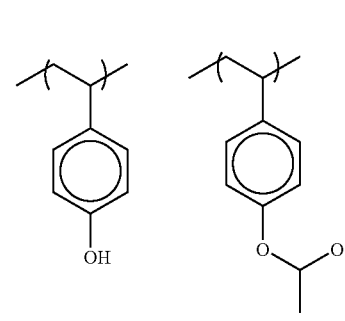
(R-10)
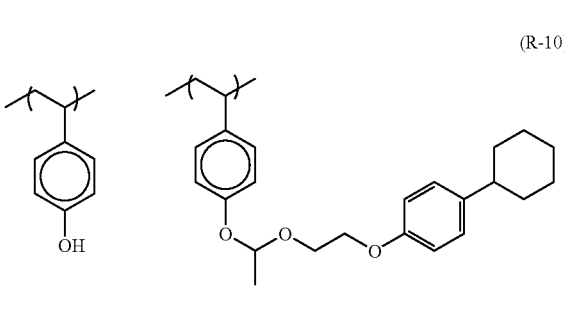
(R-11)

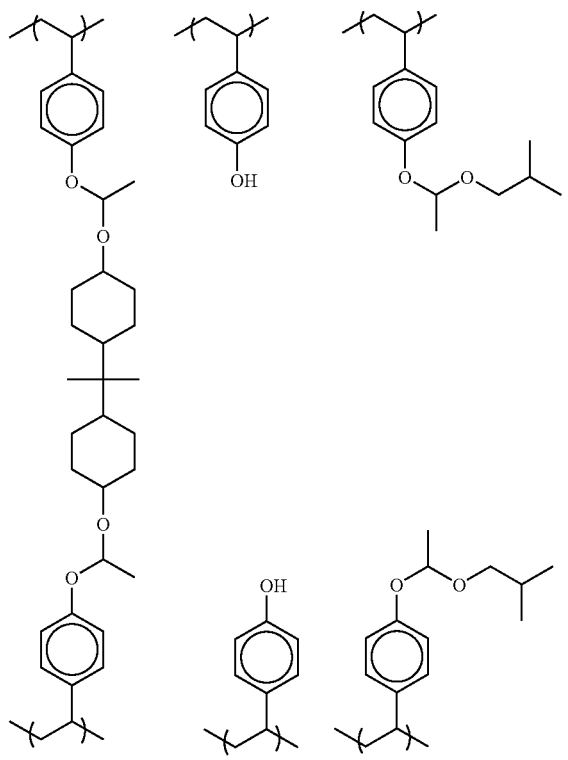
(R-12)
(R-13)
(R-14)
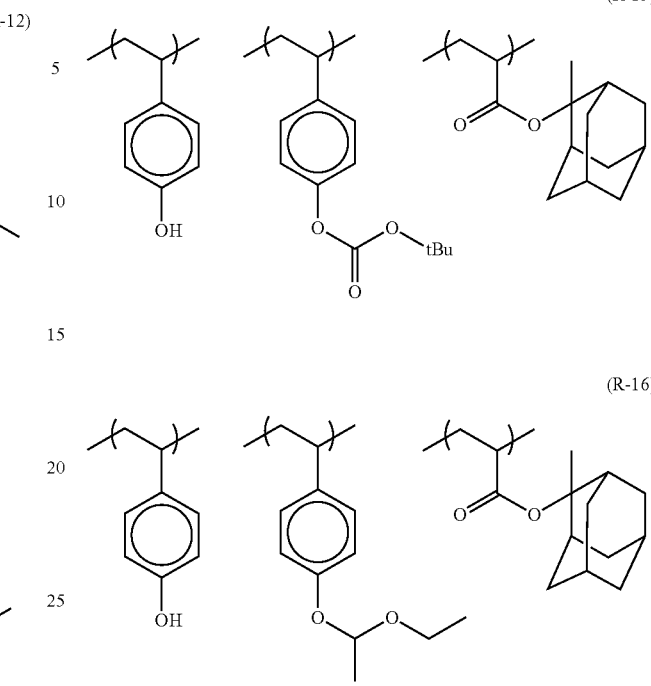
(R-15)
(R-16)
(R-17)
(R-18)
(R-19)

-continued

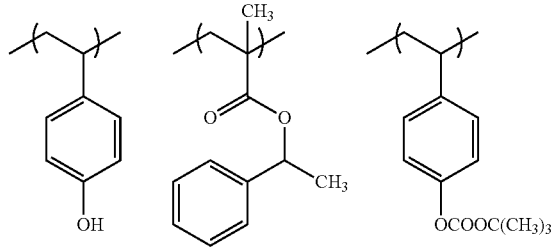

(R-20)

In specific examples above, tBu indicates a tert-butyl group.

The content of the group capable of decomposing by the action of an acid is expressed by B/(B+S) using the number (B) of groups capable of decomposing by the action of an acid and the number (S) of alkali-soluble groups not protected by a group capable of leaving by the action of an acid, in the resin. The content is preferably from 0.01 to 0.7, more preferably from 0.05 to 0.50, still more preferably from 0.05 to 0.40.

In the component (B), the content of the repeating unit represented by formula (A1) is preferably from 10 to 40 mol %, more preferably from 15 to 35 mol %.

In the component (B), the content of the repeating unit represented by formula (A2) is preferably from 10 to 40 mol %, more preferably from 15 to 35 mol %.

In the component (B), the content of the repeating unit represented by formula (A4) is preferably from 40 to 90 mol %, more preferably from 50 to 85 mol %.

In the component (B), the content of the repeating unit incapable of decomposing by the action of an acid is preferably from 5 to 30 mol %, more preferably from 10 to 25 mol %.

The component (B) can be obtained by reacting a precursor of a group capable of decomposing by the action of an acid with an alkali-soluble resin or copolymerizing an alkali-soluble resin monomer bonded by a group capable of decomposing by the action of an acid with various monomers, and this is disclosed in European Patent 254853, JP-A-2-25850, JP-A-3-223860 and JP-A-4-251259.

In the case where the component (B) is a resin, the weight average molecular weight (Mw) of the component (B) is preferably from 2,000 to 200,000, more preferably from 5,000 to 100,000, still more preferably from 8,000 to 50,000.

The polydispersity (Mw/Mn) is preferably from 1.0 to 4.0, more preferably from 1.0 to 2.0, still more preferably from 1.0 to 1.6.

The weight average molecular weight here is defined as a polystyrene-reduced value determined by gel permeation chromatography.

Two or more kinds of compounds may be used in combination as the component (B).

The amount added of the component (B) is suitably from 80 to 98 wt %, preferably from 85 to 96 wt %, based on the solid content of the positive resist composition.

Alkali-Soluble Compound:

The resist composition of the present invention can be used also for a negative resist by using (D) an alkali-soluble compound in place of (B) a resin capable of increasing the solubility in an alkali developer by the action of an acid.

The alkali-soluble compound is preferably an alkali-soluble resin.

The alkali dissolution rate of the alkali-soluble resin is preferably 20 Å/sec or more, more preferably 200 Å/sec or more, as measured (at 23° C.) in 0.261N tetramethylammonium hydroxide (TMAH).

Examples of the alkali-soluble resin include, but are not limited to, a novolak resin, a hydrogenated novolak resin, an acetone-pyrogallol resin, an o-polyhydroxystyrene, an m-polyhydroxystyrene, a p-polyhydroxystyrene, a hydrogenated polyhydroxystyrene, a halogen- or alkyl-substituted polyhydroxystyrene, a hydroxystyrene-N-substituted maleimide copolymer, an o/p- or m/p-hydroxystyrene copolymer, a polyhydroxystyrene with the hydroxyl group being partially O-alkylated (for example, O-methylated, O-(1-methoxy)ethylated, O-(1-ethoxy)ethylated, O-2-tetrahydropyranylated or O-(tert-butoxycarbonyl)methylated in a ratio of 5 to 30 mol %) or O-acylated (for example, O-acetylated or O-(tert-butoxy)carbonylated in a ratio of 5 to 30 mol %), a styrene-maleic anhydride copolymer, a styrene-hydroxystyrene copolymer, an α-methylstyrene-hydroxystyrene copolymer, a carboxy group-containing methacrylic resin and a derivative thereof, and a polyvinyl alcohol derivative.

Among these alkali-soluble resins, preferred are a novolak resin, an o-polyhydroxystyrene, an m-polyhydroxystyrene, a p-polyhydroxystyrene, a copolymer thereof, an alkyl-substituted polyhydroxystyrene, a partially O-alkylated or O-acylated polyhydroxystyrene, a styrene-hydroxystyrene copolymer, and an α-methylstyrene-hydroxystyrene copolymer.

The above-described novolak resin can be obtained by subjecting a predetermined monomer as the main component to addition condensation with aldehydes in the presence of an acidic catalyst.

The weight average molecular weight of the alkali-soluble resin is 2,000 or more, preferably from 5,000 to 200,000, more preferably from 5,000 to 100,000.

The weight average molecular weight here is defined as a polystyrene-reduced value determined by gel permeation chromatography.

Two or more kinds of alkali-soluble resins may be used in combination.

The amount of the alkali-soluble compound used is from 40 to 97 mass %, preferably from 60 to 90 mass %, based on the solid content of the entire resist composition.

Acid-Crosslinking Agent Capable of Crosslinking the Alkali-Soluble Compound by the Action of an Acid In the case of using the resist composition of the present invention for a negative resist, an acid-crosslinking agent capable of crosslinking an alkali-soluble compound by the action of an acid is used.

As for the acid-crosslinking agent, any compound may be used as long as it can crosslink the alkali-soluble compound by the action of an acid, but the following (1) to (3) are preferred:

(1) a hydroxymethyl, alkoxymethyl or acyloxymethyl form of a phenol derivative, (2) a compound having an N-hydroxymethyl group, an N-alkoxymethyl group or an N-acyloxymethyl group, and (3) a compound having an epoxy group.

The carbon number of the alkoxymethyl group is preferably 6 or less, and the carbon number of the acyloxymethyl group is preferably 6 or less.

Among these acid-crosslinking agents, particularly preferred compounds are set forth below.

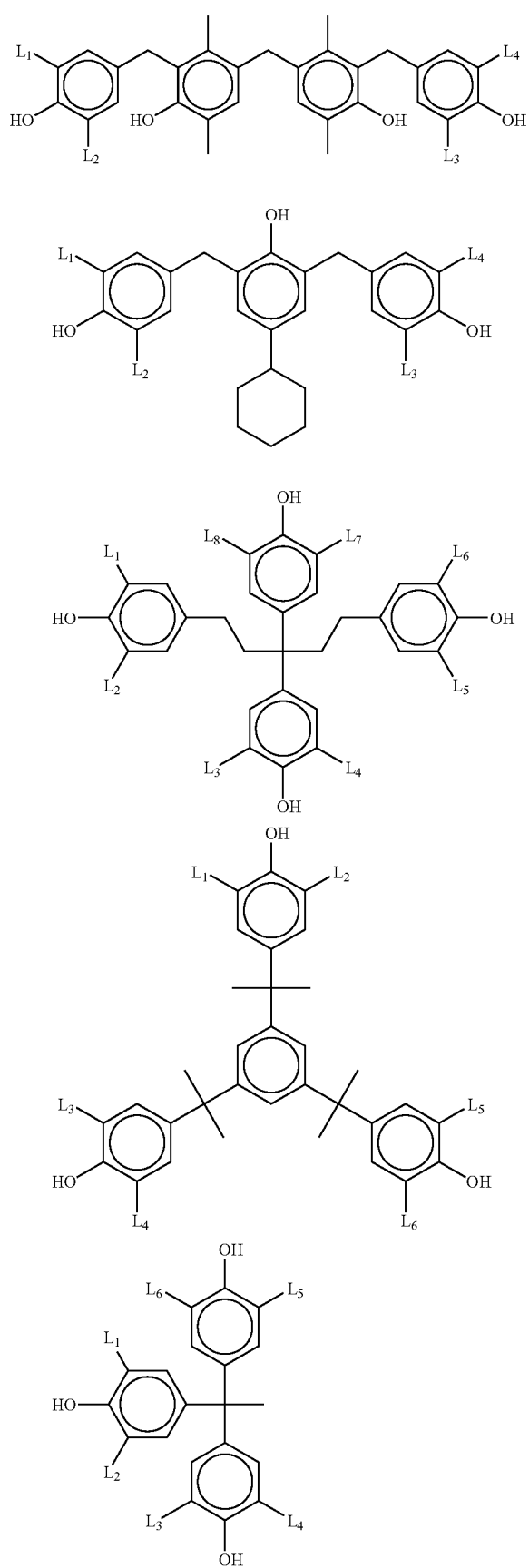

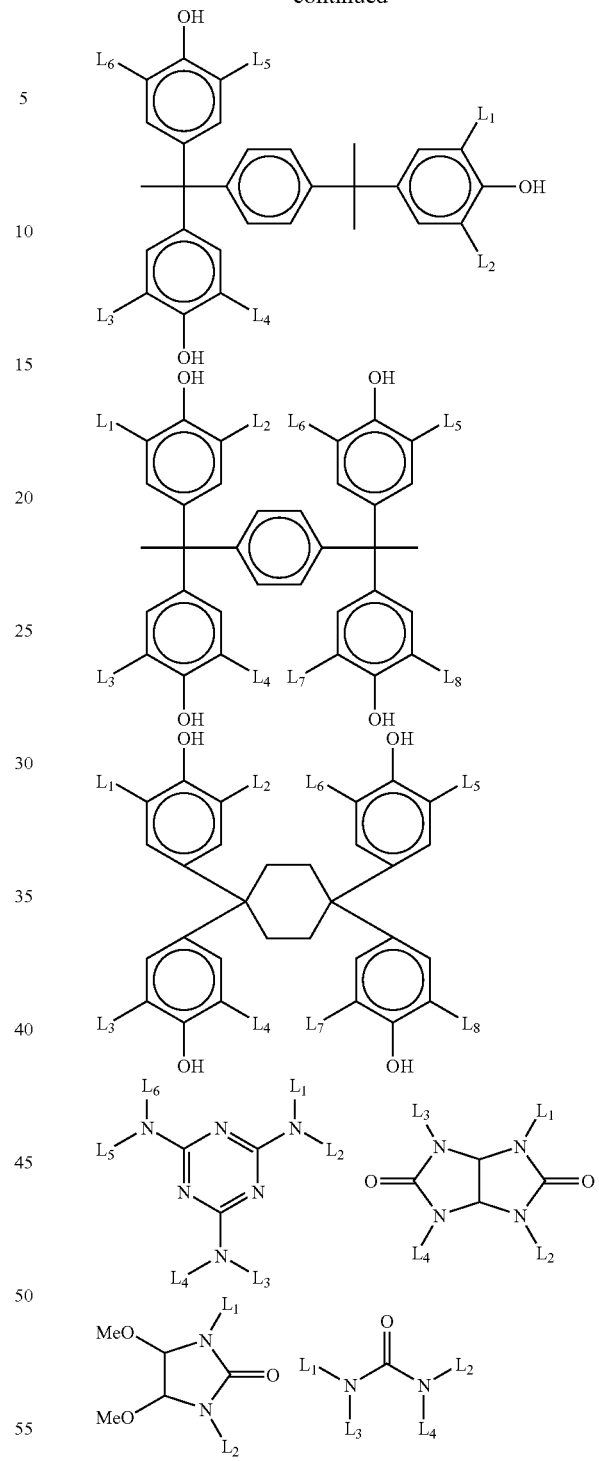

In the formulae, each of $L_1$ to $L_8$, which may be the same or different, represents a hydrogen atom, a hydroxymethyl group, a methoxymethyl group, an ethoxymethyl group or an alkyl group having a carbon number of 1 to 6.

The acid-crosslinking agent is usually added in an amount of 3 to 70 mass %, preferably from 5 to 50 mass %, based on the solid content of the negative resist composition.

Organic Basic Compound:

The organic basic compound contained in the resist composition of the present invention is preferably a compound having basicity stronger than that of phenol. The molecular weight of the organic basic compound is usually from 100 to 900, preferably from 150 to 800, more preferably from 200 to 700. In particular, a nitrogen-containing basic compound is preferred.

Preferred organic basic compounds are, in terms of preferred chemical environment, compounds having a structure of the following formulae (A) to (E). The structure of formulae (B) to (E) may be a part of a ring structure.

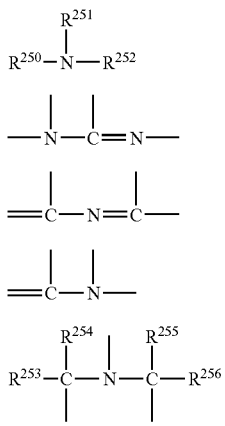

In the formulae above, each of $R^{250}$, $R^{251}$ and $R^{252}$, which may be the same or different, represents a hydrogen atom, an alkyl group (preferably having a carbon number of 1 to 20), a cycloalkyl group (preferably having a carbon number of 3 to 20), or an aryl group (preferably having a carbon number of 6 to 20), and $R^{251}$ and $R^{252}$ may combine together to form a ring.

The alkyl group may be unsubstituted or may have a substituent, and the alkyl group having a substituent is preferably an aminoalkyl group having a carbon number of 1 to 6, or a hydroxyalkyl group having a carbon number of 1 to 6.

Each of $R^{253}$, $R^{254}$, $R^{255}$ and $R^{256}$, which may be the same or different, represents an alkyl group having a carbon number of 1 to 6.

The compound is more preferably a nitrogen-containing basic compound having two or more nitrogen atoms differing in the chemical environment within one molecule, still more preferably a compound containing both a substituted or unsubstituted amino group and a nitrogen-containing ring structure, or a compound having an alkylamino group.

The organic basic compound may also be at least one kind of a nitrogen-containing compound selected from an amine compound having a phenoxy group, an ammonium salt compound having a phenoxy group, an amine compound having a sulfonic acid ester group, and an ammonium salt compound having a sulfonic acid ester group.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred. Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are an amine compound or ammonium salt compound having a phenoxy group at the terminal opposite the nitrogen atom of the alkyl group of the amine compound or ammonium salt compound. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6.

Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

The sulfonic acid ester group in the amine compound having a sulfonic acid ester group and the ammonium salt compound having a sulfonic acid ester group may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

Specific preferred examples of the organic basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. These compounds each may have a substituent, and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

A tetraalkylammonium salt-type nitrogen-containing basic compound can also be used. Among these compounds, a tetraalkylammonium hydroxide having a carbon number of 1 to 8 (e.g., tetramethylammonium hydroxide, tetraethylammonium hydroxide, tetra-(n-butyl)ammonium hydroxide) is preferred. One of these nitrogen-containing basic compounds is used alone, or two or more thereof are used in combination.

The ratio between the acid generator and the organic basic compound used in the composition is preferably acid generator/organic basic compound (by mol)=from 1.0 to 300. That is, the molar ratio is preferably 1.0 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 1.5 to 200, still more preferably from 2.0 to 150.

Surfactant:

The resist composition of the present invention preferably further contains any one of fluorine-containing and/or silicon-containing surfactants (a fluorine-containing surfactant, a silicon-containing surfactant and a surfactant containing both a fluorine atom and a silicon atom), or two or more thereof.

By incorporating a fluorine- and/or silicon-containing surfactant into the resist composition of the present invention, a resist pattern with good sensitivity, resolution and adherence as well as less development defects can be obtained when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430 and 431 (produced by Sumitomo 3M Inc.); Megaface F171, F173, F176, F189 and R08 (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene))acrylate (or methacrylate), a copolymer of a $C_6F_{13}$ group-containing acrylate (or methacrylate) with a (poly(oxyethylene))acrylate (or methacrylate) and a (poly(oxypropylene))acrylate (or methacrylate), a copolymer of a $C_8F_{17}$ group-containing acrylate (or methacrylate) with a (poly(oxyalkylene))acrylate (or methacrylate), and a copolymer of a $C_8F_{17}$ group-containing acrylate (or methacrylate) with a (poly(oxyethylene))acrylate (or methacrylate) and a (poly(oxypropylene))acrylate (or methacrylate).

The preferred surfactant includes a surfactant represented by the following formula (Da):

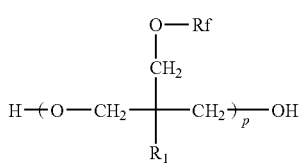

In formula (Da), Rf represents a fluoroalkyl group.

$R_1$ represents a hydrogen atom or an alkyl group.

p represents an integer of 1 to 30.

In formula (Da), the fluoroalkyl group of Rf is preferably a fluoroalkyl group having a carbon number of 1 to 10. In the fluoroalkyl group, all hydrogen atoms may be substituted by a fluorine atom, or a part of hydrogen atoms may be substituted by a fluorine atom. The fluoroalkyl group may have an oxy group midway in the alkyl group. Examples of the fluoroalkyl group of Rf include —$CF_3$, —$C_2F_5$, —$C_3F_7$, —$C_4F_9$, —$CH_2CF_3$, —$CH_2C_2F_5$, —$CH_2C_3F_7$, —$CH_2C_4F_9$, —$CH_2C_6F_{13}$, —$C_2H_4CF_3$, —$C_2H_4C_2F_5$, —$C_2H_4C_4F_9$, —$C_2H_4C_6F_{13}$, —$C_2H_4C_8F_{17}$, —$CH_2CH(CH_3)CF_3$, —$CH_2CH(CF_3)_2$, —$CH_2CF(CF_3)_2$, —$CH_2CH(CF_3)_2$, —$CF_2CF(CF_3)OCF_3$, —$CF_2CF(CF_3)OC_3F_7$, —$C_2H_4OCF_2CF(CF_3)OCF_3$, —$C_2H_4OCF_2CF(CF_3)OC_3F_7$ and —$C(CF_3)=C(CF(CF_3)_2)_2$.

The alkyl group of $R_1$ is preferably a linear alkyl group having a carbon number of 1 to 5.

Specific examples of the surfactant represented by formula (Da) are set forth below, but the present invention is not limited thereto.

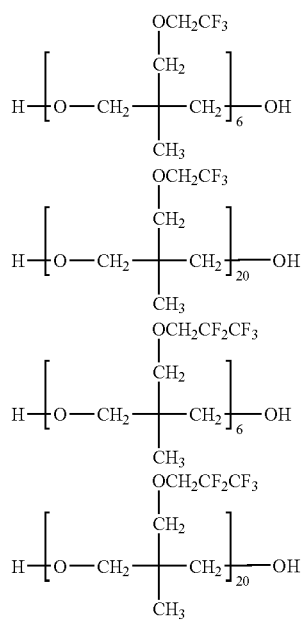

The amount added of the surfactant is preferably from 0.0001 to 2 mass %, more preferably from 0.001 to 1 mass %, based on the entire amount (excluding the solvent) of the resist composition.

Compound having a proton acceptor functional group and undergoing decomposition upon irradiation with an actinic ray or radiation to generate a compound reduced in or deprived of the proton acceptor property or changed to be acidic from being proton acceptor-functioning:

The resist composition of the present invention preferably contains a compound having a proton acceptor functional group and undergoing decomposition upon irradiation with an actinic ray or radiation to generate a compound reduced in or deprived of the proton acceptor property or changed to be acidic from being proton acceptor-functioning (hereinafter sometimes referred to as a "compound (PA)").

The compound reduced in or deprived of the proton acceptor property or changed to be acidic from being proton acceptor-functioning, which is generated resulting from decomposition of the compound (PA) upon irradiation with an actinic ray or radiation, includes a compound represented by the following formula (PA-I):

$$Q\text{-}A\text{-}(X)_n\text{—}B\text{—}R \qquad (PA\text{-}I)$$

In formula (PA-I), A represents a divalent linking group.

Q represents a sulfo group (—$SO_3H$) or a carboxyl group (—$CO_2H$).

X represents —$SO_2$— or —CO—.

n represents 0 or 1.

B represents a single bond, an oxygen atom or —N(Rx)-.

Rx represents a hydrogen atom or a monovalent organic group.

R represents a monovalent organic group having a proton acceptor functional group, or a monovalent organic group having an ammonium group.

The divalent linking group of A is preferably a divalent linking group having a carbon number of 2 to 12, such as alkylene group or phenylene group, more preferably an alkylene group having at least one fluorine atom, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably an alkylene group where the carbon atom bonded to the Q site has a fluorine atom, still more preferably a perfluoroalkylene group, yet still more preferably a perfluoroethylene group, a perfluoropropylene group or a perfluorobutylene group.

The monovalent organic group of Rx is preferably a monovalent organic group having a carbon number of 4 to 30, and examples thereof include an alkyl group, a cycloalkyl group, an aryl group, an aralkyl group and an alkenyl group.

The alkyl group of Rx, which may have a substituent, is preferably a linear or branched alkyl group having a carbon number of 1 to 20 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The alkyl group having a substituent includes, particularly, a group where a cycloalkyl group is substituted to a linear or branched alkyl group, such as adamantylmethyl group, adamantylethyl group, cyclohexylethyl group and camphor residue.

The cycloalkyl group of Rx, which may have a substituent, is preferably a cycloalkyl group having a carbon number of 3 to 20 and may contain an oxygen atom in the ring. Specific examples thereof include a cyclopropyl group, a cyclopentyl group, a cyclohexyl group, a norbornyl group and an adamantyl group.

The aryl group of Rx, which may have a substituent, is preferably an aryl group having a carbon number of 6 to 14, and examples thereof include a phenyl group and a naphthyl group.

The aralkyl group of Rx, which may have a substituent, is preferably an aralkyl group having a carbon number of 7 to 20, and examples thereof include a benzyl group, a phenethyl group, a naphthylmethyl group and a naphthylethyl group.

The alkenyl group of Rx, which may have a substituent, includes, for example, a group having a double bond at an arbitrary position of the alkyl group described as Rx.

The proton acceptor functional group of R is a functional group having a group or electron capable of electrostatically interacting with a proton and indicates, for example, a functional group having a macrocyclic structure such as cyclic polyether, or a functional group containing a nitrogen atom having a lone electron pair not contributing to π-conjugation. The nitrogen atom having a lone electron pair not contributing to π-conjugation is, for example, a nitrogen atom having a partial structure represented by either one of the following formulae:

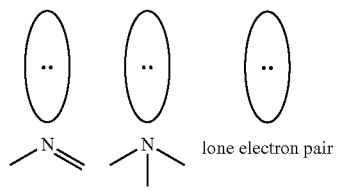

lone electron pair

Preferred examples of the partial structure of the proton acceptor functional group include a crown ether structure, an aza-crown ether structure, a tertiary amine structure, a secondary amine structure, a primary amine structure, a pyridine structure, an imidazole structure and a pyrazine structure.

Preferred examples of the partial structure of the ammonium group include a tertiary ammonium structure, a secondary ammonium structure, a primary ammonium structure, a pyridinium structure, an imidazolinium structure and a pyrazinium structure.

The group containing such a structure preferably has a carbon number of 4 to 30, and examples thereof include an alkyl group, a cycloalkyl group, an aryl group, an aralkyl group and an alkenyl group.

The alkyl group, cycloalkyl group, aryl group, aralkyl group and alkenyl group in the alkyl group, cycloalkyl group, aryl group, aralkyl group or alkenyl group as R containing a proton acceptor functional group or an ammonium group are the same as the alkyl group, cycloalkyl group, aryl group, aralkyl group and alkenyl group described for Rx.

Examples of the substituent which the above-described groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20).

As for the aminoacyl group, examples of the substituent further include one or two alkyl groups (preferably having a carbon number of 1 to 20).

When B is —N(Rx)-, R and Rx preferably combine together to form a ring. By forming a ring structure, the stability is enhanced and the composition using this compound is also increased in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4-membered ring, a 5-membered ring, a 6-membered ring, a 7-membered ring and a 8-membered ring each containing a nitrogen atom. Examples of the polycyclic structure include a structure comprising a combination of two monocyclic structures or three or more monocyclic structures. The monocyclic structure and polycyclic structure each may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). As for the cyclic structure in the aryl group, cycloalkyl group and the like, examples of the substituent further include an alkyl group (preferably having a carbon number of 1 to 15). As for the aminoacyl group, examples of the substituent further include one or two alkyl groups (preferably having a carbon number of 1 to 15).

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

Specific examples of the compound represented by formula (PA-I) are set forth below, but the present invention is not limited thereto.

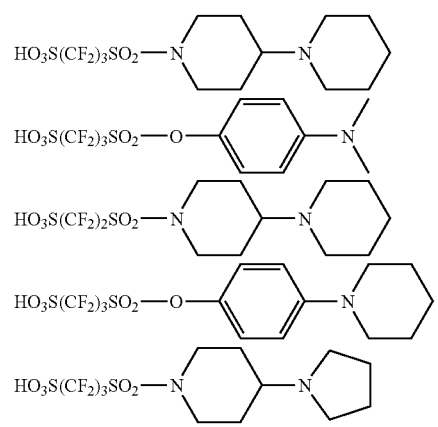

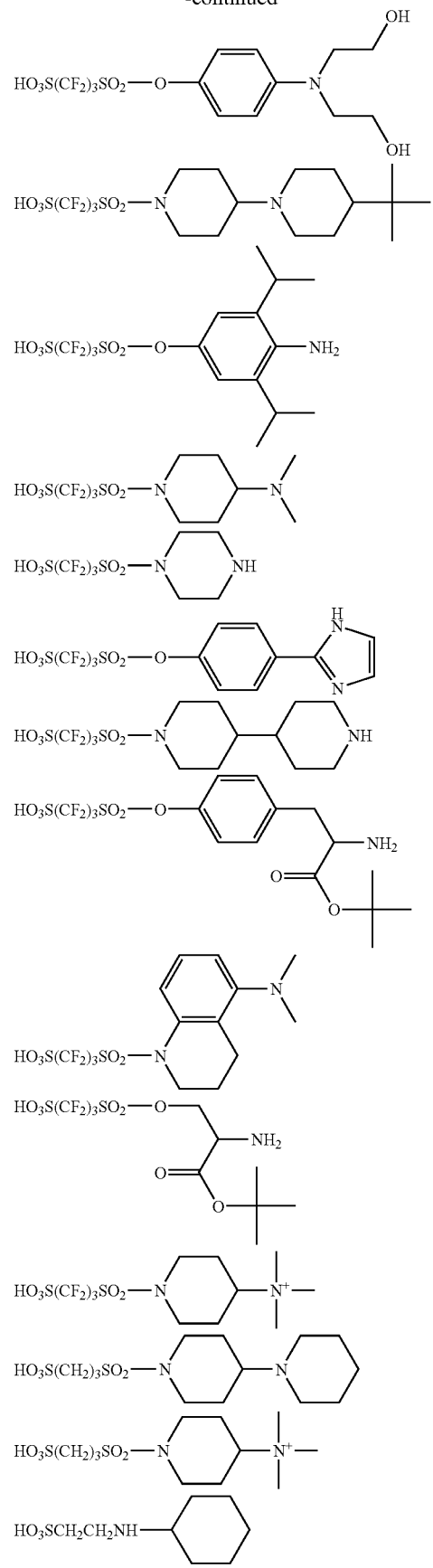

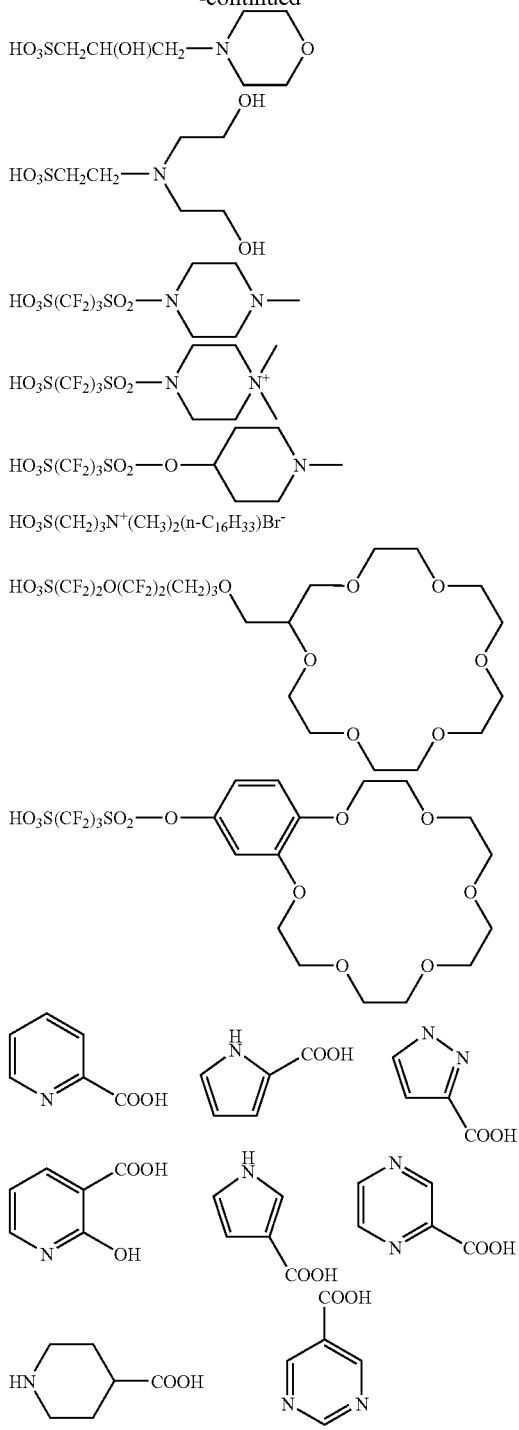

The compound reduced in or deprived of the proton acceptor property or changed to be acidic from being proton acceptor-functioning, which is generated resulting from decomposition of the compound (PA) upon irradiation with an actinic ray or radiation, also includes a compound represented by the following formula (PA-II):

$$Q_1\text{-}X_1\text{—NH—}X_2\text{-}Q_2 \qquad \text{(PA-II)}$$

In formula (PA-II), each of $Q_1$ and $Q_2$ independently represents a monovalent organic group, provided that either one of $Q_1$ and $Q_2$ has a proton acceptor functional group. $Q_1$ and $Q_2$ may combine to form a ring and the ring formed may have a proton acceptor functional group.

Each of $X_1$ and $X_2$ independently represents —CO— or —SO$_2$—.

The monovalent organic group of $Q_1$ and $Q_2$ in formula (PA-II) is preferably a monovalent organic group having a carbon number of 1 to 40, and examples thereof include an alkyl group, a cycloalkyl group, an aryl group, an aralkyl group, and an alkenyl group.

The alkyl group of $Q_1$ and $Q_2$, which may have a substituent, is preferably a linear or branched alkyl group having a carbon number of 1 to 30 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The cycloalkyl group of $Q_1$ and $Q_2$, which may have a substituent, is preferably a cycloalkyl group having a carbon number of 3 to 20 and may contain an oxygen atom or a nitrogen atom in the ring. Specific examples thereof include a cyclopropyl group, a cyclopentyl group, a cyclohexyl group, a norbornyl group and an adamantyl group.

The aryl group of $Q_1$ and $Q_2$, which may have a substituent, is preferably an aryl group having a carbon number of 6 to 14, and examples thereof include a phenyl group and a naphthyl group.

The aralkyl group of $Q_1$ and $Q_2$, which may have a substituent, is preferably an aralkyl group having a carbon number of 7 to 20, and examples thereof include a benzyl group, a phenethyl group, a naphthylmethyl group and a naphthylethyl group.

The alkenyl group of $Q_1$ and $Q_2$, which may have a substituent, includes a group having a double bond at an arbitrary position of the alkyl group above.

Examples of the substituent which these groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). As for the cyclic structure in the aryl group, cycloalkyl group and the like, examples of the substituent further include an alkyl group (preferably having a carbon number of 1 to 10). As for the aminoacyl group, examples of the substituent further include an alkyl group (preferably having a carbon number of 1 to 10). Examples of the alkyl group having a substituent include a perfluoroalkyl group such as perfluoromethyl group, perfluoroethyl group, perfluoropropyl group and perfluorobutyl group.

Either one monovalent organic group $Q_1$ or $Q_2$ has a proton acceptor functional group.

The proton acceptor functional group is a functional group having a group or lone electron pair capable of electrostatically interacting with a proton and includes, for example, a functional group having a macrocyclic structure such as cyclic polyether, and a functional group containing a nitrogen atom having a lone electron pair less contributing to π-conjugation. The nitrogen atom having a lone electron pair less contributing to π-conjugation includes, for example, a nitrogen atom having a partial structure represented by either one of the following formulae:

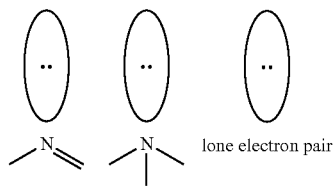

Preferred examples of the partial structure of the proton acceptor functional group include a crown ether structure, an aza-crown ether structure, a tertiary amine structure, a secondary amine structure, a primary amine structure, a pyridine structure, an imidazole structure, a pyrazine structure and an aniline structure. The group containing such a structure preferably has a carbon number of 4 to 30, and examples thereof include an alkyl group, a cycloalkyl group, an aryl group, an aralkyl group and an alkenyl group. The alkyl group, cycloalkyl group, aryl group, aralkyl group and alkenyl group are the same as those described above.

Examples of the substituent which the above-described groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include an alkyl group (preferably having a carbon number of 1 to 20).

The proton acceptor functional group may be substituted by an organic group having a bond that is breakable by an acid. Examples of the organic group having a bond breakable by an acid include an amide group, an ester group (preferably a tertiary alkyloxycarbonyl group), an acetal group (preferably a 1-alkyloxy-alkyloxy group), a carbamoyl group and a carbonate group.

When $Q_1$ and $Q_2$ combine to form a ring and the ring formed has a proton acceptor functional group, examples of the structure thereof include a structure where the organic group of $Q_1$ or $Q_2$ is further bonded by an alkylene group, an oxy group, an imino group or the like.

In formula (PA-II), at least either one of $X_1$ and $X_2$ is preferably —SO$_2$—.

The compound represented by formula (PA-II) is preferably a compound represented by the following formula (PA-III):

$$Q_1\text{-}X_1\text{—NH—}X_2\text{-A-}(X_3)_n\text{—B-}Q_3 \qquad \text{(PA-III)}$$

In formula (PA-III), each of $Q_1$ and $Q_3$ independently represents a monovalent organic group, provided that either one of $Q_1$ and $Q_3$ has a proton acceptor functional group. $Q_1$ and $Q_3$ may combine to form a ring and the ring formed may have a proton acceptor functional group.

Each of $X_1$, $X_2$ and $X_3$ independently represents —CO— or —SO$_2$—.

A represents a divalent linking group.

B represents a single bond, an oxygen atom or —N(Qx)-.

Qx represents a hydrogen atom or a monovalent organic group.

When B is —N(Qx)-, $Q_3$ and Qx may combine to form a ring.

n represents 0 or 1.

$Q_1$ has the same meaning as $Q_1$ in formula (PA-II).

Examples of the organic group of $Q_3$ are the same as those of the organic group of $Q_1$ and $Q_2$ in formula (PA-II).

The divalent linking group of A is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably a perfluoroalkylene group, still more preferably a perfluoroethylene group, a perfluoropropylene group or a perfluorobutylene group.

The monovalent organic group of Qx is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those described above.

In formula (PA-III), each of $X_1$, $X_2$ and $X_3$ is preferably —$SO_2$—.

Specific examples of the compound represented by formula (PA-II) are set forth below, but the present invention is not limited thereto.

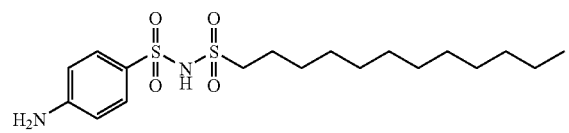

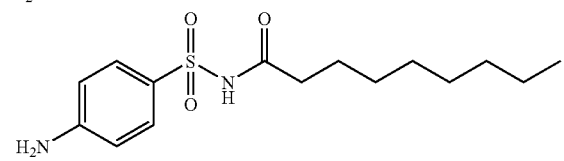

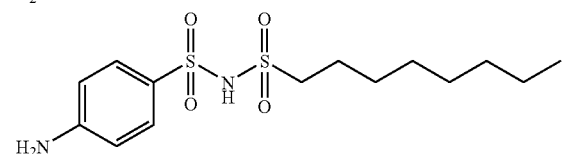

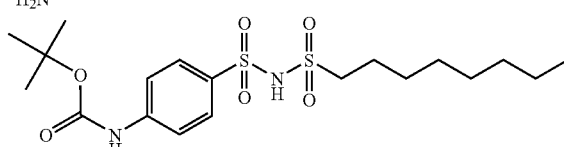

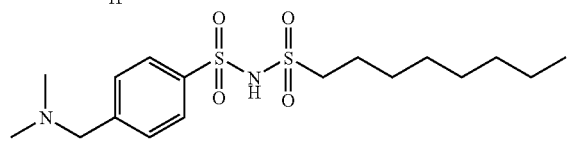

-continued

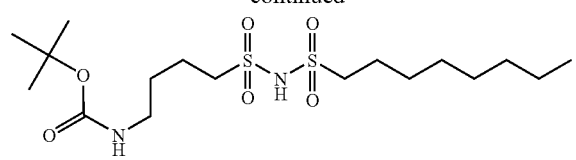

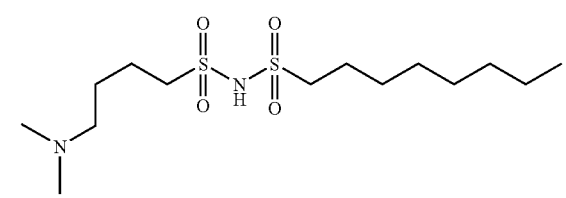

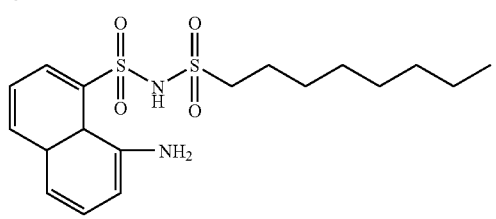

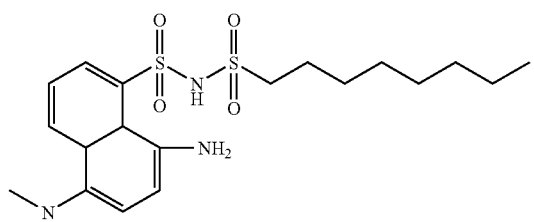

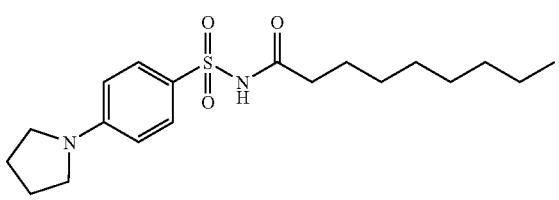

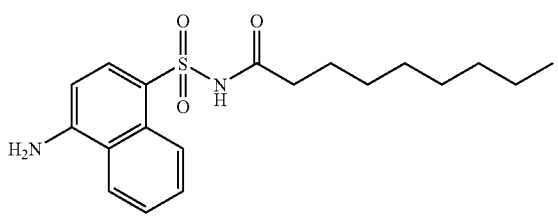

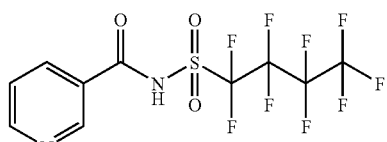

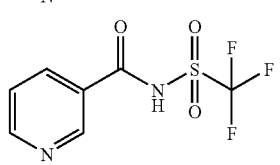

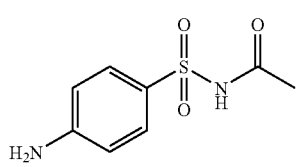

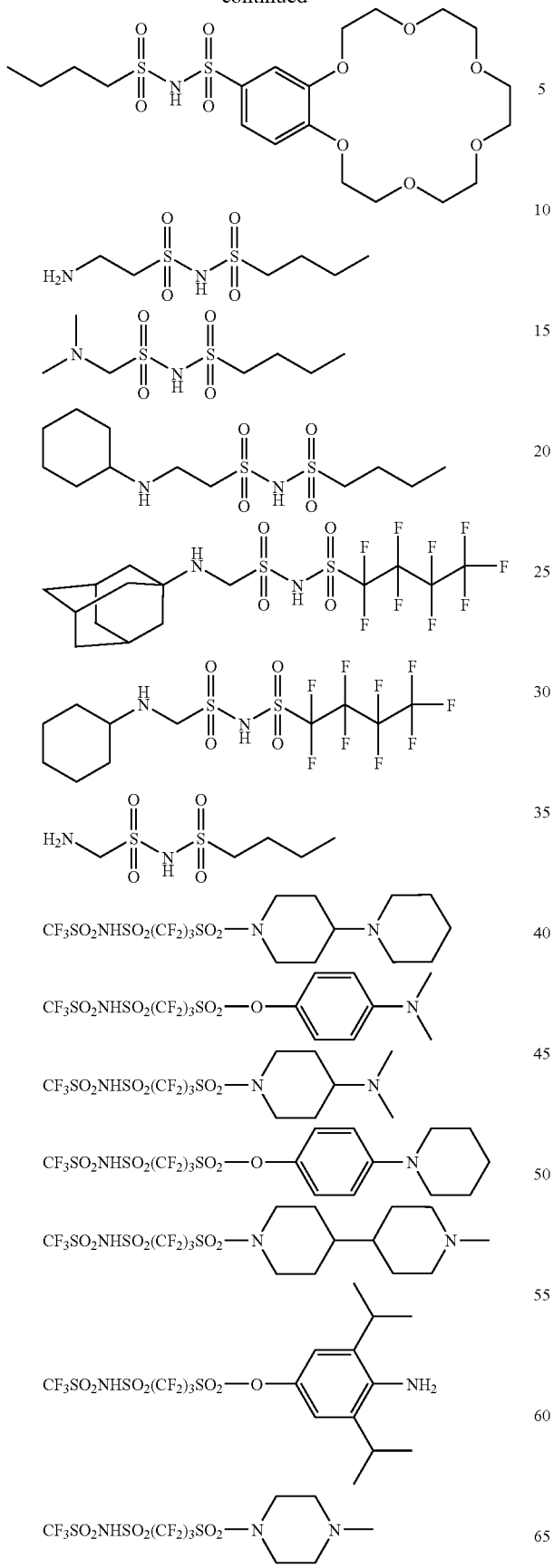
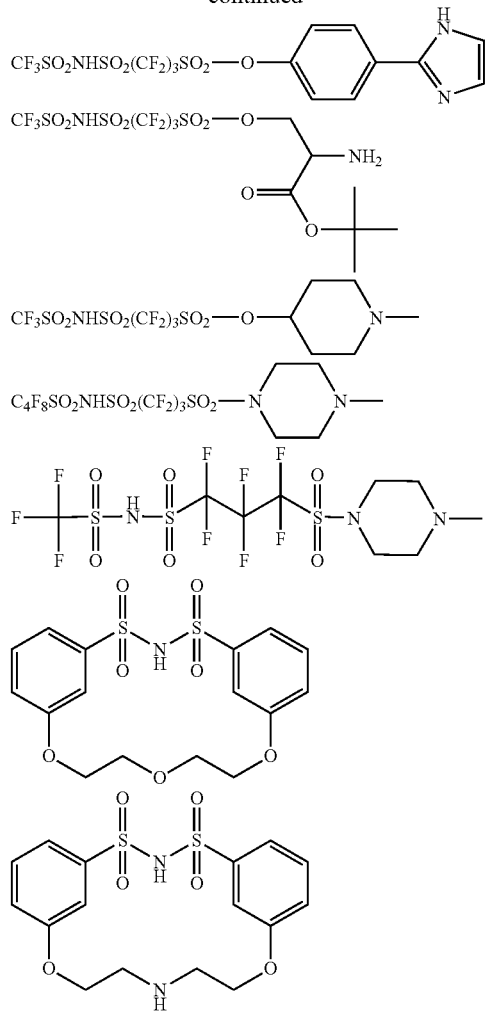

The compound (PA) is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

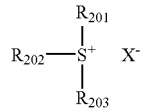

(PA1)

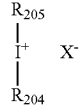

(PA2)

In formula (PA1), each of $R_{201}$, $R_{202}$ and $R_{203}$ independently represents an organic group. Specific examples of the organic group and preferred organic groups are the same as those described for the organic group of $R_{201}$ to $R_{203}$ in formula (ZI).

$X^-$ represents a sulfonate or carboxylate anion resulting from removal of a hydrogen atom in the —$SO_3H$ moiety or —COOH moiety of the compound represented by formula (PA-I), or an anion of the compound represented by formula (PA-II) or (PA-III).

In formula (PA2), each of $R_{204}$ and $R_{205}$ independently represents an aryl group, an alkyl group or a cycloalkyl group. Specific examples and preferred examples of these atomic groups are the same as those described above for the organic group of $R_{204}$ and $R_{205}$ in formula (ZII).

$X^-$ represents a sulfonate or carboxylate anion resulting from removal of a hydrogen atom in the —$SO_3H$ moiety or —COOH moiety of the compound represented by formula (PA-I), or an anion of the compound represented by formula (PA-II) or (PA-III).

The compound capable of generating a compound represented by formula (PA-I), (PA-II) or (PA-III) upon irradiation with an actinic ray or radiation is preferably a compound represented by formula (PA1), more preferably a compound of (A1a) to (A1c).

The compound (PA) decomposes upon irradiation with an actinic ray or radiation to generate, for example, a compound represented by formula (PA-1) or (PA-2).

The compound represented by formula (PA-1) is a compound having a sulfo or carboxyl group together with a proton acceptor functional group and thereby being reduced in or deprived of the proton acceptor property or changed to be acidic from being proton acceptor-functioning as compared with the compound (PA).

The compound represented by formula (PA-2) is a compound having an organic sulfonylimino or organic carbonylimino group together with a proton acceptor functional group and thereby being reduced in or deprived of the proton acceptor property or changed to be acidic from being proton acceptor-functioning as compared with the compound (PA).

In the present invention, the expression "reduced in the acceptor property" means that when a noncovalent bond complex as a proton adduct is produced from a proton acceptor functional group-containing compound and a proton, the equilibrium constant at the chemical equilibrium decreases.

The proton acceptor property can be confirmed by measuring the pH.

Specific examples of the compound (PA) capable of generating a compound represented by formula (PA-I) upon irradiation with an actinic ray or radiation are set forth below, but the present invention is not limited thereto.

(PA-1)

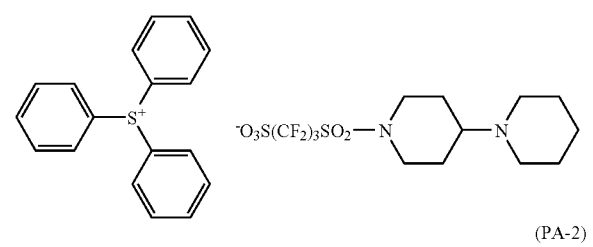

(PA-2)

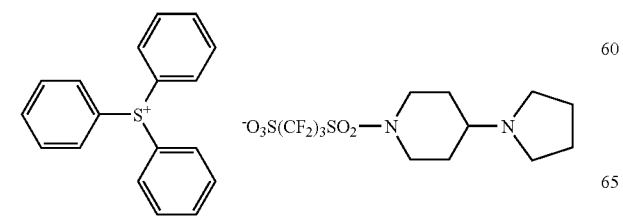

(PA-3)

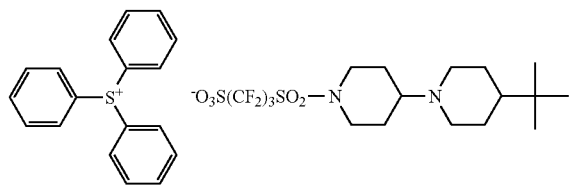

(PA-4)

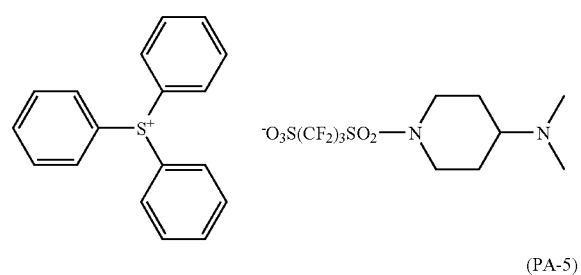

(PA-5)

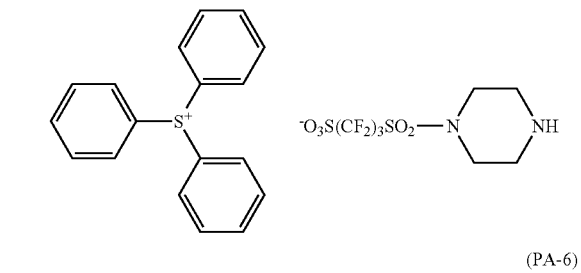

(PA-6)

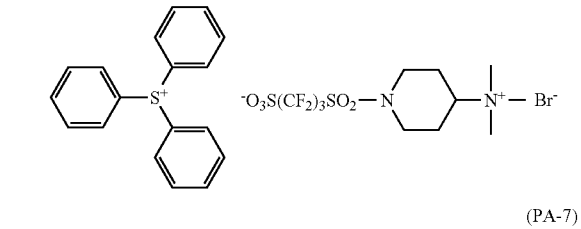

(PA-7)

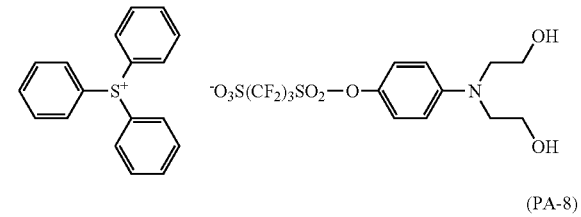

(PA-8)

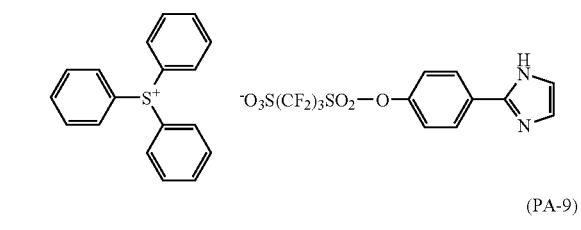

(PA-9)

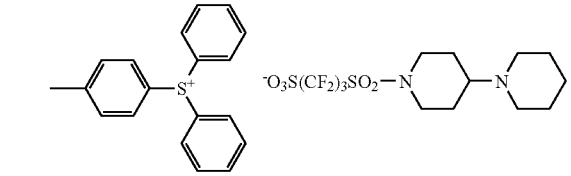

(PA-10)
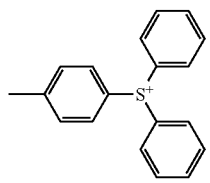 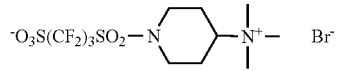
(PA-11)
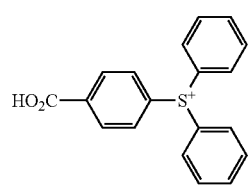 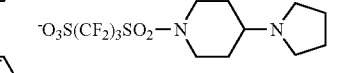
(PA-12)
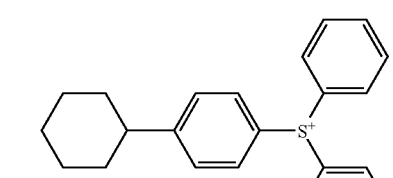 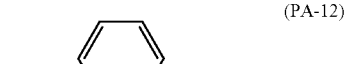
(PA-13)
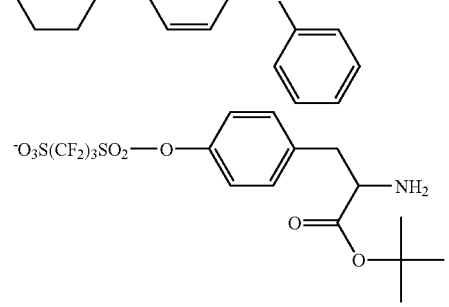 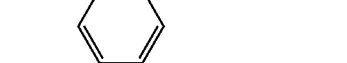
(PA-14)
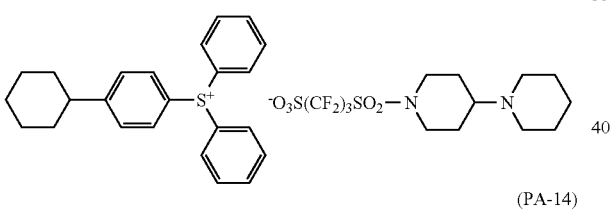 
(PA-15)
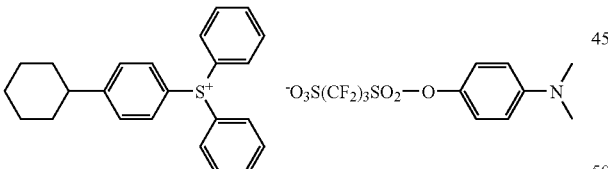 
(PA-16)
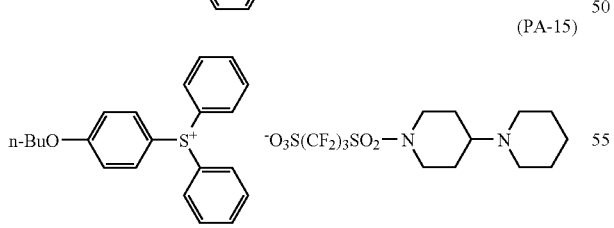 
(PA-17)
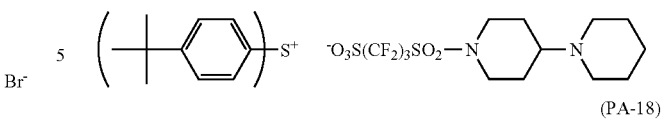
(PA-18)
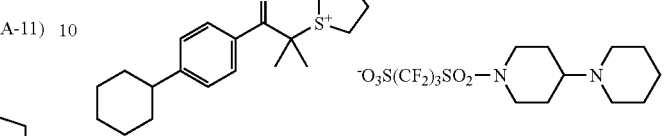
(PA-19)
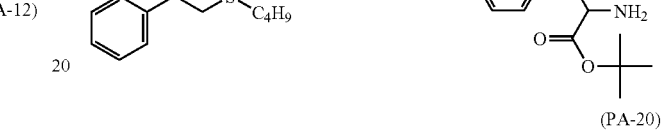
(PA-20)
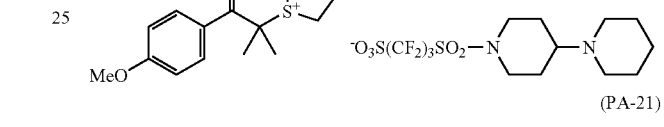
(PA-21)
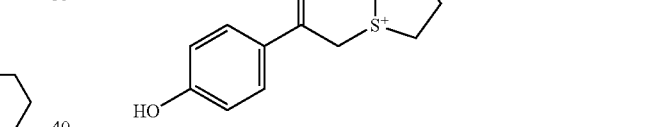
(PA-22)
(PA-23)
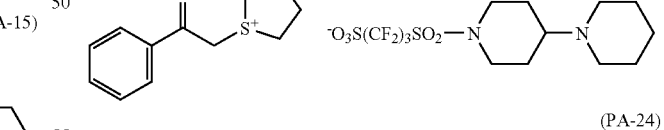
(PA-24)

-continued
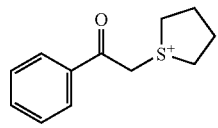 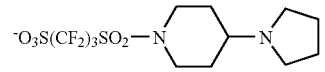 (PA-25)
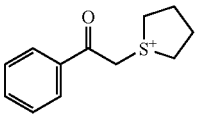  (PA-26)
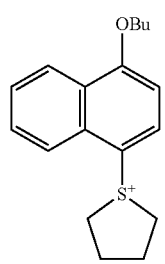 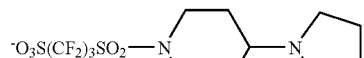 (PA-27)
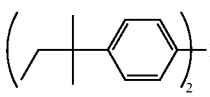  (PA-28)
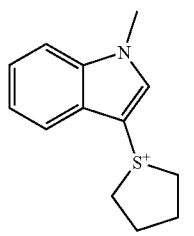 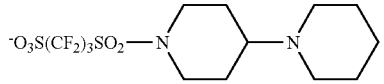 (PA-29)
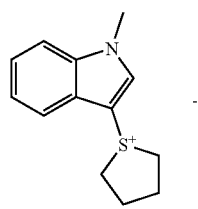 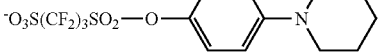 (PA-30)
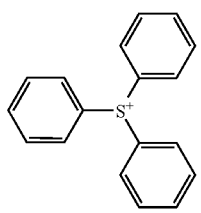 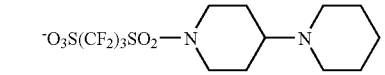 (PA-31)
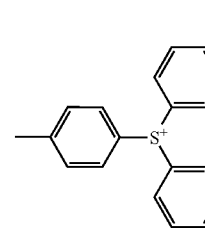 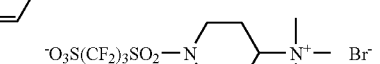 (PA-32)
-continued
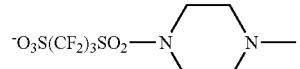 (PA-33)
 (PA-34)
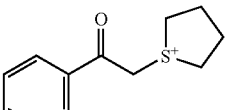 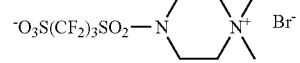 (PA-35)
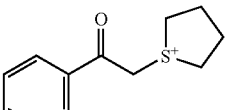 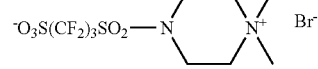 (PA-36)
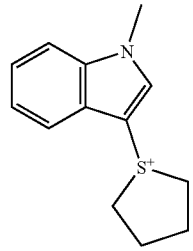 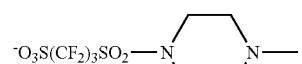 (PA-37)
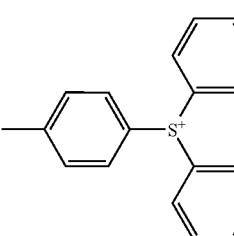  (PA-38)
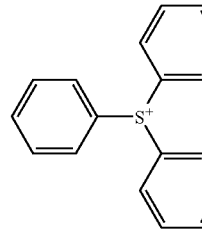  (PA-39)

-continued
(PA-40)
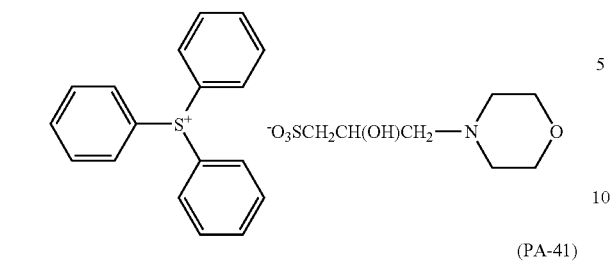
(PA-41)
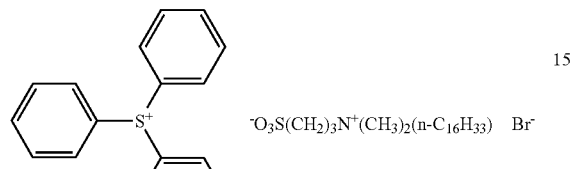
(PA-42)
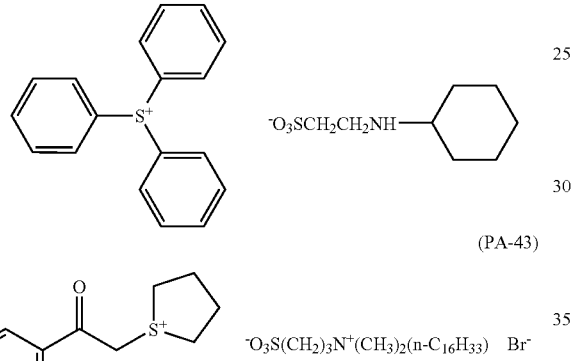
(PA-43)
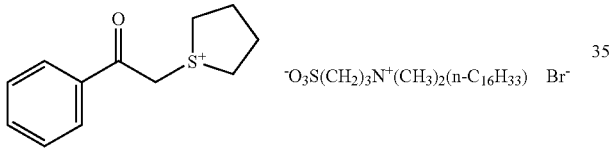
(PA-44)
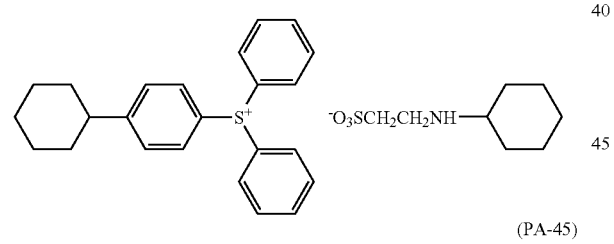
(PA-45)
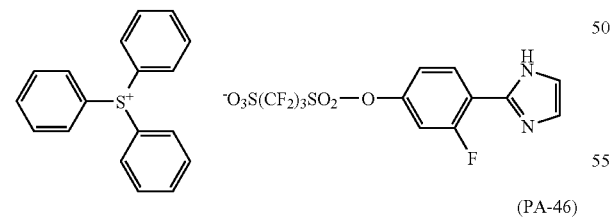
(PA-46)
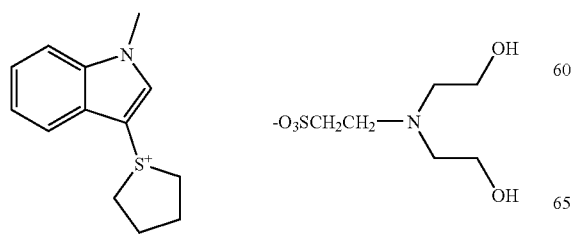
-continued
(PA-47)
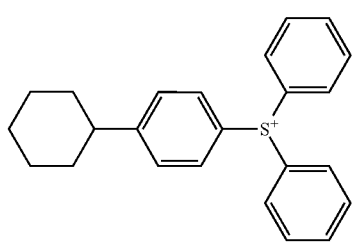
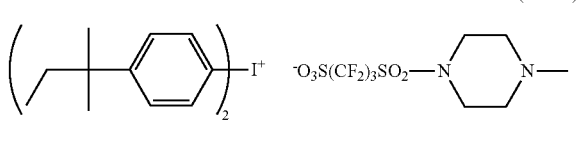
(PA-48)
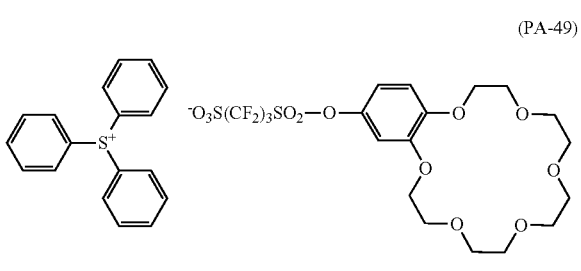
(PA-49)
(PA-50)
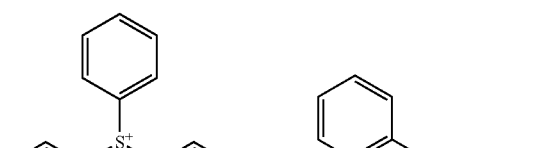
(PA-51)
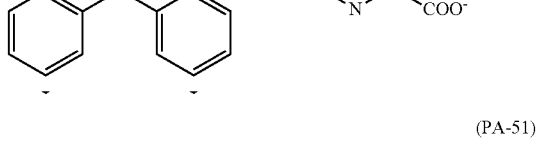
(PA-52)
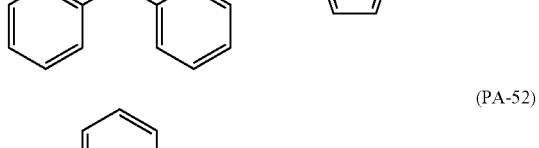

-continued (PA-53)
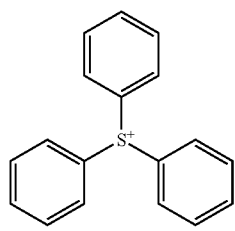 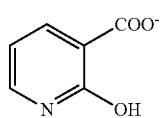

(PA-54)
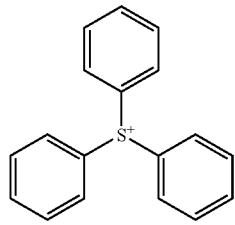 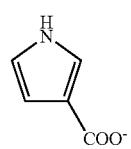

(PA-55)
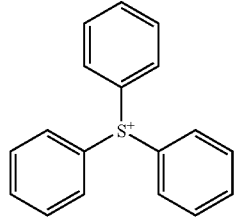 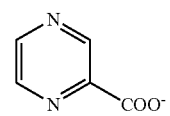

(PA-56)
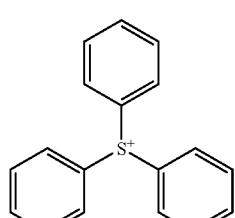 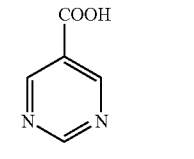

(PA-57)
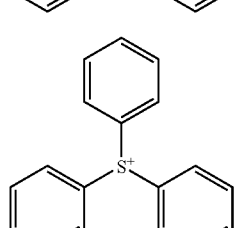 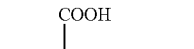

(PA-58)
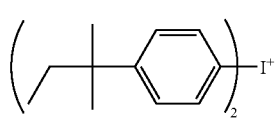 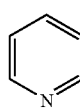

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786.

Specific examples of the compound (PA) capable of generating a compound represented by formula (PA-II) upon irradiation with an actinic ray or radiation are set forth below, but the present invention is not limited thereto.

(PA-59)
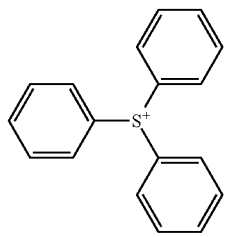

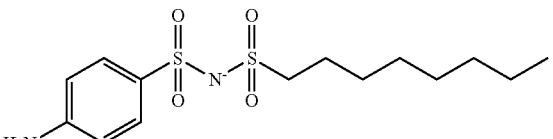

(PA-60)
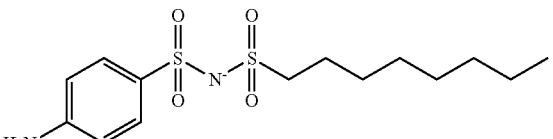

(PA-61)
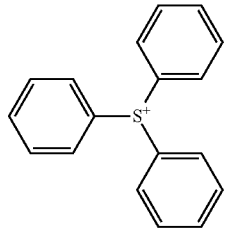

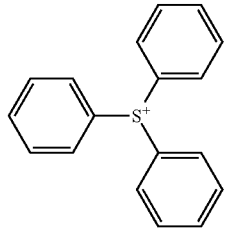

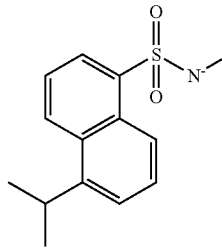

(PA-62)
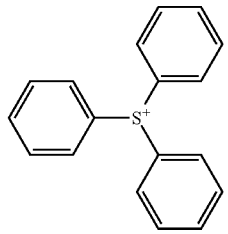

(PA-63)
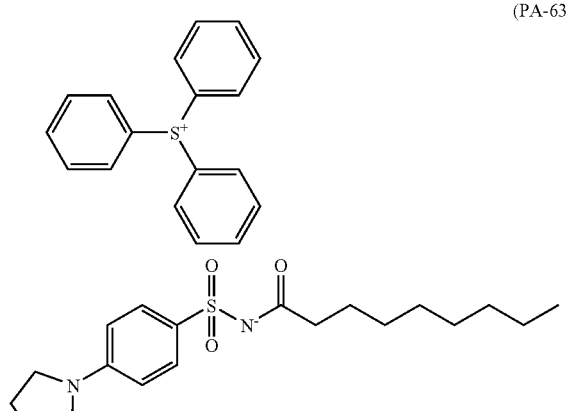
(PA-64)
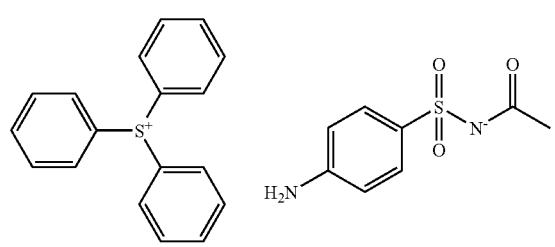
(PA-65)
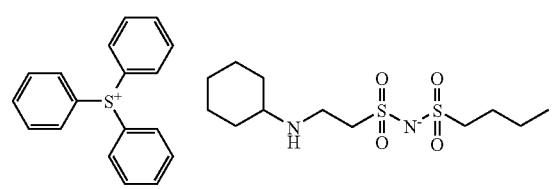
(PA-66)
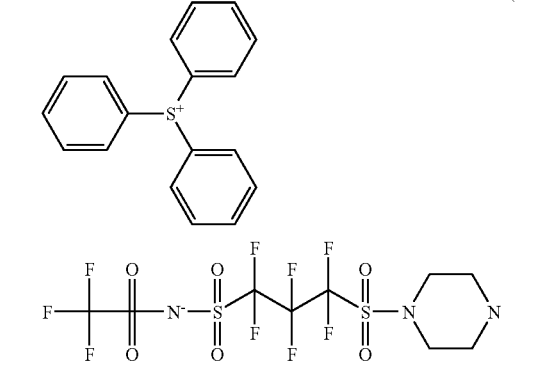
(PA-67)
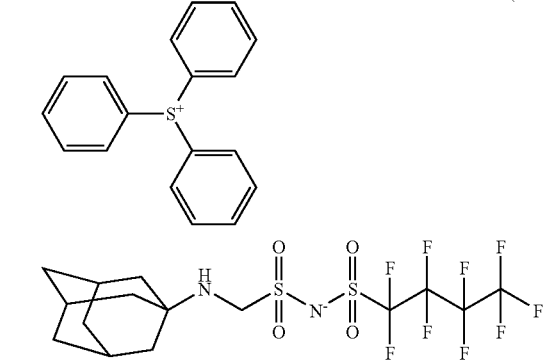
(PA-68)
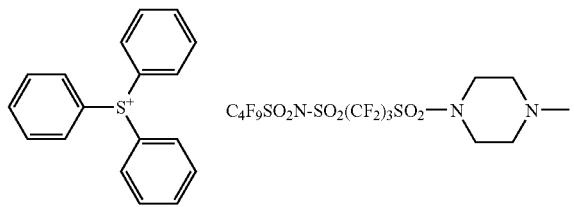
(PA-69)
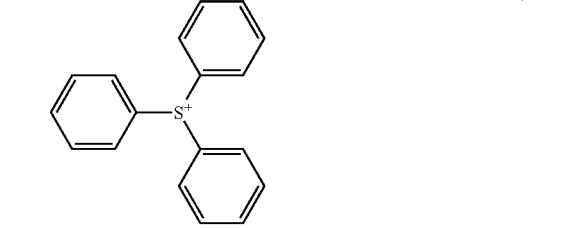
(PA-70)
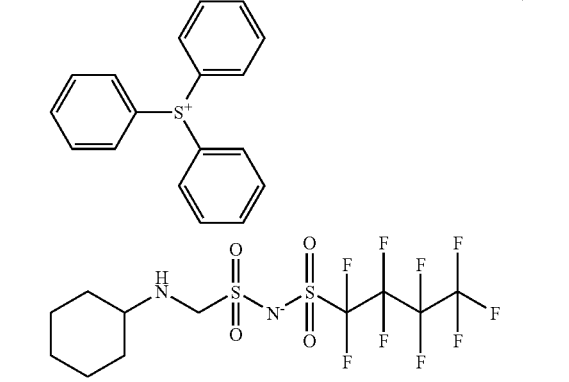
(PA-71)
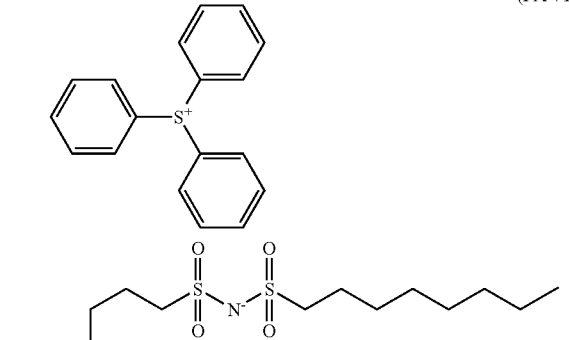
(PA-72)
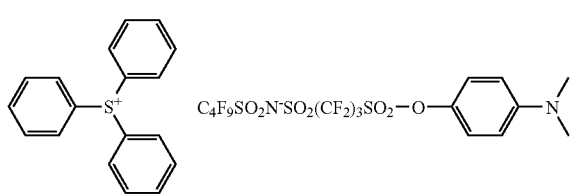

(PA-73)
(PA-74)
(PA-75)
(PA-76)
(PA-77)
(PA-78)
(PA-79)
(PA-80)
(PA-81)
(PA-82)

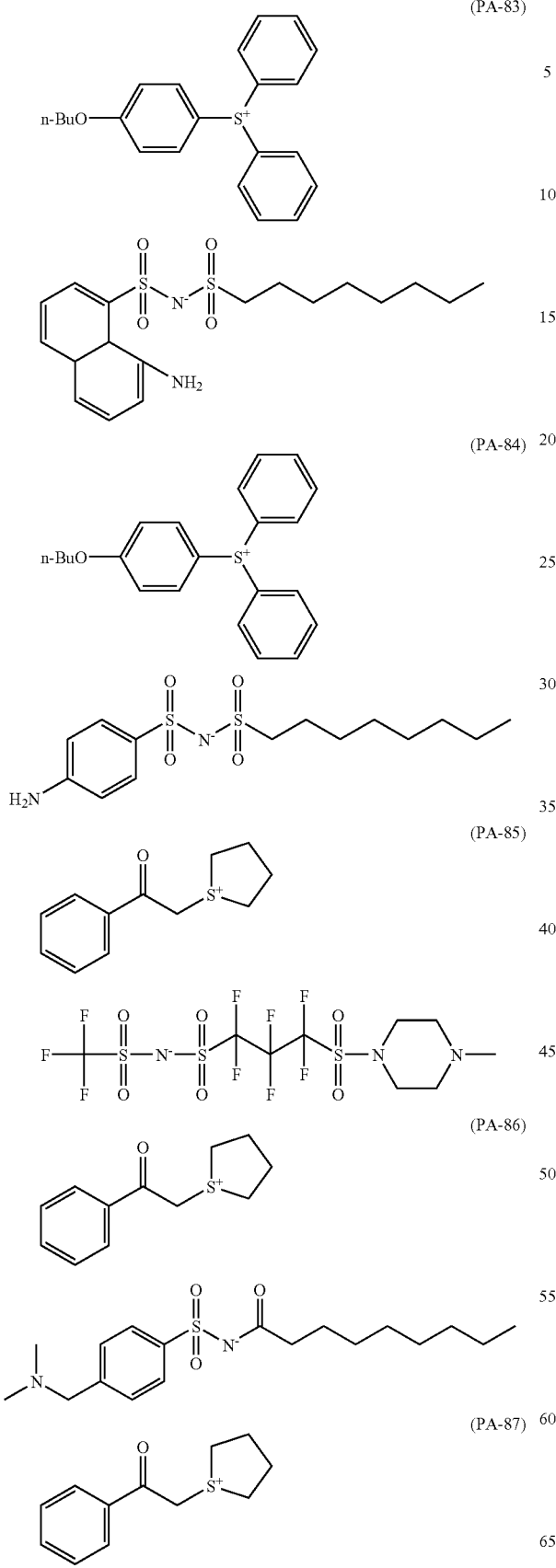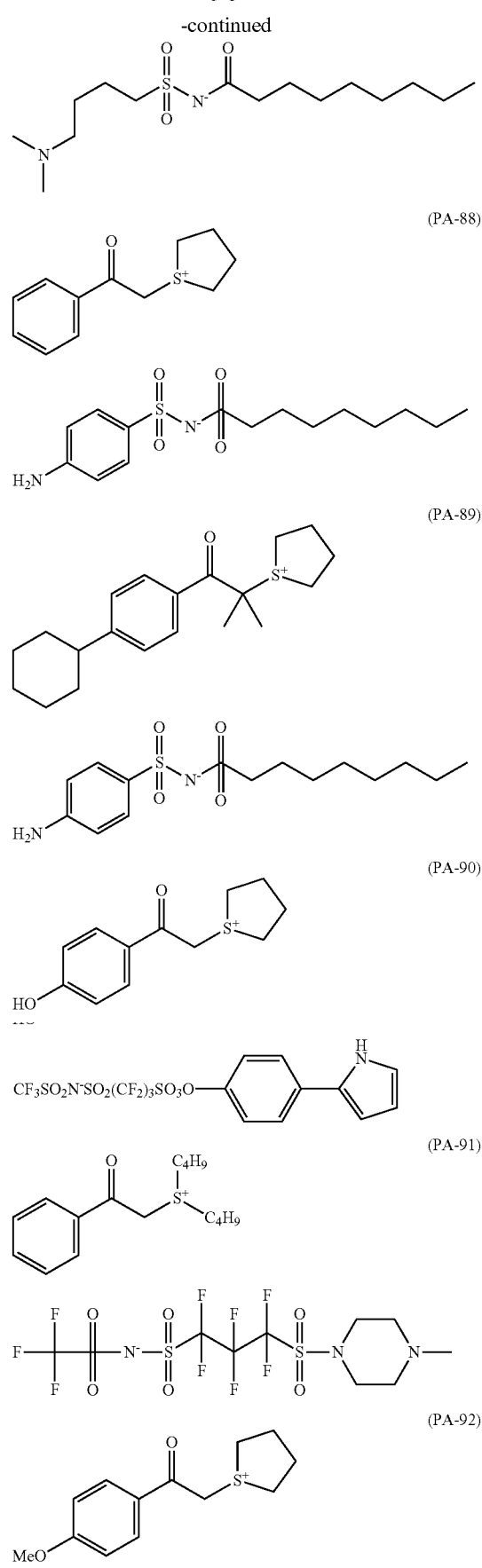

-continued (PA-93)

(PA-94)

(PA-95)

(PA-96)

(PA-97)

-continued (PA-98)

(PA-99)

(PA-100)

(PA-101)

(PA-102)

-continued

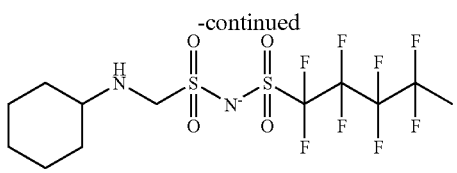

These compounds can be easily synthesized by using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) can be synthesized by reacting an amine or alcohol with an anhydride (e.g., $(R'O_2C)_2O$, $R'O_2CCl$) or an acid chloride compound under basic conditions.

The content of the compound (PA) in the resist composition of the present invention is preferably from 0.1 to 20 mass %, more preferably from 0.1 to 10 mass %, based on the solid content of the composition.

Antioxidant:

The resist composition of the present invention preferably contains an antioxidant.

The antioxidant is added for preventing the organic material from being oxidized in the presence of oxygen.

The antioxidant is not particularly limited as long as it is an antioxidant used in general and has an effect of preventing oxidation of a plastic and the like, and examples thereof include a phenol-based antioxidant, an antioxidant composed of an organic acid derivative, a sulfur-containing antioxidant, a phosphorus-based antioxidant, an amine-based antioxidant, an antioxidant composed of an amine-aldehyde condensate, and an antioxidant composed of an amine-ketone condensate. Out of these antioxidants, in order to bring out the effects of the present invention without reducing the functions of the resist, the antioxidant is preferably a phenol-based antioxidant or an antioxidant composed of an organic acid derivative.

Specific preferred examples of the antioxidant for use in the present invention include 2,6-di-tert-butyl-4-methylphenol, 4-hydroxymethyl-2,6-di-tert-butylphenol, 2,2'-methylenebis(4-methyl-6-tert-butylphenol), butylhydroxyanisole, tert-butyl hydroquinone, 2,4,5-trihydroxybutyrophenone, nordihydroguaiaretic acid, propyl gallate, octyl gallate, lauryl gallate and isopropyl citrate. Among these, 2,6-di-tert-butyl-4-methylphenol, 4-hydroxymethyl-2,6-di-tert-butylphenol, butylhydroxyanisole and tert-butyl hydroquinone are preferred, and 2,6-di-tert-butyl-4-methylphenol and 4-hydroxymethyl-2,6-di-tert-butylphenol are more preferred.

The content of the antioxidant in the resist composition is preferably 1 ppm or more, more preferably 5 ppm or more, still more preferably 10 ppm or more, yet still more preferably 50 ppm or more, even yet still more preferably 100 ppm or more, and still more preferably from 100 to 10,000 ppm. A plurality of antioxidants may be mixed and used.

Solvent:

The resist composition of the present invention is coated on a support after dissolving the above-described components in a solvent. Usually, the solid content concentration of all resist components is preferably from 2 to 30 mass %, more preferably from 3 to 25 mass %.

The solvent used here is preferably a solvent containing at least one member of a propylene glycol monoalkyl ether carboxylate, a propylene glycol monoalkyl ether, an alkyl lactate, an acetic acid ester, an alkyl alkoxypropionate, a chain ketone and a cyclic ketone.

The propylene glycol monoalkyl ether carboxylate is preferably propylene glycol monomethyl ether acetate, propylene glycol monomethyl ether propionate or propylene glycol monoethyl ether acetate.

The propylene glycol monoalkyl ether is preferably propylene glycol monomethyl ether or propylene glycol monoethyl ether.

The alkyl lactate is preferably ethyl lactate or butyl lactate.

The acetic acid ester is preferably butyl acetate.

The alkyl alkoxypropionate is preferably methoxymethyl propionate or ethoxyethyl propionate.

The chain ketone is preferably methyl amyl ketone.

The cyclic ketone is preferably cyclohexanone, γ-butyrolactone or propylene carbonate.

The solvent may be one solvent alone or a combination of solvents.

The combination of solvents is preferably a combination of propylene glycol monomethyl ether acetate with propylene glycol monomethyl ether, ethyl lactate, butyl acetate, ethoxyethyl propionate or methyl amyl ketone.

Other Components:

The resist composition of the present invention may further contain, if desired, a dye, a photo-base generator and the like.

Pattern Forming Method:

The resist composition of the present invention is coated on a substrate to form a thin film. The thickness of this coating film is preferably from 0.05 to 4.0 μm.

In the present invention, a commercially available inorganic or organic antireflection film may be used, if desired. Furthermore, the antireflection film may be used by coating it as an overlayer or underlayer of the resist.

The antireflection film used as the underlayer of the resist may be either an inorganic film type such as titanium, titanium dioxide, titanium nitride, chromium oxide, carbon and amorphous silicon, or an organic film type comprising a light absorbent and a polymer material. The former requires equipment for the film formation, such as vacuum deposition apparatus, CVD apparatus and sputtering apparatus. Examples of the organic antireflection film include a film comprising a diphenylamine derivative/formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising a methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV30 Series and DUV-40 Series produced by Brewer Science, Inc., or AR-2, AR-3 and AR-5 produced by Shipley Co., Ltd.

In regard to the organic antireflection film as an overlayer of the resist, an organic antireflection film such as AQUATAR-II, AQUATAR-III and AQUATAR-VII produced by AZ Electronic Materials may be used.

In the production or the like of a precision integrated circuit device, the step of forming a pattern on a resist film is performed by coating the positive resist composition of the present invention on a substrate (for example, a silicon/silicon dioxide-coated substrate, a glass substrate, an ITO substrate or a quartz/chromium oxide-coated substrate) to form a resist film, irradiating thereon an actinic ray or radiation such as KrF excimer laser light, electron beam or EUV light, and then subjecting the resist film to heating, development, rinsing and drying, whereby a good resist pattern can be formed.

The alkali developer which can be used in the development is an aqueous solution of alkalis (usually from 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). This aqueous solution of alkalis may also be used after adding thereto an appropriate amount of alcohols such as isopropyl alcohol or a surfactant such as nonionic surfactant.

Among these developers, a quaternary ammonium salt is preferred, and tetramethylammonium hydroxide and choline are more preferred.

The pH of the alkali developer is usually from 10 to 15.

EXAMPLES

The present invention is described in greater detail below by referring to Examples, but the present invention should not be construed as being limited thereto.

Synthesis Example 1

Synthesis of Sulfonamide Compound (S-1)

Methanesulfonyl chloride (12.5 g (0.11 mol)) is added to 7.8 g (0.1 mol) of aniline in 200 ml of THF. While heating the reaction solution at 40° C. with stirring, 12.1 g (0.12 mol) of triethylamine is added dropwise thereto. The reaction solution is crystallized in distilled water, and the precipitate is recrystallized in ethyl acetate/hexane to obtain Sulfonamide Compound (S-1).

Synthesis Example 2

Synthesis of Sulfonamide Compound (S-18)

Methanesulfonamide (10.5 g (0.11 mol)) is added to 15.5 g (0.1 mol) of 4-methylbenzoyl chloride in 200 ml of THF. While heating the reaction solution at 60° C. with stirring, 12.1 g (0.12 mol) of triethylamine is added dropwise thereto. The reaction solution is crystallized in distilled water, and the precipitate is recrystallized in acetone/hexane to obtain Sulfonamide Compound (S-18).

Synthesis Example 3

Synthesis of Sulfonamide Compound (S-41)

4-Toluenesulfonyl isocyanate (21.7 g (0.11 mol)) is added to 6.0 g (0.1 mol) of acetic acid in 200 ml of acetone. While heating the reaction solution at 40° C. with stirring, 10.1 g (0.1 mol) of triethylamine is added dropwise thereto. The reaction solution is crystallized in distilled water, and the precipitate is recrystallized in ethyl acetate/hexane to obtain Sulfonamide Compound (S-41).

Synthesis Example 4

Synthesis of Resin (R-11)

p-Acetoxystyrene (52.7 g (0.325 mol)), 10.4 g (0.1 mol) of styrene and 9.61 g (0.075 mol) of tert-butyl acrylate are dissolved in 170 ml of butyl acetate, and 0.063 g of azobisisobutyronitrile (AIBN) is added three times every 2.5 hours at 80° C. with stirring in a nitrogen stream. Finally, stirring is further continued for 5 hours, thereby performing a polymerization reaction. The reaction solution is poured in 1,200 ml of hexane to precipitate a white resin, and the obtained resin is dried and than added to 300 ml of methanol.

A 28% methanol solution of sodium methoxide is added thereto and the mixture is heated at 50° C. for 1 hour, thereby decomposing the acetyl group. Subsequently, the reaction solution is diluted by adding 200 ml of water and neutralized with hydrochloric acid to precipitate a white resin. This resin is separated by filtration, washed with water, dried and dissolved in 200 ml of tetrahydrofuran, and the resulting solution is added dropwise to 5 L of ultrapure water with vigorous stirring to effect reprecipitation. This reprecipitation operation is repeated three times. The resin obtained is dried in a vacuum drier at 120° C. for 12 hours to obtain Resin (R-11).

Synthesis Example 5

Synthesis of Resin (R-10)

Poly(p-hydroxystyrene) (VP-8000, produced by Nippon Soda Co., Ltd.) (20 g) and 5.5 g of 4-cyclohexylphenyloxy ethyl vinyl ether are dissolved in 80 ml of THF, and 0.01 g of p-toluenesulfonic acid is added thereto and reacted at room temperature for 18 hours. The reaction solution is neutralized with triethylamine and then added dropwise to 5 L of distilled water with vigorous stirring, and the precipitated powder is filtered and dried to obtain Resin (R-10).

Other resins are synthesized by the same method. The weight average molecular weight and the molar ratio of repeating units in each of the resins used in Examples are as follows.

| Resin | Weight Average Molecular Weight | Molar Ratio* of Repeating Units |
|---|---|---|
| (R-1) | 12000 | 30/70 |
| (R-2) | 13500 | 65/25/10 |
| (R-3) | 15500 | 65/25/10 |
| (R-4) | 10500 | 30/60/10 |
| (R-5) | 12000 | 70/30 |
| (R-6) | 12000 | 72/28 |
| (R-7) | 13000 | 20/60/20 |
| (R-8) | 14000 | 10/65/25 |
| (R-9) | 10000 | 73/27 |
| (R-10) | 12500 | 80/20 |
| (R-11) | 15000 | 15/65/20 |
| (R-12) | 13000 | 5/75/20 |
| (R-13) | 13000 | 75/25 |
| (R-14) | 12000 | 15/65/20 |
| (R-15) | 13000 | 65/15/20 |
| (R-16) | 12000 | 20/70/10 |

-continued

| Resin | Weight Average Molecular Weight | Molar Ratio* of Repeating Units |
|---|---|---|
| (R-17) | 12000 | 67/33 |
| (R-18) | 13000 | 65/25/10 |

*Repeating units in parentheses from the left of each resin structure illustrated above.

<Evaluation in KrF Exposure>

Example 1

| (1) Coating of Resist | |
|---|---|
| (Component A): Acid Generator (z35) | 0.03 g |
| (Component B): Resin (R-1) | 0.90 g |

These components are dissolved in 8.5 g of propylene glycol monomethyl ether acetate, 0.06 g of (S-1) is added thereto as the component S, and furthermore, 0.008 g of dicyclohexylmethylamine (hereinafter simply referred to as "D-1") and 0.001 g of Megaface F176 (produced by Dainippon Ink & Chemicals, Inc., hereinafter simply referred to as "W-1") as the surfactant are added and dissolved. The obtained solution is microfiltered through a membrane filter having a pore size of 0.1 μm to obtain a resist solution.

This resist solution is coated on a 6-inch silicon wafer by using a spin coater, Mark 8, manufactured by Tokyo Electron Ltd. and then baked at 110° C. for 90 seconds to obtain a 0.30 μm-thick uniform film.

This resist film is then subjected to pattern exposure using a KrF excimer stepper (FPA3000EX-5, manufactured by Canon Inc., wavelength: 248 nm). After the exposure, the resist film is baked at 110° C. for 90 seconds, dipped in an aqueous 2.38 wt % tetramethylammonium hydroxide (TMAH) solution for 60 seconds, rinsed with water for 30 seconds and dried.

(Resist Pattern Profile)

The profile of a line pattern (1:1 line-and-space) with a line width of 0.13 μm when using an SiON substrate as the silicone wafer substrate is observed by cross-sectional SEM. The results are shown in Table 1, where F indicates "footing" in the line bottom profile, SF indicates "slightly footing", N indicates "normal" (rectangular), SU indicates "slightly undercutting", and U indicates "undercutting".

(Line Width Roughness)

With respect to the edge of 5 μm in the longitudinal direction of a line pattern (1:1 line-and-space) with a line width of 0.13 μm, the line width is measured at 30 points by a Critical Dimension SEM (S-8840, manufactured by Hitachi, Ltd.) and after determining the standard deviation, 3σ is calculated. A smaller value indicates better performance.

Examples 2 to 18 and Comparative Examples 1 and 2

Using the compounds shown in Table 1, the coating of resist and the evaluation in KrF exposure are performed in the same manner as in Example 1. The evaluation results are shown in Table 1.

TABLE 1

| | Component A | Component B | Component S | Basic Compound | Surfactant | Pattern Profile (SiON) | Line Width Roughness (nm) |
|---|---|---|---|---|---|---|---|
| Example 1 | z35 (0.03 g) | R-1 (0.90 g) | S-1 (0.06 g) | D-1 (0.008 g) | W-1 (0.001 g) | SF | 9.5 |
| Example 2 | z34 (0.03 g) | R-2 (0.90 g) | S-2 (0.06 g) | D-2 (0.008 g) | W-1 (0.001 g) | SF | 9.8 |
| Example 3 | z35 (0.03 g) | R-3 (0.90 g) | S-3 (0.06 g) | D-3 (0.008 g) | W-2 (0.001 g) | SF | 10.5 |
| Example 4 | z2 (0.25 g) z34 (0.01 g) | R-4 (0.90 g) | S-1 (0.06 g) | D-4 (0.008 g) | W-1 (0.001 g) | SF | 10.8 |
| Example 5 | z35 (0.03 g) | R-5 (0.90 g) | S-6 (0.06 g) | D-5 (0.008 g) | W-1 (0.001 g) | SF | 10.2 |
| Example 6 | z35 (0.03 g) | R-6 (0.90 g) | S-8 (0.06 g) | D-1 (0.008 g) | W-2 (0.001 g) | SF | 9.8 |
| Example 7 | z7 (0.03 g) | R-7 (0.90 g) | S-1 (0.04 g) S-9 (0.02 g) | D-1 (0.008 g) | W-1 (0.001 g) | N | 8.8 |
| Example 8 | z36 (0.03 g) | R-8 (0.90 g) | S-10 (0.06 g) | D-3 (0.008 g) | W-1 (0.001 g) | N | 8.8 |
| Example 9 | z40 (0.03 g) | R-9 (0.90 g) | S-12 (0.06 g) | D-4 (0.008 g) | W-1 (0.001 g) | N | 9.0 |
| Example 10 | z35 (0.03 g) | R-10 (0.90 g) | S-17 (0.06 g) | D-5 (0.008 g) | W-1 (0.001 g) | SF | 10.0 |
| Example 11 | z2 (0.03 g) z36 (0.01 g) | R-11 (0.90 g) | S-18 (0.06 g) | D-1 (0.008 g) | W-2 (0.001 g) | SF | 11.0 |
| Example 12 | z35 (0.03 g) | R-12 (0.90 g) | S-19 (0.06 g) | D-2 (0.008 g) | W-1 (0.001 g) | SF | 10.3 |
| Example 13 | z2 (0.03 g) z40 (0.01 g) | R-13 (0.90 g) | S-22 (0.06 g) | D-1 (0.008 g) | W-1 (0.001 g) | SF | 9.7 |
| Example 14 | z5 (0.03 g) | R-14 (0.90 g) | S-25 (0.06 g) | D-4 (0.008 g) | W-1 (0.001 g) | N | 8.6 |

TABLE 1-continued

| | Component A | Component B | Component S | Basic Compound | Surfactant | Pattern Profile (SiON) | Line Width Roughness (nm) |
|---|---|---|---|---|---|---|---|
| Example 15 | z8 (0.03 g) z34 (0.01 g) | R-15 (0.90 g) | S-6 (0.04 g) S-26 (0.02 g) | D-1 (0.008 g) | W-2 (0.001 g) | N | 8.8 |
| Example 16 | z2 (0.03 g) z34 (0.01 g) | R-16 (0.90 g) | S-27 (0.06 g) | D-3 (0.008 g) | W-1 (0.001 g) | N | 9.0 |
| Example 17 | z60 (0.03 g) z34 (0.01 g) | R-17 (0.90 g) | S-30 (0.06 g) | D-4 (0.008 g) | W-1 (0.001 g) | N | 9.0 |
| Example 18 | z2 (0.03 g) | R-18 (0.90 g) | S-30 (0.06 g) | D-3 (0.008 g) | W-2 (0.001 g) | N | 9.0 |
| Comparative Example 1 | z35 (0.03 g) | R-1 (0.90 g) | none | D-1 (0.008 g) | W-1 (0.001 g) | F | 12.8 |
| Comparative Example 2 | z7 (0.03 g) | R-7 (0.90 g) | none | D-1 (0.008 g) | W-1 (0.001 g) | F | 12.8 |

The abbreviations in the Table indicate the followings.
Nitrogen-Containing Basic Compound (D-1): dicyclohexylmethylamine
Nitrogen-Containing Basic Compound (D-2): 2-phenylbenzimidazole
Nitrogen-Containing Basic Compound (D-3): tris(methoxyethoxyethyl)amine
Nitrogen-Containing Basic Compound (D-4): tributylamine
Nitrogen-Containing Basic Compound (D-5): triethanolamine
Surfactant (W-1): Megaface F-176 (produced by Dainippon Ink & Chemicals, Inc.)
Surfactant (W-2): Polysiloxane Polymer KP-341 (produced by Shin-Etsu Chemical Co., Ltd.)

It is seen from Table 1 that the positive resist composition of the present invention exhibits excellent performance in terms of resist pattern profile on a basic substrate and line width roughness.

<Evaluation with Electron Beam>

Example 19

| (1) Coating of Resist | |
|---|---|
| (Component A): Acid Generator (z19) | 0.05 g |
| (Component B): Resin (R-1) | 0.90 g |

These components are dissolved in 8.5 g of propylene glycol monomethyl ether acetate, 0.06 g of (S-1) is added thereto as the component S, and furthermore, 0.008 g of dicyclohexylmethylamine and 0.001 g of Megaface F176 (produced by Dainippon Ink & Chemicals, Inc.) are added and dissolved. The obtained solution is microfiltered through a membrane filter having a pore size of 0.1 μm to obtain a resist solution.

This resist solution is coated on a 6-inch silicon wafer by using a spin coater, Mark 8, manufactured by Tokyo Electron Ltd. and then baked at 110° C. for 90 seconds to obtain a 0.30 μm-thick uniform film.

(2) Formation and Evaluation of Resist Pattern

The thus-formed resist film is irradiated with an electron beam by using an electron beam image-drawing apparatus (HL750, manufactured by Hitachi, Ltd., acceleration voltage: 50 KeV). After the irradiation, the resist film is baked at 110° C. for 90 seconds, dipped in an aqueous 2.38 wt % tetramethylammonium hydroxide (TMAH) solution for 60 seconds, rinsed with water for 30 seconds and dried. The obtained pattern is evaluated in the same manner as in Example 1.

Examples 20 to 23 and Comparative Examples 3 and 4

Using the compounds shown in Table 2, the coating of resist and the evaluation in electron beam exposure are performed in the same manner as in Example 19. The evaluation results are shown in Table 2.

TABLE 2

| | Component A | Component B | Component S | Basic Compound | Surfactant | Pattern Profile (SiON) | Line Width Roughness (nm) |
|---|---|---|---|---|---|---|---|
| Example 19 | z19 (0.05 g) | R-1 (0.90 g) | S-1 (0.06 g) | D-1 (0.008 g) | W-1 (0.001 g) | SF | 8.5 |
| Example 20 | z19 (0.05 g) | R-2 (0.90 g) | S-6 (0.06 g) | D-2 (0.008 g) | W-1 (0.001 g) | SF | 7.8 |
| Example 21 | z2 (0.05 g) | R-3 (0.90 g) | S-16 (0.06 g) | D-3 (0.008 g) | W-2 (0.001 g) | SF | 7.5 |
| Example 22 | z2 (0.05 g) | R-4 (0.90 g) | S-19 (0.06 g) | D-4 (0.008 g) | W-1 (0.001 g) | SF | 8.0 |

TABLE 2-continued

| | Component A | Component B | Component S | Basic Compound | Surfactant | Pattern Profile (SiON) | Line Width Roughness (nm) |
|---|---|---|---|---|---|---|---|
| Example 23 | z4 (0.05 g) | R-7 (0.90 g) | S-17 (0.04 g) S-28 (0.02 g) | D-1 (0.008 g) | W-1 (0.001 g) | N | 7.8 |
| Comparative Example 3 | z19 (0.05 g) | R-1 (0.90 g) | none | D-1 (0.008 g) | W-1 (0.001 g) | F | 10.5 |
| Comparative Example 4 | z19 (0.05 g) | R-7 (0.90 g) | none | D-1 (0.008 g) | W-1 (0.001 g) | F | 10.9 |

It is seen from Table 2 that the positive resist composition of the present invention exhibits excellent performance in terms of resist pattern profile on a basic substrate and line width roughness also in the irradiation with an electron beam.

According to the present invention, a resist composition ensuring that deterioration of the pattern profile due to characteristics of the substrate surface is suppressed (above all, the pattern profile characteristics on an SiON substrate are excellent) and the performance in terms of line edge roughness is excellent, and a pattern forming method using the composition, can be provided.

The entire disclosure of each and every foreign patent application from which the benefit of foreign priority has been claimed in the present application is incorporated herein by reference, as if fully set forth.

What is claimed is:

1. A resist composition comprising:
a compound having a molecular weight of 1,000 or less and containing at least one sulfonamide group ($-SO_2NH-$);
wherein the compound containing at least one sulfonamide group contains the structure represented by the following formula (1)

$$R_1\text{-}L_1\text{-}SO_2NH\text{-}L_2\text{-}R_2 \quad (1)$$

wherein $L_1$ represents a single bond, a carbonyl group, a carbonyloxy group, a sulfonyl group or a sulfonyloxy group, $L_2$ represents a single bond, a carbonyl group, a carbonyloxy group, a sulfonyl group or a sulfonyloxy group, and each of $R_1$ and $R_2$ independently represents an organic group, provided that in the case where $L_2$ is a single bond, $R_2$ is an aryl group.

2. The resist composition as claimed in claim 1, wherein the compound contains a dissociative group with a pKa of 4 to 11 in addition to the N-sulfonamide group.

3. The resist composition as claimed in claim 1, wherein the compound contains an alkyl, aryl or aralkyl group substituted by at least one fluorine atom.

4. A positive resist composition comprising:
(S) a compound having a molecular weight of 1,000 or less and containing at least one sulfonamide group ($-SO_2NH-$);
(B) a compound capable of increasing the solubility in an alkali developer by the action of an acid; and
(A) a compound capable of generating an acid upon irradiation with an actinic ray or radiation;
wherein the compound containing at least one sulfonamide group contains the structure represented by the following formula (1)

$$R_1\text{-}L_1\text{-}SO_2NH\text{-}L_2\text{-}R_2 \quad (1)$$

wherein $L_1$ represents a single bond, a carbonyl group, a carbonyloxy group, a sulfonyl group or a sulfonyloxy group, $L_2$ represents a single bond, a carbonyl group, a carbonyloxy group, a sulfonyl group or a sulfonyloxy group, and each of $R_1$ and $R_2$ independently represents an organic group, provided that in the case where $L_2$ is a single bond, $R_2$ is an aryl group.

5. The positive resist composition as claimed in claim 4, wherein
the compound (S) contains a dissociative group with a pKa of 4 to 11 in addition to the N-sulfonamide group.

6. The positive resist composition as claimed in claim 4, wherein
the compound (S) contains an alkyl, aryl or aralkyl group substituted by at least one fluorine atom.

7. The positive resist composition as claimed in claim 4, wherein
the compound (B) is a resin having a repeating unit represented by the following formula (A1):

(A1)

$-(CH_2-CH)-$ $(S_1)_m$ $(OA_1)_n$ wherein $A_1$ represents a group capable of leaving by the action of an acid, represented by $-C(R^{01})(R^{02})(R^{03})$ or $-C(R^{04})(R^{05})-O-R^{06}$, wherein each of $R^{01}$ to $R^{03}$ independently represents an alkyl group, a cycloalkyl group or an aryl group and these groups may combine together to form a ring or a crosslinked ring, each of $R^{04}$ and $R^{05}$ independently represents a hydrogen atom, an alkyl group, a cycloalkyl group or an aryl group, and $R^{06}$ represents an alkyl group, a cycloalkyl group or an aryl group;

each of $S_1$('s) independently represents a substituent; and n represents an integer of 1 to 3 and m represents an integer of 0 to 3, provided that m+n≦5.

8. The positive resist composition as claimed in claim 4, wherein
the compound (B) is a resin having a repeating unit represented by the following formula (A2):

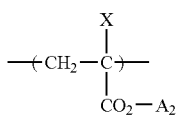 (A2)

wherein $A_2$ represents a group capable of leaving by the action of an acid, represented by —C($R^{01}$)($R^{02}$)($R^{03}$) or —CH(Rn)(AR), wherein each of $R^{01}$ to $R^{03}$ independently represents an alkyl group, a cycloalkyl group or an aryl group and these groups may combine together to form a ring or a crosslinked ring; Rn represents an alkyl group, a cycloalkyl group or an aryl group; AR represents an aryl group; and Rn and AR may combine together to form a ring; and X represents a hydrogen atom, an alkyl group, a halogen atom, a cyano group or an alkyloxycarbonyl group.

9. The positive resist composition as claimed in claim 4, wherein at least one compound selected from the group consisting of triarylsulfonium salts of organic sulfonic acids, diazodisulfone derivatives and oxime esters of organic sulfonic acids is contained as the compound (A).

10. The positive resist composition as claimed in claim 9, wherein
at least one compound selected from triarylsulfonium salts of organic sulfonic acids and at least one compound selected from the group consisting of diazodisulfone derivatives and oxime esters of organic sulfonic acids are contained as the compound (A).

11. A pattern forming method comprising:
forming a resist film from the resist composition claimed claim 1; and
exposing and developing the resist film.

12. A pattern forming method comprising:
forming a resist film from the positive resist composition claimed claim 4; and exposing and developing the resist film.

* * * * *